(12) United States Patent  (10) Patent No.: US 7,772,097 B2
Tomasini et al.  (45) Date of Patent: Aug. 10, 2010

(54) METHODS OF SELECTIVELY DEPOSITING SILICON-CONTAINING FILMS

(75) Inventors: Pierre Tomasini, Tempe, AZ (US); Nyles Cody, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 11/935,174

(22) Filed: Nov. 5, 2007

(65) Prior Publication Data

US 2009/0117717 A1 May 7, 2009

(51) Int. Cl.
*H01L 21/00* (2006.01)
(52) U.S. Cl. .............................. 438/505; 257/E21.586; 118/720
(58) Field of Classification Search ................. 438/478, 438/481, 565, 641; 118/715; 257/E21.586
See application file for complete search history.

(56) References Cited

U.S. PATENT DOCUMENTS

| | | | |
|---|---|---|---|
| 3,189,494 A | 6/1965 | Short | |
| 3,212,922 A | 10/1965 | Sirtl | |
| 3,217,378 A | 11/1965 | Reuschel et al. | |
| 3,271,208 A | 9/1966 | Allegretti | |
| 3,341,360 A | 9/1967 | Nickl | |
| 3,558,376 A | 1/1971 | Schmidt et al. | |
| 3,576,685 A | 4/1971 | Swann et al. | |
| 4,104,086 A | 8/1978 | Bondur et al. | |
| 4,410,622 A | 10/1983 | Dalal et al. | |
| 4,411,734 A | 10/1983 | Maa | |
| 4,585,515 A | 4/1986 | Maa | |
| 4,702,795 A | 10/1987 | Douglas | |
| 4,902,645 A | 2/1990 | Ohba | |
| 4,963,506 A | 10/1990 | Liaw et al. | |
| 5,061,646 A | 10/1991 | Sivan et al. | |
| 5,110,757 A | 5/1992 | Arst et al. | |
| 5,118,639 A | 6/1992 | Roth et al. | |
| 5,130,268 A | 7/1992 | Liou et al. | |
| 5,196,360 A | 3/1993 | Doan et al. | |
| 5,202,284 A | 4/1993 | Kamins et al. | |
| 5,212,110 A | 5/1993 | Pfiester et al. | |

(Continued)

FOREIGN PATENT DOCUMENTS

GB 975940 11/1964

(Continued)

OTHER PUBLICATIONS

Kunii, Y. et al., "In situ B doping of SiGe(C) using BCl₃ in ultraclean hot-wall LPCVD," Applied Surface Science, 2004, pp. 68-72, vol. 224.

(Continued)

*Primary Examiner*—W. David Coleman
(74) *Attorney, Agent, or Firm*—Knobbe Martens Olson & Bear LLP

(57) ABSTRACT

An embodiment provides a method for selectively depositing a single crystalline film. The method includes providing a substrate, which includes a first surface having a first surface morphology and a second surface having a second surface morphology different from the first surface morphology. A silicon precursor and $BCl_3$ are intermixed to thereby form a feed gas. The feed gas is introduced to the substrate under chemical vapor deposition conditions. A Si-containing layer is selectively deposited onto the first surface without depositing on the second surface by introducing the feed gas.

23 Claims, 55 Drawing Sheets

U.S. PATENT DOCUMENTS

| | | | |
|---|---|---|---|
| 5,227,317 A | 7/1993 | Owada et al. | |
| 5,242,530 A | 9/1993 | Batey et al. | |
| 5,242,847 A | 9/1993 | Ozturk et al. | |
| 5,279,978 A | 1/1994 | See et al. | |
| 5,286,661 A | 2/1994 | De Fresart et al. | |
| 5,470,768 A | 11/1995 | Yanai et al. | |
| 5,518,959 A | 5/1996 | Jang et al. | |
| 5,599,740 A | 2/1997 | Jang et al. | |
| 6,013,575 A | 1/2000 | Itoh | |
| 6,235,568 B1 | 5/2001 | Murthy et al. | |
| 6,235,605 B1 | 5/2001 | Ping | |
| 6,338,990 B1 | 1/2002 | Yanai et al. | |
| 6,395,615 B2 | 5/2002 | Ping | |
| 6,797,341 B2 | 9/2004 | Zeng et al. | |
| 7,132,338 B2 * | 11/2006 | Samoilov et al. | 438/300 |
| 7,435,665 B2 * | 10/2008 | Airaksinen et al. | 438/478 |
| 2001/0024869 A1 | 9/2001 | Ping | |
| 2002/0168868 A1 | 11/2002 | Todd | |
| 2003/0087110 A1 | 5/2003 | Fursawa et al. | |
| 2005/0287752 A1 * | 12/2005 | Nouri et al. | 438/303 |
| 2007/0006800 A1 | 1/2007 | Lee et al. | |
| 2008/0245767 A1 * | 10/2008 | Kim et al. | 216/37 |

FOREIGN PATENT DOCUMENTS

| | | |
|---|---|---|
| GB | 990119 | 4/1965 |
| GB | 1002899 | 9/1965 |
| GB | 1041836 | 9/1966 |
| GB | 1072703 | 6/1967 |
| GB | 1117359 | 6/1968 |
| GB | 2286721 | 8/1995 |
| JP | 1981-112722 | 9/1981 |
| JP | 1986-046044 | 3/1986 |
| JP | 1995-335634 | 12/1995 |
| JP | 2003-178992 | 6/2003 |
| JP | 2003-224075 | 8/2003 |
| JP | 2003-264150 | 9/2003 |
| WO | WO 2006/060543 A3 | 6/2006 |
| WO | WO 2006/083821 A1 | 8/2006 |

OTHER PUBLICATIONS

Shimamune, Y. et al., "Technology breakthrough of low temperature, low defect, and low cost SiGe selective epitaxial growth ($L^3$ SiGe SEG) process for 45nm node and beyond," 2007 Symposium on VLSI Technology Digest of Technical Papers, Jun. 1, 2007, pp. 116-117.

International Search Report and Written Opinion, dated Mar. 10, 2009, PCT Appl. No. PCT/US2008/080198, filed Oct. 16, 2008.

* cited by examiner

Center (Die 54)

(Die 55)

(Die 56)

(Die 57)

Center (Die 54)

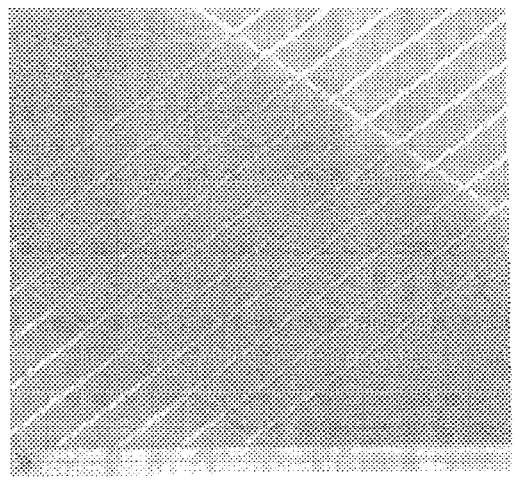
FIG. 23B (Die 55)
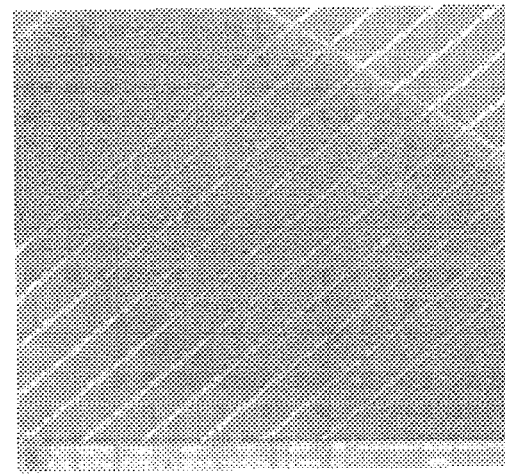
FIG. 23C (Die 56)
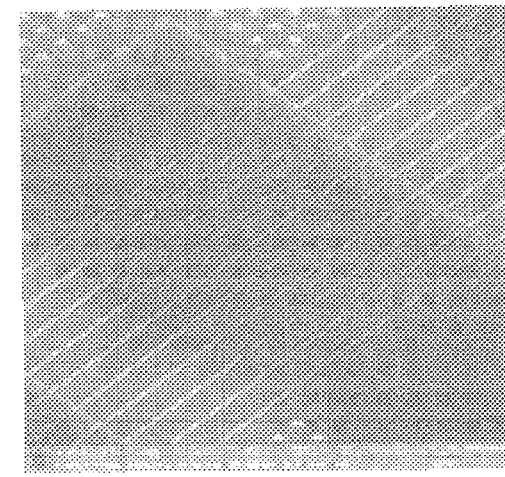
FIG. 23D (Die 57)

180
METHODS OF SELECTIVELY DEPOSITING SILICON-CONTAINING FILMS

BACKGROUND OF THE INVENTION

1. Field of the Invention

This application relates generally to the deposition of silicon-containing materials in semiconductor processing. More particularly, this application relates to the selective deposition of epitaxial, silicon-containing films using $BCl_3$ and a silicon source.

2. Description of the Related Art

It is often desirable to selectively deposit silicon or silicon germanium on semiconductor surfaces without depositing on insulating surfaces. For example, heterojunction bipolar transistors are often fabricated using selective deposition techniques that deposit epitaxially, e.g., single-crystal, semiconductor films only on active areas. Other transistor designs benefit from elevated source/drain structures, which provide additional silicon that can be consumed by the source/drain contact process without altering shallow junction device performance. Selective epitaxy advantageously reduces the need for subsequent patterning and etch steps.

While selective deposition processes are known in the art, continued scaling in pursuit of faster, less power-hungry circuitry has increased the demands on integrated circuit fabrication. Generally speaking, selectivity takes advantage of differential nucleation during deposition on disparate materials. Selective deposition can generally be explained by simultaneous etching and deposition of the material being deposited. The precursor of choice will generally have a tendency to nucleate and grow more rapidly on one surface and less rapidly on another surface. For example, silane will generally nucleate on both silicon oxide and silicon, but there is a longer nucleation phase on silicon oxide. At the beginning of a nucleation stage, discontinuous films on oxide have a high exposed surface area relative to merged, continuous films on silicon. Accordingly, an etchant, such as HCl, added to the process will have a greater effect upon the poorly nucleating film on the oxide as compared to the rapidly nucleating film on the silicon. The relative selectivity of a process can thus be tuned by adjusting factors that affect the deposition rate, such as precursor flow rates, temperature, pressure, and the rate of etching, such as etchant flow rate, temperature, and/or pressure. Changes in each variable will generally have different effects upon etch rate and deposition rate. Typically, a selective deposition process is tuned to produce the highest deposition rate feasible on the window of interest while accomplishing no deposition in the field regions. Known selective silicon deposition processes include reactants silane and hydrochloric acid with a hydrogen carrier gas.

While many selective deposition techniques are known, there is a need for deposition processes with improved methods of selective semiconductor deposition, along with improved uniformity, purity, deposition speed and repeatability.

SUMMARY OF THE INVENTION

An embodiment provides a method for selectively depositing a single crystalline film by chemical vapor deposition. The method includes providing a substrate in a reaction chamber. The substrate includes a first surface having a first surface morphology and a second surface having a second surface morphology different from the first surface morphology. A silicon precursor and $BCl_3$ are intermixed to thereby form a feed gas. The substrate is exposed to the feed gas in the reaction chamber. A Si-containing layer is selectively deposited onto the first surface without depositing on the second surface by the exposure.

Another embodiment provides a method for forming an integrated circuit. The method includes providing a substrate with exposed semiconductor surfaces and insulating regions. The substrate is exposed to a silicon precursor, $BCl_3$ and an etchant vapor, thereby selectively depositing a Si-containing epitaxial film on the exposed semiconductor surfaces.

In accordance with another embodiment, an apparatus is configured for selective epitaxial deposition. The apparatus includes a reaction chamber configured to support a wafer. A source of semiconductor precursor, a source of etchant vapor and a source of $BCl_3$ are each in communication with the reaction, chamber. A controller is configured to simultaneously delivery semiconductor precursor, etchant vapor and $BCl_3$ from the sources to the reaction chamber to selectively deposit an epitaxial semiconductor film on single-crystal areas of a patterned wafer in the reaction chamber.

These and other embodiments are described in greater detail below.

BRIEF DESCRIPTION OF THE DRAWINGS

FIGS. 23A-23D are SEM results of the surface of the films on the patterned wafers formed by the $BCl_3$ process with a boron concentration of about $10^{21}$ at/cm$^3$ and HCl flow of 75 sccm.

DETAILED DESCRIPTION OF THE PREFERRED EMBODIMENT

Figure 1:
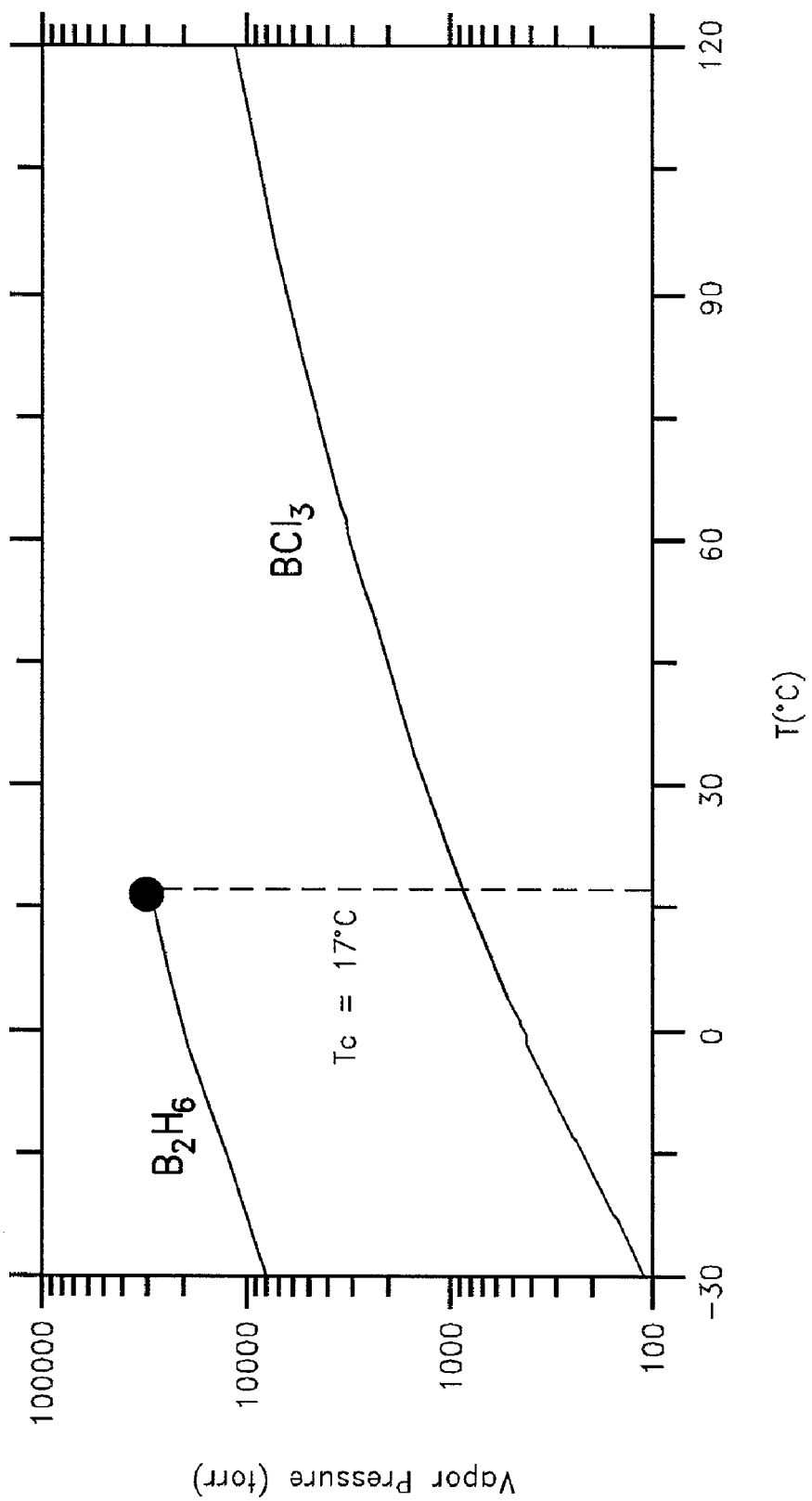
FIG. 1 is a plot of the vapor pressure of $B_2H_6$ and $BCl_3$ as a function of temperature.

Selectively deposited crystalline silicon may be doped in situ by carrying out the deposition of the crystalline silicon using a silicon source, an etchant, and an additive process gas, such as a carbon source, germanium source and/or electrical dopant precursor. In addition to the commercial value in selectively deposited silicon-containing films, semiconductors in situ deposited with electrical dopants such as p-type dopants is also of considerable commercial importance in a variety of industrial applications, such as in semiconductor manufacturing, microelectromechanical systems "MEMS" device fabrication, and in flat panel displays. Conventionally preferred precursors for p-type dopants are dopant hydrides, such as diborane. Diborane ("$B_2H_6$") is typically commercially available diluted in $H_2$, e.g., 1% diborane or 100 ppm in $H_2$. Unfortunately, $B_2H_6$ inhibits selectivity by encouraging polysilicon nucleation on dielectrics, thus requiring more etchant in order to maintain selectivity. Increasing the etchant flow to enhance selectivity further suppresses silicon or SiGe nucleation on the single-crystal silicon surface, and very low growth rates consequently occur.

Deposition methods have now been developed that are useful for selectively depositing a variety of single crystalline Si-containing materials. For example, crystalline Si and SiGe may be selectively grown by carrying out the deposition using a silicon source, an optional germanium source and boron trichloride ("$BCl_3$"). In preferred embodiments, the dopants in the resulting doped Si-containing material are also electrically active as-deposited. The deposition of doped layers in accordance with this aspect can be conducted with or without a germanium source, with or without HCl or chlorine gas, and with or without a $H_2$ carrier gas, as described in greater detail below.

The term "Si-containing material" and similar terms are used herein to refer to a broad variety of silicon-containing materials including without limitation Si, SiGe and SiGe:C. As used herein, "SiGe," "carbon-doped SiGe," "SiGe:C" and similar terms refer to materials that contain the indicated chemical elements in various proportions and, optionally, minor amounts of other elements. For example, "SiGe" is a material that comprises silicon, germanium and, optionally, other elements, e.g., dopants such as carbon and electrically active dopants. Terms such as "SiGe", and "SiGe:C" are not stoichiometric chemical formulas per se and thus are not limited to materials that contain particular ratios of the indicated elements. The percentage of a dopant, such as germanium, boron, or other electrically active dopant, in a Si-containing film is expressed herein in atomic percent on a whole film basis, unless otherwise stated.

Group III dopants are elements in Group III of the periodic table and include B and In. Group III dopants may be referred to herein as electrical dopants because of their recognized use as semiconductor dopants. While this invention is not limited by theory of operation, it is believed that Group III dopants are electrically active when incorporated substitutionally into semiconductors, but electrically inactive when incorporated non-substitutionally. The term "p-doped" Si-containing material indicates that the Si-containing material contains a Group III dopant.

Various elements, such as germanium, carbon and electrical dopants, may be alloyed with or doped into Si-containing materials. Germanium and carbon are alloyed with silicon, whereas electrical dopants like boron dope the silicon or silicon alloy. Such Si-containing materials may be referred to herein as being substitutionally doped or alloyed. The process of incorporating such elements into Si-containing materials may be referred to herein as substitutional incorporation or doping. Moreover, Group III dopants that are substitutionally incorporated into Si-containing materials may be referred to as having electrically active dopants, and such Si-containing materials may be referred to as being electrically actively doped.

Unless otherwise stated, the total amount, whether substitutional or interstitial, of a Group III dopant incorporated into a Si-containing material is determined by secondary ion mass spectrometry (SIMS), and may be expressed herein in units of atoms per cubic centimeter. For example, a Group III dopant concentration of $6.3 \times 10^{20}$ atoms per cubic centimeter may be expressed as "$6.3 \, E^{20} \, cm^{-3}$." The amount of the incorporated Group III dopant that is electrically active or substitutional may be determined by electrical resistivity measurements, e.g., four point probe measurements known to those skilled in the art. The amount of other elements, such as germanium, substitutionally incorporated into other Si-containing materials may be determined in a similar manner, e.g., by SIMS or XRD.

Various embodiments provide methods for selectively depositing Si-containing materials using $BCl_3$, a silicon source and, optionally, source(s) of other elements such as germanium. The delivery of $BCl_3$ and a silicon source to the surface of a substrate preferably results in the formation of an epitaxial Si-containing film on the surface of the substrate. In certain embodiments, a separate etchant source gas, e.g., a halogen-containing gas such as chlorine, is additionally delivered to the substrate in conjunction with $BCl_3$ and the silicon source, and the Si-containing film is deposited selectively over single crystal substrates or single crystal regions of mixed substrates.

Substrate refers either to the workpiece upon which deposition is desired or the surface exposed to the deposition gas(es). For example, the substrate may be a single crystal silicon wafer, or may be a semiconductor-on-insulator (SOI) substrate, or may be an epitaxial Si, SiGe or III-V material deposited upon such wafers. Workpieces are not limited to wafers, but also include glass, plastic, or any other substrate employed in semiconductor processing.

A mixed or patterned substrate is a substrate that has two or more different types of surfaces, such as different materials and/or different surface morphologies. For example, a patterned or mixed substrate may comprise a first surface having a first surface morphology and a second surface having a second surface morphology. In certain embodiments, Si-containing layers are selectively formed over single crystal semiconductor materials while minimizing and more preferably avoiding deposition over adjacent dielectrics or insulating materials. Examples of dielectric materials include silicon dioxide (including low dielectric constant forms such as carbon- and fluorine-doped), silicon nitride, metal oxide and metal silicate. The terms "epitaxial," "epitaxially," "heteroepitaxial," "heteroepitaxially" and similar terms are used herein to refer to the deposition of a crystalline Si-containing material onto a crystalline substrate in such a way that the deposited layer adopts or follows the lattice constant of the substrate. Epitaxial deposition is heteroepitaxial when the composition of the deposited layer is different from that of the substrate; it is homoepitaxial when the deposited layer has the same composition and natural lattice constant as that of the substrate.

Even if the surfaces are defined by the same material, the surfaces of a mixed substrate can be different if the morphologies or crystallinity of the surfaces are different. The processes described herein are useful for depositing Si-containing films on a variety of substrates, but are particularly useful for mixed substrates having mixed surface morphologies. Such a mixed substrate comprises a first surface having a first surface morphology and a second surface having a second surface morphology. Surface morphology refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by a crystal structure and orientation that is identical to the substrate upon which they are grown, typically single crystal. The atoms in these materials are arranged in a lattice-like structure that persists over relatively long distances on an atomic scale. Amorphous morphology is a non-crystalline structure having a low degree of order because the atoms lack a definite periodic arrangement. Other morphologies include microcrystalline and mixtures of amorphous and crystalline material. "Single-crystal," including both single-crystal wafers and epitaxial layers thereupon, is used to describe a predominantly large crystal structure that may have a tolerable number of faults therein, as is commonly employed for transistor fabrication. The skilled artisan will appreciate that crystallinity of a layer generally falls along a continuum from amorphous to polycrystalline to single-crystal; the skilled artisan can readily determine when a crystal structure can be considered single-crystal or epitaxial, despite low density faults. Specific examples of mixed substrates include without limitation single crystal/polycrystalline, single crystal/amorphous, single crystal/dielectric, conductor/dielectric, and semiconductor/dielectric. Of course, mixed substrates can include more than two different types of surfaces.

Selective Si-containing Films and Methods

An embodiment provides a method of depositing a crystalline Si-containing film by chemical vapor deposition (CVD), comprising: providing a substrate, the substrate comprising a first surface having a first surface morphology and a second surface having a second surface morphology different from the first surface morphology; intermixing a silicon precursor and $BCl_3$ to thereby form a feed gas; introducing the feed gas to the substrate; and depositing a Si-containing layer selectively onto the first surface relative to the second surface. According to an embodiment, the Si-containing film is considered selectively deposited if it is selectively formed over a single crystal semiconductor surface while minimizing or avoiding deposition over a dielectric surface in a ratio greater than about 10:1. According to another embodiment, deposition favors the first surface over the second surface by a ratio greater than about 50:1. Preferably, deposition is tuned to be 100% selective, leaving no deposition on the second surface while depositing on the first surface. However, even imperfect selectivity can avoid masking steps for avoiding unwanted deposition from the second surface, because a short dry or wet etch step can clear unwanted sparse deposition from over the second surface. In an embodiment, the crystalline Si-containing film is also in situ doped and has an as-deposited resistivity of about 1.6 mΩ·cm or less. In another embodiment, the film has an as-deposited resistivity of about 1.3 mΩ·cm or less. In another embodiment, the film has an as-deposited resistivity of about 1.1 mΩ·cm or less. The doped crystalline Si-containing film preferably comprises at least about $7 \times 10^{19}$ atoms $cm^3$ of boron as deposited. In one embodiment the film comprises at least about $1 \times 10^{20}$ atoms $cm^3$ of boron as deposited. Furthermore, the boron in the film derives entirely from the $BCl_3$.

The disclosed methods employ vapor deposition and particularly CVD, including plasma-enhanced chemical vapor deposition "PECVD" or thermal CVD, utilizing $BCl_3$ and a silicon source vapor to form a feed gas that contacts a substrate to deposit a doped crystalline Si-containing film onto the substrate within a CVD chamber. The Si-containing film is a single crystalline or epitaxial Si film, preferably including electrically active dopants as deposited. In some embodiments, a germanium source such as germane is added to the feed gas to thereby deposit a crystalline electrically doped SiGe or SiGe:C film as the Si-containing film. In some embodiments, an additional or supplemental etchant source gas is added to the feed gas to enhance selectivity of the deposited Si-containing film. In the following description, reference may be made to the use of $BCl_3$ and a silicon source to selectively deposit a doped Si or Si-containing film. It will be recognized that those descriptions are also generally applicable to other Si-containing films, e.g., to the deposition of electrically doped SiGe and SiGe:C films involving the use of a germanium source, unless otherwise stated. Thermal CVD is preferred, as deposition can be achieved effectively without the risk of damage to substrates and equipment that attends plasma processing.

$BCl_3$ and a silicon source and, optionally, a germanium and/or a supplemental etchant gas, are introduced to the chamber in the form of separate gases or by intermixing to form a feed gas. The intermixing to form the feed gas may take place within the chamber or prior to introduction of the feed gas to the chamber. The total pressure in the CVD chamber can be in the range of about 0.001 Torr to about 1000 Torr, but preferably in the range of about 0.25 Torr to about 100 Torr. In some embodiments, the deposition conditions comprise a chamber pressure of at least about 10 Torr. Chamber pressures of at least about 500 mTorr are suitable for the single wafer, single pass, laminar horizontal flow reactor in which the experiments were conducted, as described below. The chamber pressure may be referred to herein as a "deposition pressure." The feed gas can include a gas or gases other than $BCl_3$, such as other silicon sources, other dopant precursor(s) and/or inert carrier gases, but preferably $BCl_3$ is the sole source of boron dopant. Silicon precursor and supplemental silicon sources can include one or more of silane, disilane, trisilane, tetrasilane, monochlorosilane, dichlorosilane, trichlorosilane, trichlorodisilane, neopentasilane. Dichlorosilane is the preferred silicon source. Supplemental etchant sources include but are not limited to chlorine gas and HCl, with HCl being preferred.

Examples of suitable carrier gases for the methods described herein include He, Ar, $H_2$, and $N_2$. In certain embodiments, the carrier gas is a non-hydrogen carrier such as He, Ar and/or $N_2$. As will be appreciated from the description below, some preferred silicon sources, such as dichlorosilane, are introduced to the chamber by way of a vaporizer such as a bubbler used with a carrier gas to entrain the silicon vapor, more preferably by way of a delivery system comprising a bubbler and a gas concentration sensor that measures the amount of silicon precursor in the carrier gas flowing from the bubbler. Such sensors are commercially available, e.g., PIEZOCON® gas concentration sensors commercially available from Lorex Industries, Poughkeepsie, N.Y., U.S.A.

The amount of $BCl_3$ in the feed gas may be adjusted to provide the desired level of boron molecules in the Si-containing film. Preferred concentrations of "pure" (undiluted) $BCl_3$ vapor in the feed gas can be between about 0.1 sccm to about 10 sccm, or equivalent amounts of diluted $BCl_3$, although higher or lower amounts are sometimes preferred in order to achieve the desired properties in the resulting film. According to embodiments, the concentration of pure $BCl_3$ in the feed gas is between about 1 sccm to about 5 sccm, or equivalent amounts of diluted $BCl_3$. Dilute mixtures of the dopant precursor in a carrier gas can be delivered to the reactor via a mass flow controller with set points ranging from about 0.1 sccm to about 1000 sccm, depending on desired dopant concentration and dopant gas concentration. Dilution of dopant gases can lead to factors of 10 to 10 to arrive at equivalent pure dopant flow rates. The dilute mixture is preferably further diluted by mixing with a silicon source, a supplemental etchant source such as $Cl_2$ or HCl as described below, any suitable carrier gas, and any other desired alloying precursor for substitutional incorporation, such as a strain-influencing precursor. Strain-influencing precursors can include a germanium source, such as germane, to form a silicon-containing film comprising $Si_{1-x}Ge_x$, wherein $0 < x \leq 1$. Preferred atomic % Ge in SiGe films can be between about 15% to about 25%. According to embodiments, diluted $GeH_4$ (10% in $H_2$) from about 26 to about 66 sccm (or about 2.6 to about 6.6 sccm pure $GeH_4$) can be intermixed with the feed gas for a reactor operating pressure of about 10 Torr and a temperature of about 760° C. According to embodiments, a supplemental etchant such as HCl can be added in amounts from about 75 to about 115 sccm. The values for flow rates are derived from experiments conducted on 200 mm wafers, but can be readily scaled for substrates of different surface areas (e.g., 300 mm wafers). Supplemental etchant sources besides $Cl_2$ and HCl can include other halogen-containing or Cl-containing etchants. Since typical total flow rates of the gases used for deposition in the preferred EPSILON® series reactors often range from about 20 standard liters per minute "slm" to about 180 slm, the concentration of the dopant precursor is generally small relative to total flow.

The relative amounts of the various feed gas components may be varied over a broad range depending on the composition desired for the resulting Si-containing film and the deposition conditions employed, including temperature, pressure, deposition rate, etc., and may be determined by routine experimentation in view of the guidance provided herein. The feed gas components may be intermixed and then delivered to the chamber or substrate, or the feed gas may be formed by mixing the components at or near the substrate, e.g., by supplying the feed gas components to the CVD chamber separately.

A suitable manifold may be used to supply feed gas(es) to the CVD chamber. Preferably, the CVD chamber is a single-wafer, single pass, laminar horizontal gas flow reactor, preferably radiantly heated. Suitable reactors of this type that are commercially available include the EPSILON® series of single wafer reactors from ASM America, Inc. of Phoenix, Ariz. The methods described herein can also be employed in alternative reactors, such as a showerhead arrangement. However, the methods described herein have been found particularly effective in the horizontal, single-pass laminar gas flow arrangement of the EPSILON® chambers, employing a rotating substrate, particularly with low process gas residence times. CVD may be conducted by introducing plasma products in situ or downstream of a remote plasma generator, but as noted above, thermal CVD is preferred.

Thermal CVD is preferably conducted at a substrate temperature that is effective to deposit a crystalline Si-containing film over the substrate. In an embodiment, the substrate is at a temperature that is at about a transition temperature between substantially mass-transport controlled deposition conditions and substantially kinetically controlled deposition conditions for the silicon source. Those skilled in the art can adjust temperatures to take into account the realities of actual manufacturing, e.g., preservation of thermal budget, deposition rate, different sizes of chambers, including single wafer and batch reactors, preferred total pressures and partial pressures etc. In general, higher partial pressures call for lower temperatures for a given desired result, whether it be deposition rate, layer quality or a combination of the two. The substrate can be heated by a variety of methods known in the art, e.g., resistive heating and lamp heating.

Exemplary embodiments described below use $BCl_3$ as an alternative to $B_2H_6$ for selective epitaxial deposition. $BCl_3$ as a precursor is useful for the preparation of preferred films as described below, preferably boron-doped silicon, SiGe and SiGeC films and alloys. $BCl_3$ is a liquid at room temperature, with a vapor pressure of 1500 torr, and a critical temperature at 179° C. FIG. 1 shows a plot of the vapor pressure of $B_2H_6$ and $BCl_3$. $B_2H_6$ has a critical temperature at 17° C. and has a vapor pressure of about two orders of magnitude higher that that of $BCl_3$, as shown. Since $BCl_3$ is a liquid at room temperature, additional steps such as heating to convert the liquid into a gas and regulating the pressure to conform with process requirements are performed to form a continuous, single-phase stable flow of the low vapor pressure gas. In addition, $BCl_3$ can be reduced by hydrogen to form HCl in the following reaction: $BCl_3 + 3/2H_2 \rightarrow B° + 3HCl$. This reaction may decrease the amount of gas precursor available for reaction and consequently decrease deposition rates, such that $BCl_3$ has rarely been commercially employed. However, while not limited by theory, the use of $BCl_3$ for selective deposition may supply a pure form of HCl that can contribute to the selectivity without the impurities that typically accompany commercially supplied HCl.

FIGS. 2-6 illustrate the effects of various combinations of deposition parameters. The data shown in FIGS. 2-6 was obtained for thermal chemical vapor depositions conducted in an EPSILON® single wafer reactor using dichlorosilane as a silicon precursor and $BCl_3$ for a boron source to deposit a series of boron-doped silicon-containing films onto a single crystal silicon substrate.

Figure 2:
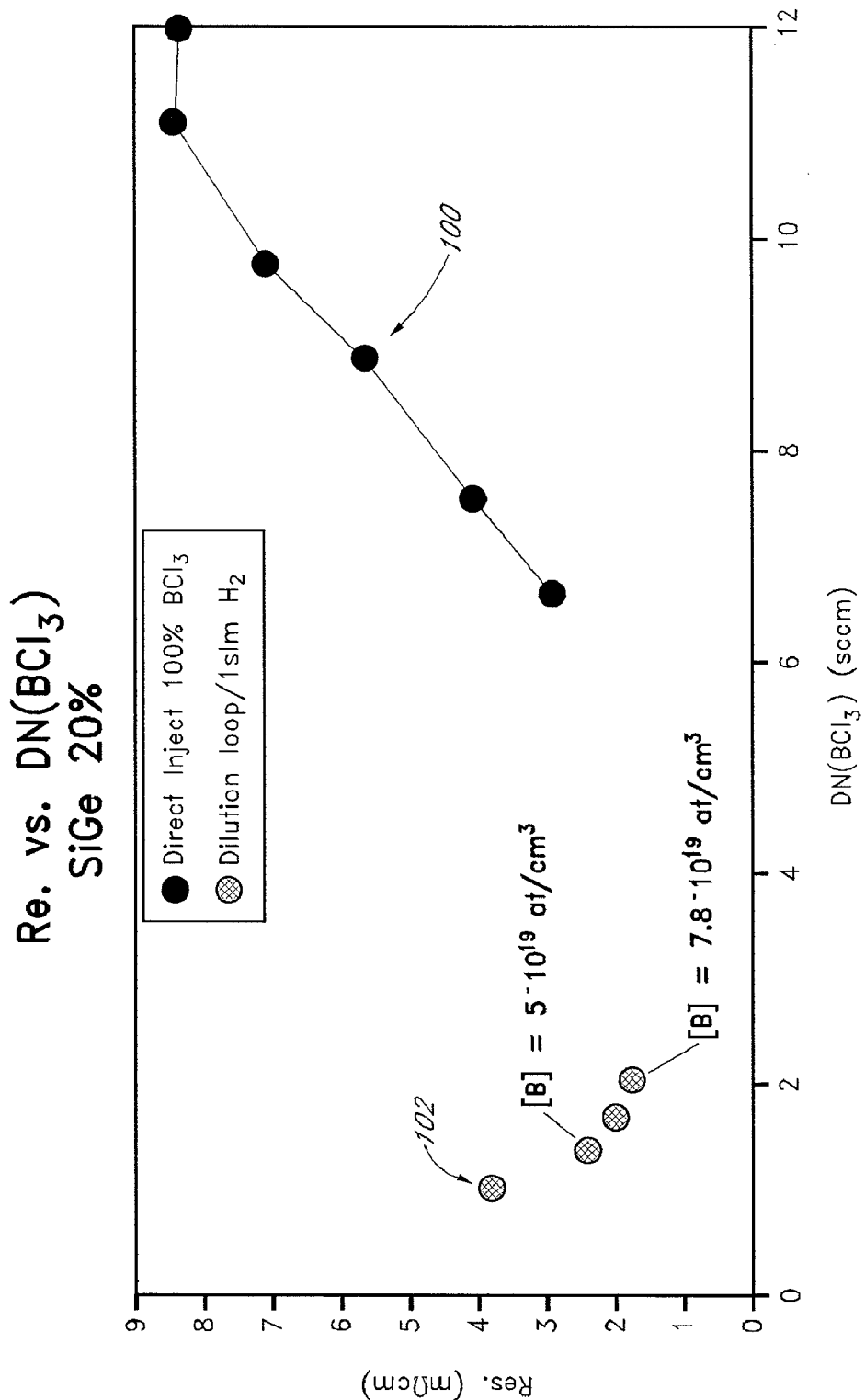
FIG. 2 is a plot of the resistivity of a SiGe:B film deposited with a direct injection of $BCl_3$ as a function of $BCl_3$ flow rate, and a SiGe:B film deposited with a dilution loop of 1 slm $H_2$.

FIG. 2 is a graph of the film resistivity of doped silicon with 20% Ge as a function of $BCl_3$ flow rate for two films deposited using $BCl_3$, dichlorosilane, and germane. "Dopant number" or "DN" as employed in the some of the figures represents 1 sccm of pure dopant flow or equivalent diluted flow.

Figure 23A:
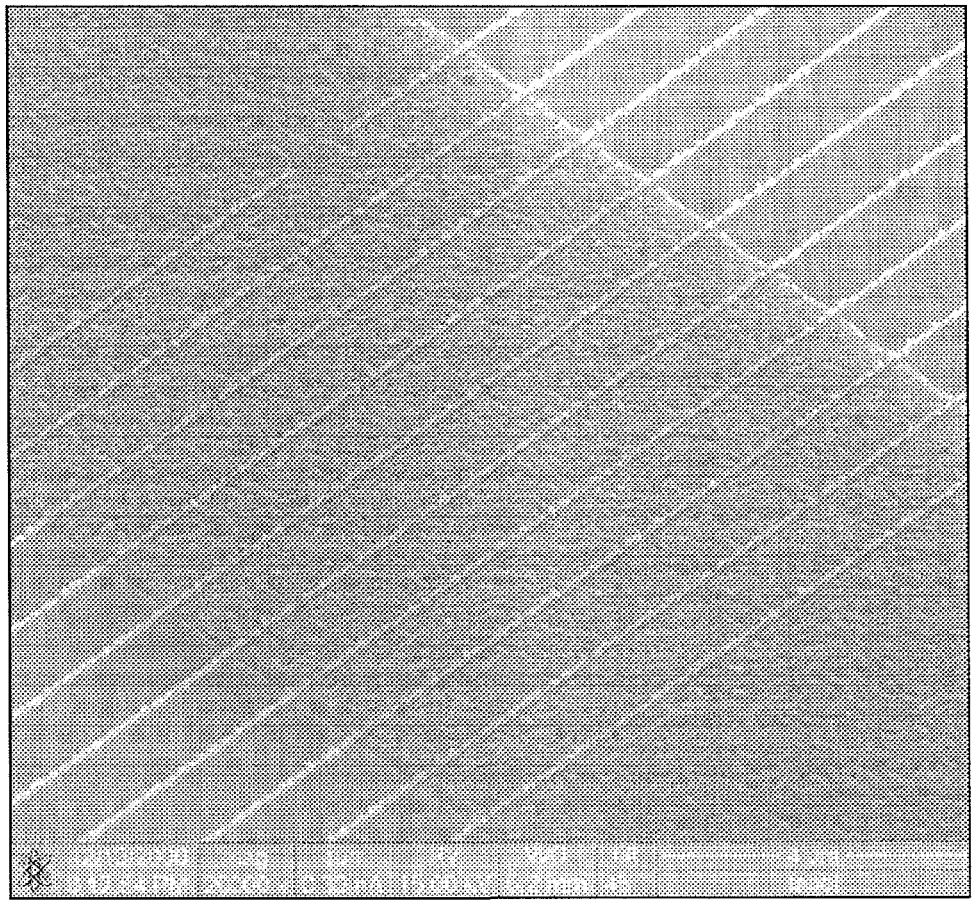

The resistivity values on the y-axis were obtained from four-point probe measurements on the deposited films. The data points 100 on the right side of the graph shows the resistivity of SiGe deposited with a direct injection of 100% $BCl_3$ vapor from a bottle under a vapor pressure of 4 psi at room temperature. The data points 102 on the left shows the resistivity of SiGe doped with $BCl_3$ passed through a dilution loop of 1 standard liters per minute (slm) of $H_2$. As noted, the electrical resistivity generally indicates the amount of incorporated dopant that is electrically active, and in particular, a high resistivity indicates low boron incorporation. Accordingly, the graph shows that the electrical resistivity decreases, and the boron incorporation thus increases with increasing $BCl_3$ flow with a dilution loop from about $5 \times 10^{19}$ at/cm$^3$ at 1 DN of $BCl_3$ to about $7.8 \times 10^{19}$ at/cm$^3$ at about 2 DN of $BCl_3$. On the other hand, the electrical resistivity increases and the amount of boron incorporation steadily decreases for a direct injection of 100% of $BCl_3$. This invention is not bound by theory, but it is believed that the increasing resistivity at higher flow rates of direct $BCl_3$ injection may be due to an increasing fraction of electrically inactive dopant in the film. For example, at higher levels of boron, excess boron may not be substitutionally incorporated but rather may migrate to grain boundaries and cause dislocations to occur or grow. FIG. 23A illustrates a surface morphology consistent with this explanation, showing surface roughness that might be caused by boron precipitation at high dopant flow rates without dilution. FIG. 2 nevertheless shows that the amount of substitutional boron incorporation can be tuned with a dilution of 1 slm of $H_2$ to obtain silicon film resistivity values of about 3.8 mΩ·cm or less, about 2.4 mΩ·cm or less, about 2 mΩ·cm or less, or about 1.8 mΩ·cm or less, as illustrated by data points 102.

The aforementioned electrically-doped single crystalline Si-containing films may further comprise another substitutionally incorporated element, e.g., a strain-modifying substitutional alloying agent such as germanium. The methods described herein for the incorporation of substitutional electrical dopants into silicon may also be used to incorporate substitutional Ge into silicon or SiGe. For example, in an embodiment, a deposition using a silicon precursor, $BCl_3$, a germanium source and HCl is effective for incorporating germanium substitutionally into selectively deposited, electrically doped epitaxial films, e.g., for creating strain within SiGe layers. Under preferred deposition conditions, germanium incorporation levels can be between about 1% and 99%, typically between 17% and 50%, often between about 20% and about 50%, and more particularly between about 20% and 40%. The resulting SiGe films may be used in various applications, such as remaining strained themselves, to relax and be used to induce a tensile strain on an overlying heteroepitaxial silicon layer, or to exert a compressive stress on a channel.

As is known in the art, the lattice constant for single crystal silicon is about 5.431 Å, whereas single crystal germanium has a lattice constant of 5.657 Å due to the larger size of the germanium atoms. The deviation from silicon's natural lattice constant resulting from substitutional germanium incorporation introduces strain that advantageously improves electrical carrier mobility in semiconductors, improving device efficiency. When the SiGe is deposited to less than the critical thickness of the material, the deposited layer remains compressively strained and hole mobility is improved for PMOS devices. For example, the deposited SiGe layer can be selectively formed over an entire active area, and can define the channel, or it can act as a relaxed template for forming a compressively strained layer thereover, which can then itself serve as a channel region.

Figure 3:
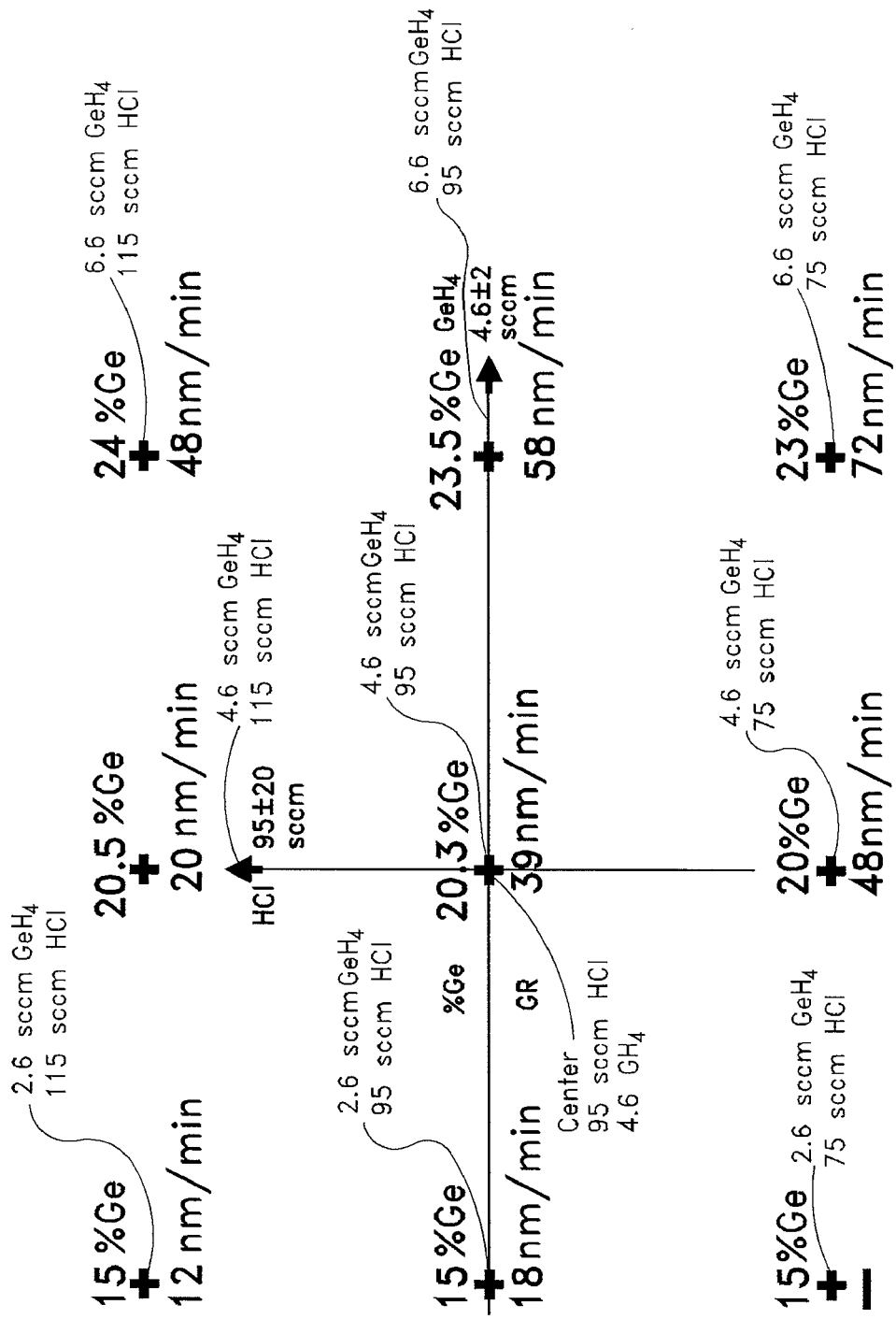
FIG. 3 is a plot of atomic % Ge in SiGe as a function of $GeH_4$, and the growth rate of SiGe as a function of $GeH_4$ and HCl.

FIG. 3 is a plot of the percentage of Ge in SiGe as a function of $GeH_4$ flow rate, and the growth rate of SiGe as a function of $GeH_4$ and HCl flow rates for nine different deposition conditions. Blanket SiGe films were deposited on bare 8-inch (200 mm) diameter silicon wafers using dichlorosilane and $GeH_4$ precursors and HCl as an etchant. The x-axis plots the $GeH_4$ flow rate in intervals of 2 sccm, with 4.6 sccm at the center, and the y-axis plots the HCl flow rate in intervals of 20 sccm, with 95 sccm at the center. For example, the data point at the center of the plot shows the atomic % Ge and growth rate results for an SiGe film formed with flow rates of 95 sccm of HCl and 4.6 sccm of diluted $GeH_4$ (10% in $H_2$). As shown at the center point, the atomic % Ge with these deposition conditions was 20.3%, and the growth or deposition rate of the SiGe film was 39 nm/min. The amount of $GeH_4$ was increased in increments of 2 sccm along the $GeH_4$ (horizontal) axis. For instance, the point directly to the right of the center on the $GeH_4$ axis shows that the atomic % Ge was 23.5% and the growth or deposition rate of the SiGe film was 58 nm/min, for deposition conditions of 6.6 sccm of diluted $GeH_4$ and 95 sccm of HCl. FIG. 3 thus shows that increasing the $GeH_4$ flow rate increased the incorporation of Ge in the SiGe film, thereby increasing the deposition rate of the SiGe almost linearly. In the experiments, the amount of HCl was also changed in increments of 20 sccm along the HCl (vertical) axis. For instance, the point directly above the center on the HCl axis shows that the atomic % Ge was 20.5% and the growth or deposition rate of the SiGe film was 20 nm/min, for deposition conditions of 115 sccm of HCl and 4.6 sccm of diluted $GeH_4$. FIG. 3 thus shows that increasing the amount of HCl decreased the deposition rate of the SiGe film, but did not alter the atomic % Ge.

Figure 4A:
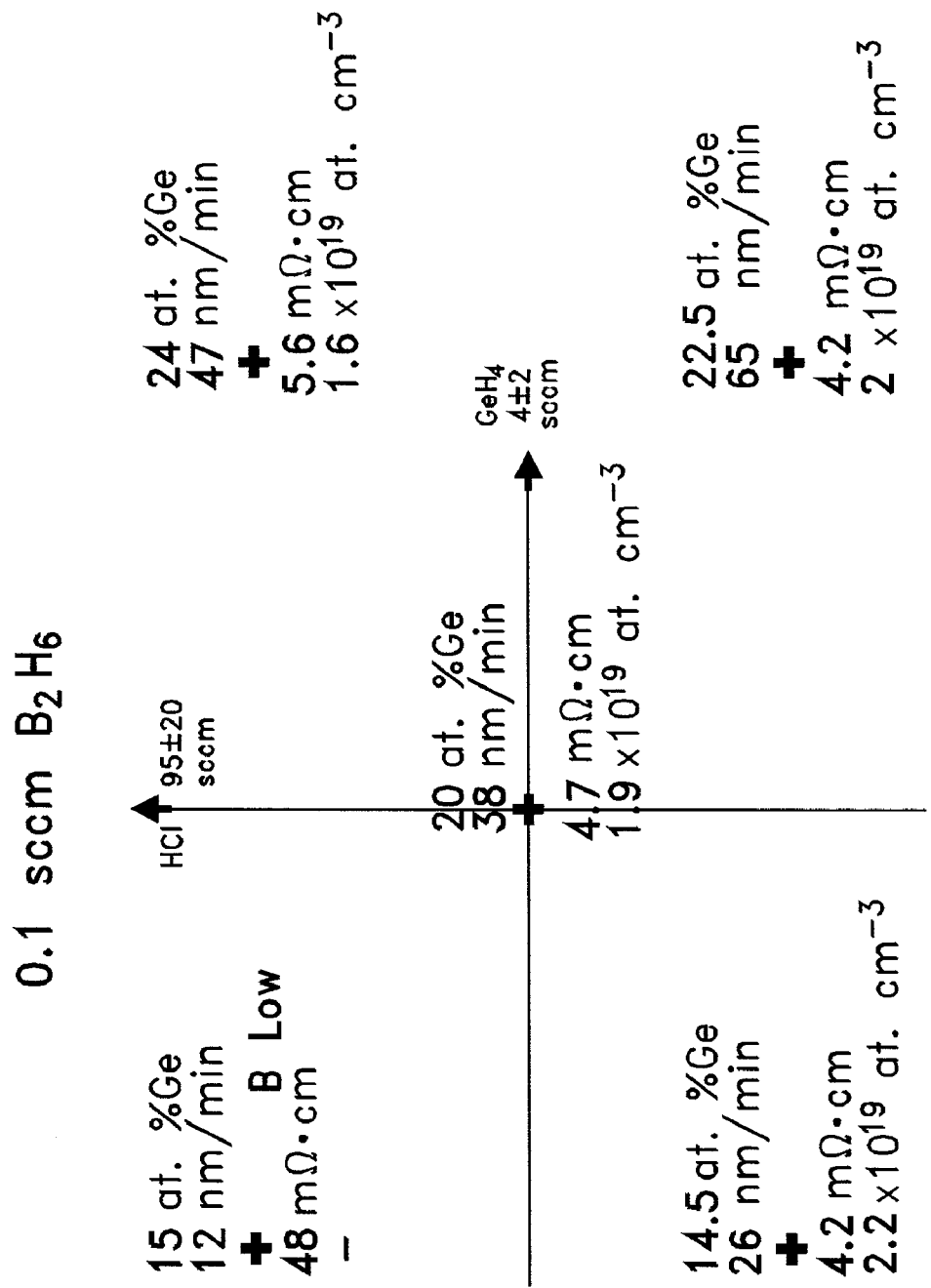
FIG. 4A is a plot of atomic % Ge in SiGe:B as a function of $GeH_4$, and the growth rate of SiGe as a function of $GeH_4$ and HCl, for one dopant concentration of $B_2H_6$.
Figure 4B:
FIG. 4B is a plot of atomic % Ge in SiGe:B as a function of $GeH_4$, and the growth rate of SiGe:B as a function of $GeH_4$ and HCl, for another dopant concentration of $B_2H_6$.
Figure 4C:
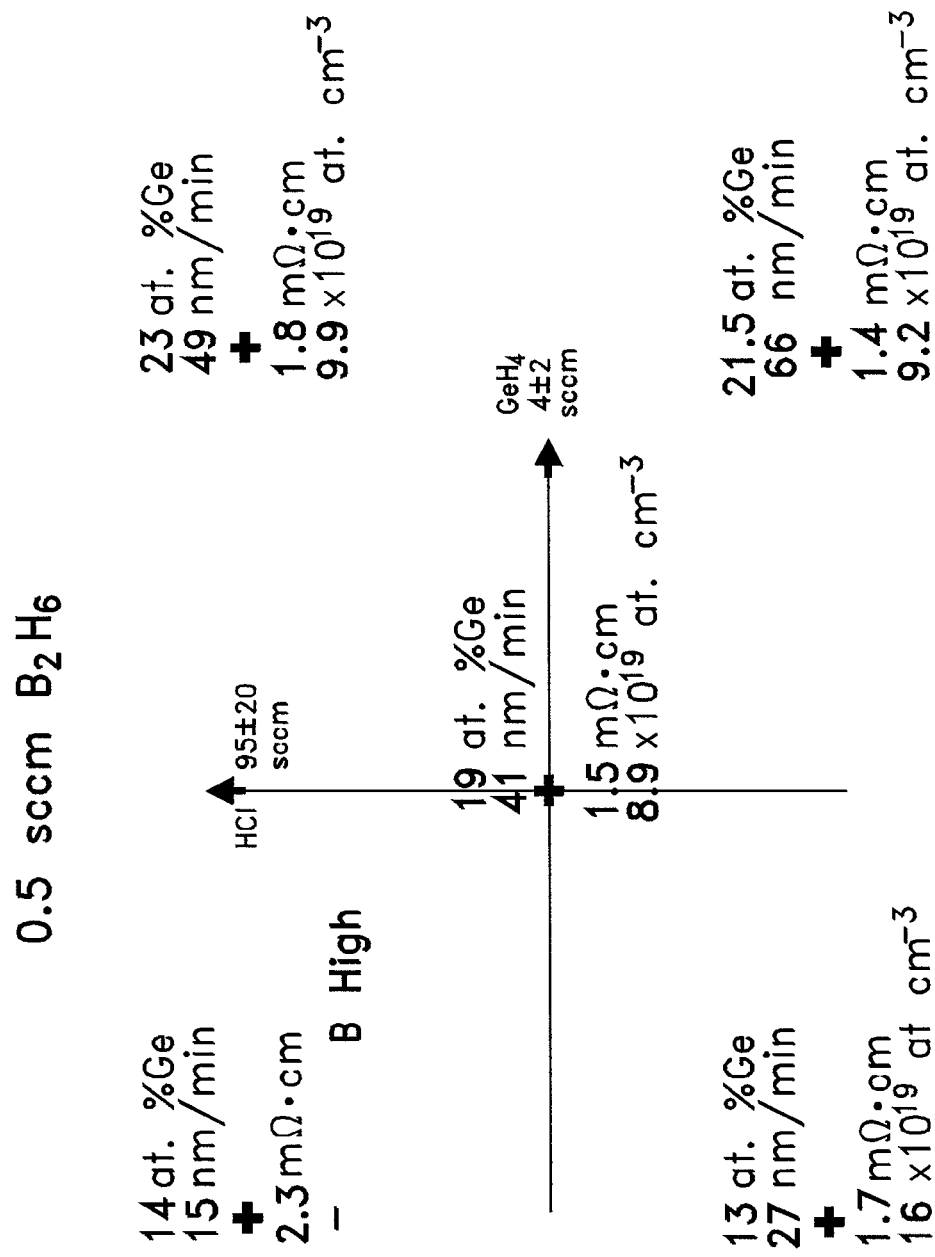
FIG. 4C is a plot of atomic % Ge in SiGe:B as a function of $GeH_4$, and the growth rate of SiGe:B as a function of $GeH_4$ and HCl, for a third dopant concentration of $B_2H_6$.

FIGS. 4A-4C are plots showing the atomic % Ge in SiGe:B as a function of $GeH_4$, and the growth rate of SiGe as a function of $GeH_4$ and HCl for five different deposition conditions. In these experiments, $B_2H_6$ precursor was used in addition to the precursors and etchant that were used to generate the data of FIG. 3. FIG. 4A shows the % Ge and growth rate for SiGe films deposited with 0.1 sccm of $B_2H_6$ and 75, 95 and 115 sccm of HCl (vertical axis) and about 2.6, 4.6 and 6.6 sccm of diluted $GeH_4$ (10% in $H_2$) (horizontal axis). FIGS. 4B and 4C show the results for the same deposition conditions as for FIG. 4A, but with $B_2H_6$ amounts of 0.3 sccm, and 0.5 sccm, respectively. As shown, the different levels of $B_2H_6$ flow rates with 4 sccm of diluted $GeH_4$ and 95 sccm of HCl resulted in similar % Ge and deposition rates of about 20% Ge and about 38 to 41 nm/min of film deposition rate. These values of % Ge and deposition rates were similar to those shown at the center point in FIG. 3, which is defined by the same process conditions of $GeH_4$ and HCl, but without $B_2H_6$.

Figure 5A:
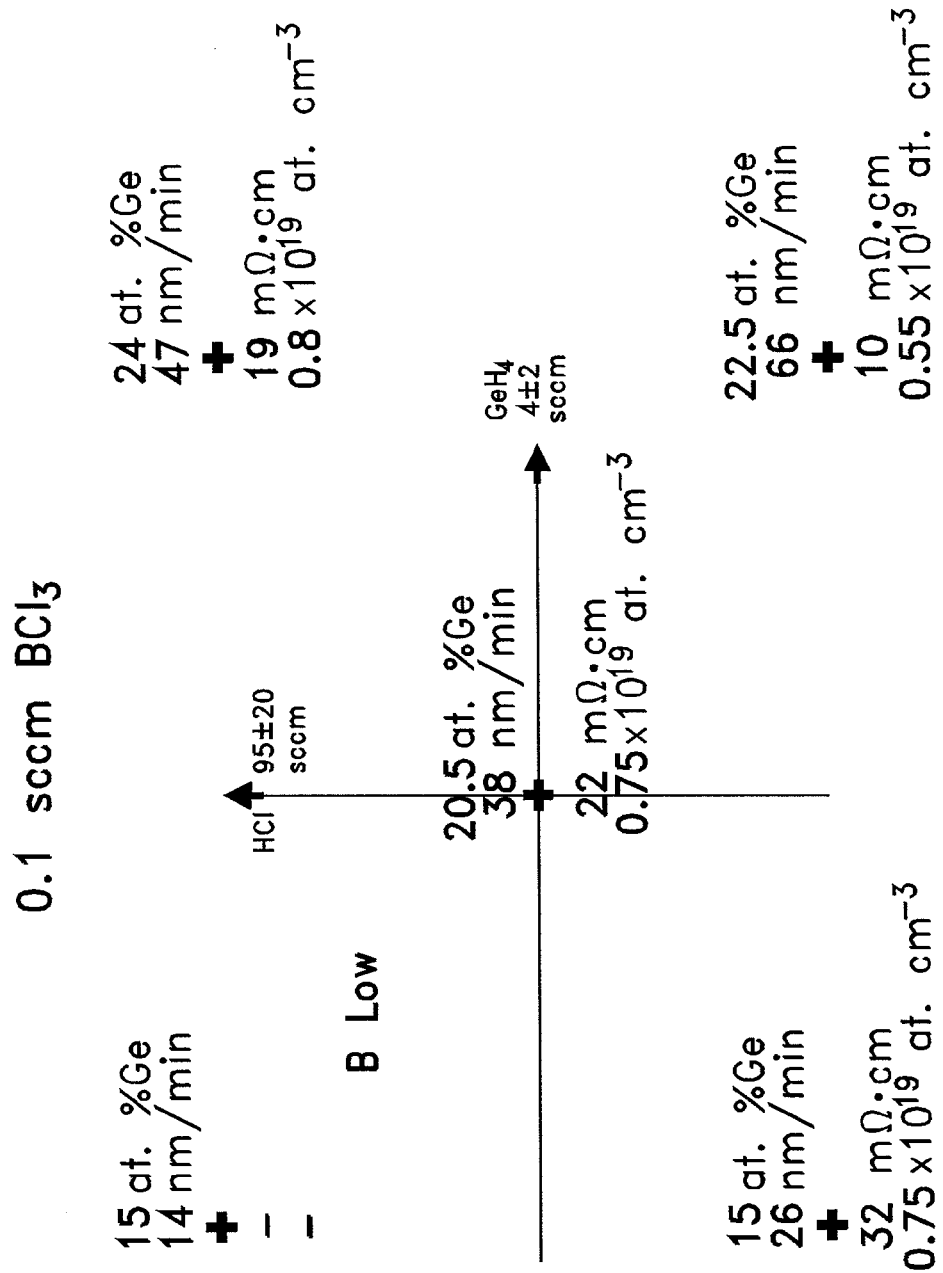
FIG. 5A is a plot of atomic % Ge in SiGe:B as a function of $GeH_4$, and the growth rate of SiGe as a function of $GeH_4$ and HCl, for one dopant concentration of $BCl_3$.
Figure 5B:
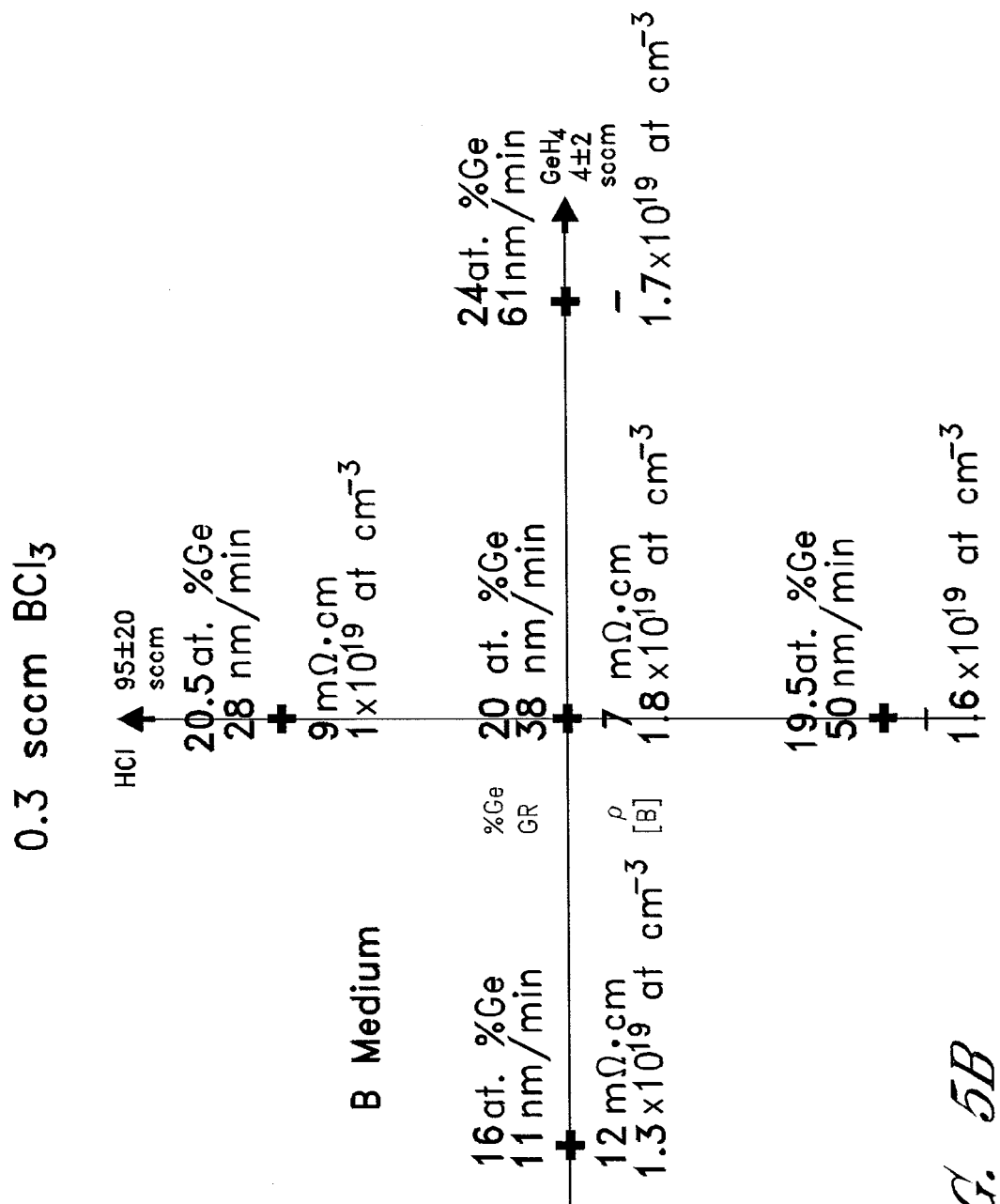
FIG. 5B is a plot of atomic % Ge in SiGe:B as a function of $GeH_4$, and the growth rate of SiGe as a function of $GeH_4$ and HCl, for another dopant concentration of $BCl_3$.
Figure 5C:
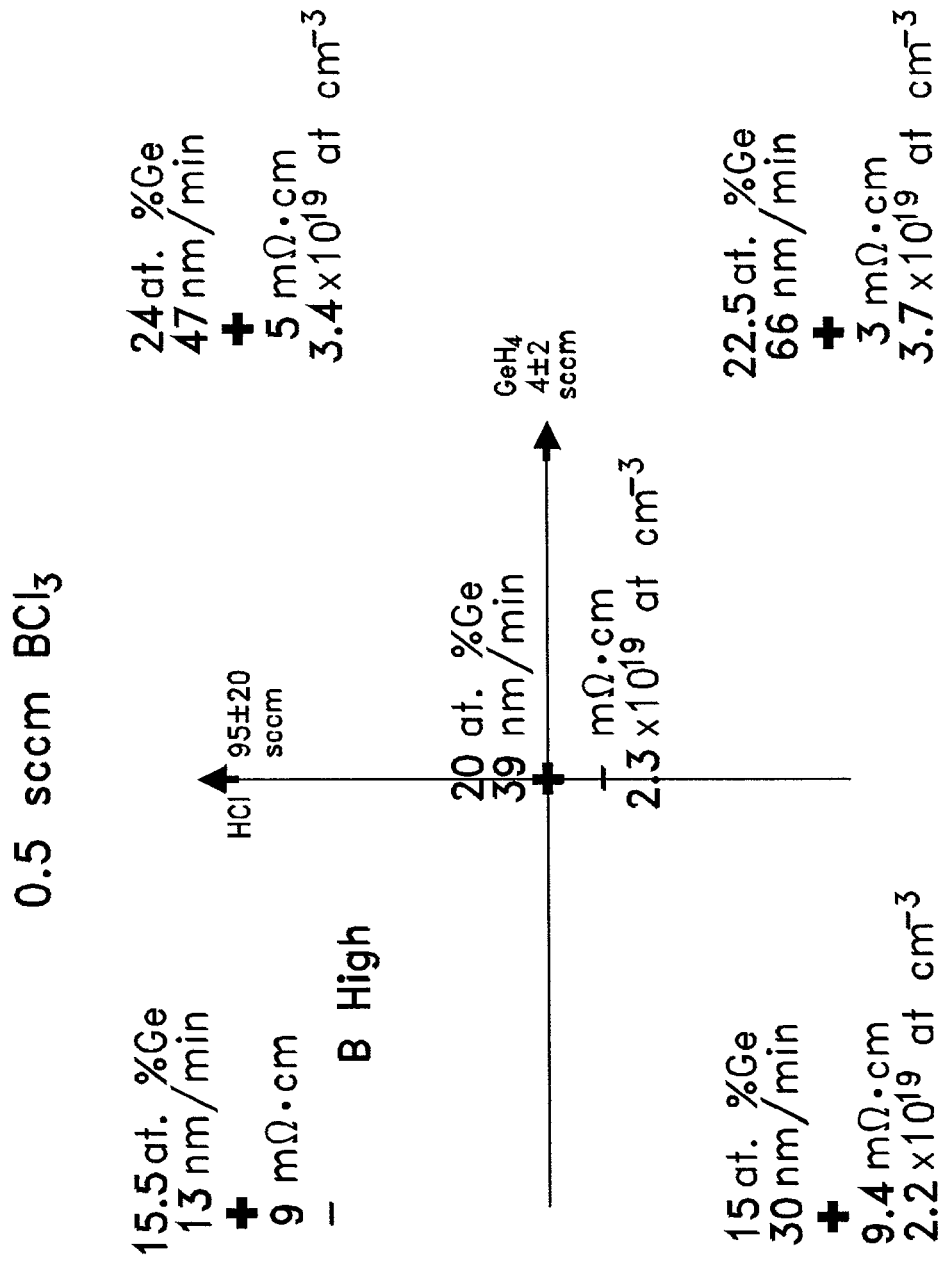
FIG. 5C is a plot of atomic % Ge in SiGe:B as a function of $GeH_4$, and the growth rate of SiGe as a function of $GeH_4$ and HCl, for a third dopant concentration of $BCl_3$.

FIGS. 5A-5C are plots showing similar results as for FIG. 3 but with the addition of the $BCl_3$ precursor in FIGS. 5A-5C in addition to the dichlorosilane, $GeH_4$ precursors and HCl that were used in the experiments reflected in FIG. 3. Accordingly, FIGS. 5A-5C show the % Ge and growth rate for SiGe films deposited with 75, 95 and 115 sccm of HCl and about 2.6, 4.6 and 6.6 sccm of diluted $GeH_4$ (10% in $H_2$). FIGS. 5A, 5B and 5C show the results of adding pure $BCl_3$ in amounts of 0.1, 0.3 and 0.5 sccm, respectively. As shown, the different levels of $BCl_3$ flow rates for 4 sccm of diluted $GeH_4$ and 95 sccm of HCl also resulted in similar % Ge and deposition rates of 20 to 20.5% Ge and 38 to 39 nm/min of film deposition rate.

Also measured and shown in FIGS. 4A-4C and 5A-5C are the electrical resistivity and the boron concentration for each set of deposition conditions. As shown in the figures, for otherwise similar conditions, increasing the level of $B_2H_6$ or $BCl_3$ increased the incorporation of electrically active boron and decreases the electrical resistivity. As indicated in FIGS. 4A-4C, the boron concentration in the $B_2H_6$-deposited film was $1.9 \times 10^{19}$ at/cm$^3$ (resistivity of 4.7 mΩ·cm) at the lowest flow rate (0.1 sccm), increasing to $5.8 \times 10^{19}$ at/cm$^3$ (resistivity of 2.1 mΩ·cm) at a higher flow rate (0.3 sccm) and increasing still further to $8.9 \times 10^{19}$ at/cm$^3$ (resistivity of 1.5 mΩ·cm) at the highest flow rate (0.5 sccm). As indicated in FIGS. 5A-5C, the boron concentration in the $BCl_3$-deposited film was $0.75 \times 10^{19}$ at/cm$^3$ (resistivity of 22 mΩ·cm) at the lowest flow rate (0.1 sccm), increasing to $1.8 \times 10^{19}$ at/cm$^3$ (resistivity of 7 mΩ·cm) at a higher flow rate (0.3 sccm) and increasing still further to $2.3 \times 10^{19}$ at/cm$^3$ at (resistivity not recorded) at the highest flow rate (0.5 sccm).

By comparing the values at the center of the graphs for FIGS. 3, 4A-4C and 5A-5C, the results collectively illustrate that the presence of $B_2H_6$ or $BCl_3$ at various flow rates does not significantly affect the % Ge or deposition rate of undoped silicon. The results also collectively illustrate that increasing the amount of substitutional boron from $B_2H_6$ or $BCl_3$ does not significantly affect the % Ge or deposition rate of undoped SiGe either. Since the above tests were performed using conditions optimally tuned for the deposition of $B_2H_6$, they show the replacement of $B_2H_6$ with $BCl_3$ as a feasible alternative for selective SiGe deposition.

Figure 6:
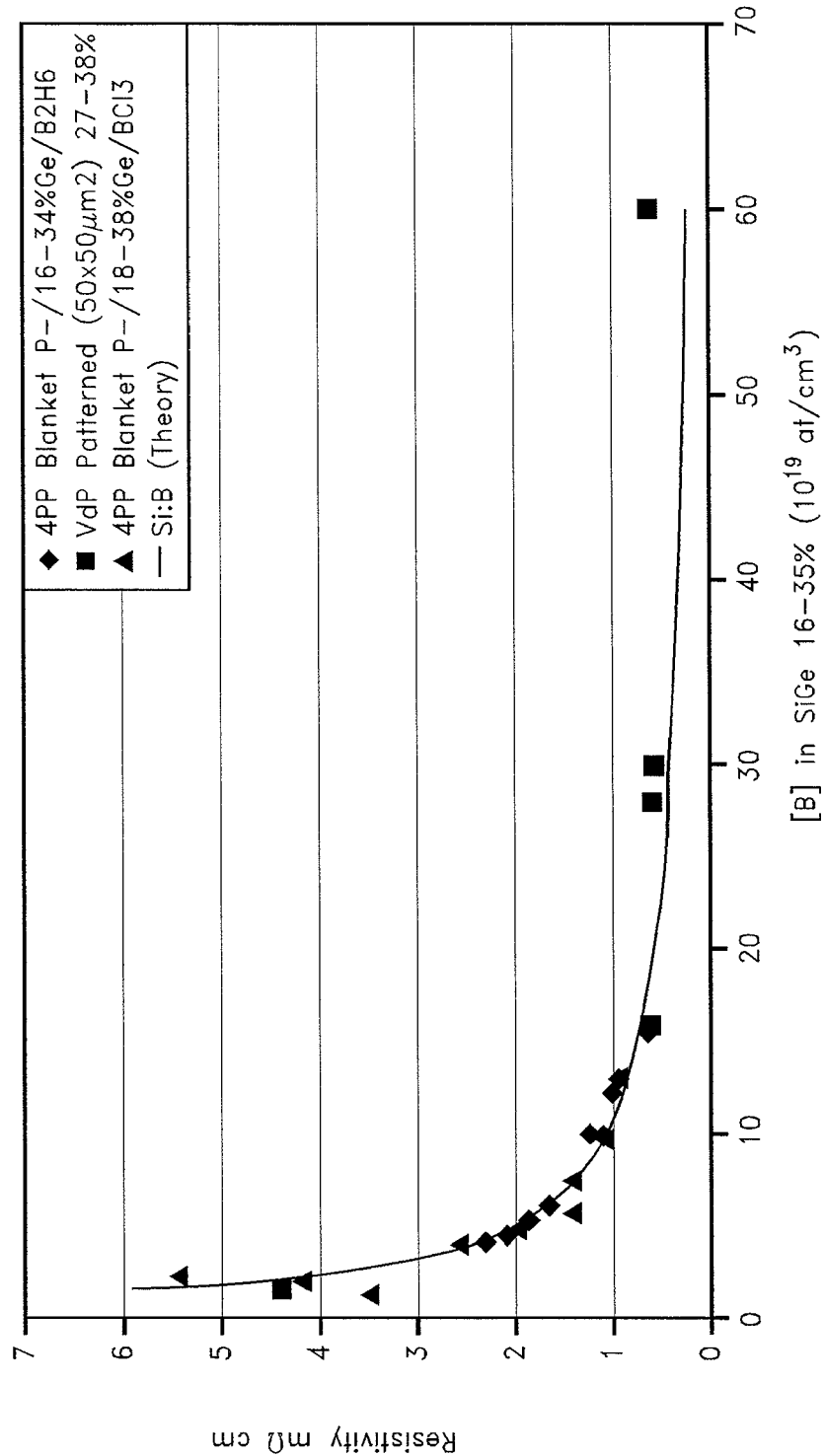
FIG. 6 is a plot of the resistivity of SiGe:B films vs. B concentration in theory, and for bare silicon and patterned wafers formed using $BCl_3$ and $B_2H_6$.

FIG. 6 is a plot of the four-point probe film resistivity of doped SiGe as a function of boron concentration for three films, and also of the theoretical resistivity of Si:B (shown by the line). The three films include a blanket SiGe:B film deposited on a bare silicon wafer with $B_2H_6$ and an atomic % Ge of 16-35%, a SiGe:B film deposited on a patterned wafer with $B_2H_6$ and an atomic % Ge of 27-38%, a blanket SiGe film deposited on a bare silicon wafer with $BCl_3$ and an atomic % Ge of 18-38%. The patterned wafer is a mixed substrate including 50 μm by 50 μm silicon windows exposed in a field of silicon oxide. FIG. 6 shows that the dependence of the resistivity as a function of boron concentration for a SiGe:B film deposited with a $BCl_3$ precursor is consistent with that of films deposited with a $B_2H_6$ precursor, and is consistent with theory. In general, the presence of substitutional germanium results in scattering that tends to increase resistivity, as compared to an otherwise similar electrically-doped single crystalline Si-containing film that does not contain substitutional germanium. The combination of the electrically active dopant and the substitutional germanium according to embodiments produces films having desirably low resistivity values, such as about 1.1 mΩ·cm to about 1.6 mΩ·cm in the illustrated embodiments.

The processes described herein are useful for depositing Si-containing films on a variety of substrates, and selective versions of such depositions are particularly useful for depositing Si-containing films over mixed substrates. An embodiment provides a method for selectively depositing an electrically doped strained single crystalline SiGe film onto the single crystal region(s) of a mixed substrate. HCl may be provided as a supplemental or additional etchant, where the etch effects upon slow-nucleating deposition on amorphous (typically insulating) surfaces is greater than the etch effects on exposed semiconductor surfaces. HCl is known to be difficult to purify and typical commercial sources of HCl can introduce moisture into the deposition process. Such moisture can lower the conductivity of deposited films, and cause unacceptable levels of defects in epitaxial deposition. $B_2H_6$ actually inhibits selectivity, necessitating additional etchant (relative to intrinsic or undoped semiconductors) in order to maintain selectivity. In contrast to $B_2H_6$, the dopant precursor $BCl_3$ can enhance the selectivity of silicon-based deposition without requiring additional etchant levels, thus avoiding the contaminants that such additional etchant levels are prone to add to the process. Thus, the use of a feed gas comprising $BCl_3$ and a silicon source according to embodiments of the invention may provide the advantages of enabling high levels of selectivity while minimizing impurities that tend to accompany commercially available HCl.

Figure 7:
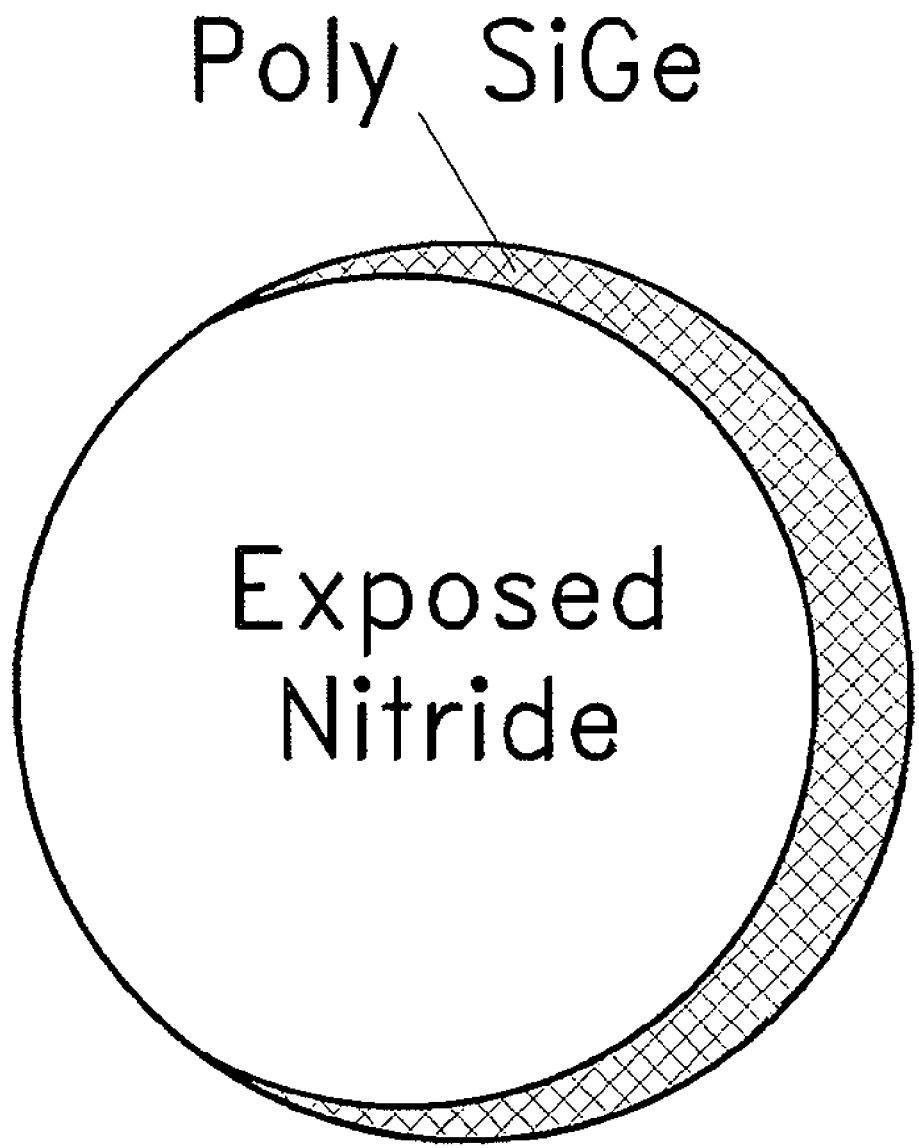
FIG. 7 is a schematic of a wafer with an exposed nitride surface and asymmetric deposition of poly-SiGe as a measure of selectivity threshold.

As illustrated in the simplified schematic of FIG. 7, an artificially induced, minor hardware asymmetry can cause asymmetric poly-SiGe deposition on one edge of a wafer having a blanket silicon nitride film, while the majority of the wafer receives no net deposition. Thus, the conditions are such that zero net deposition occurs on the insulator, but because they are just at the threshold for selectivity, but for the hardware asymmetry, maximum deposition rates would occur on any exposed silicon. Accordingly, the resultant edge deposition does not detract from the findings of the studies. A measure of selectivity is shown by, for example, the amount of HCl needed to maintain the nitride surface clean of poly-SiGe deposits for the same amount of $B_2H_6$ and $BCl_3$. These tests have shown that SiGe without boron and SiGe:B formed with $BCl_3$ have similar selectivity thresholds. However, a larger amount of HCl was required to maintain a clean nitride surface for SiGe:B formed with $B_2H_6$. Thus, the selective growth of depositing SiGe with $BCl_3$ shows improved selectivity over depositing SiGe:B with $B_2H_6$.

FIGS. 8-14 show results comparing the selectivity of SiGe:B films deposited with dopant precursors $B_2H_6$ and $BCl_3$. Determining the threshold for selective growth is an inexact science, as further discussed below. However, it has been shown that selectivity can be qualitatively compared between SiGe films formed with $B_2H_6$ and with $BCl_3$.

Figure 8B:
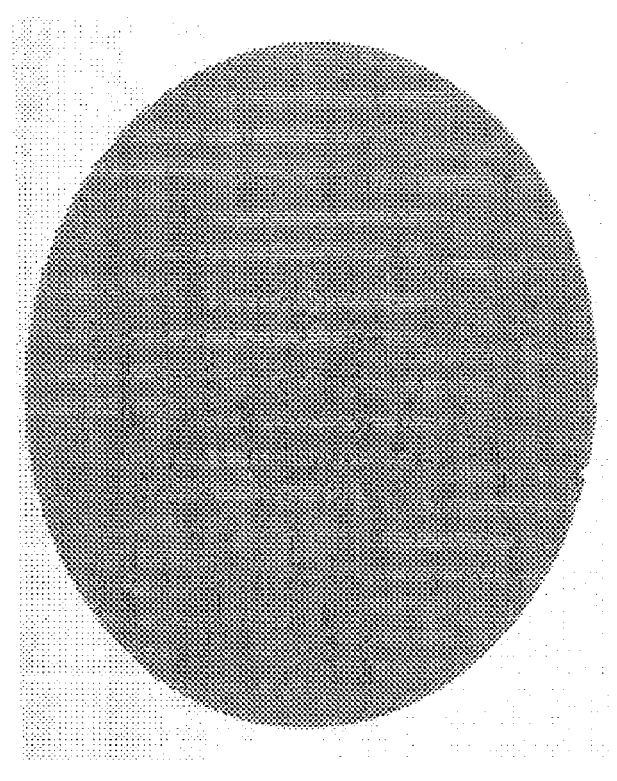
FIGS. 8A-8B are optical results of blanket nitride films deposited with SiGe:B having $10^{19}$ atoms/cm$^3$ of boron, and a target thickness of 80 nm.
Figure 8A:
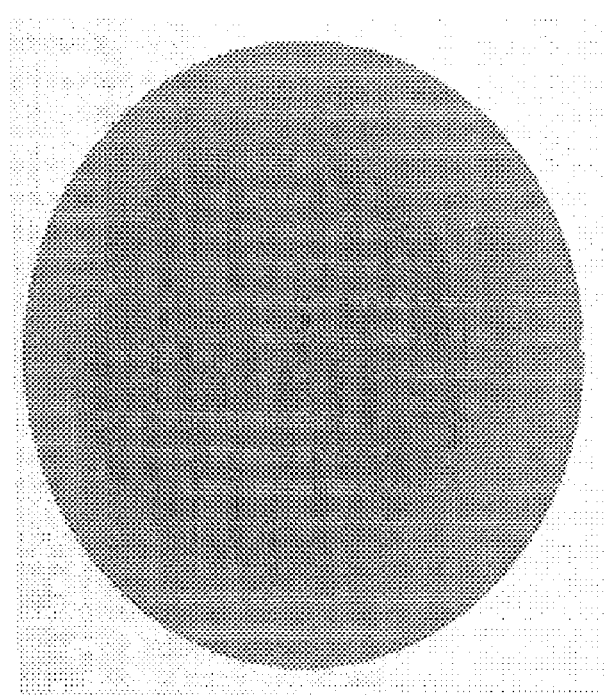

FIGS. 8A-8B are optical pictures that visually compare the selectivity of SiGe:B films deposited with $B_2H_6$ and $BCl_3$ on blanket silicon nitride films. The deposition conditions targeted a concentration of $10^{19}$ atoms/cm³ of boron and a film thickness of 80 nm. FIG. 8A shows the SiGe:B film deposited with $B_2H_6$ and FIG. 8B shows the SiGe:B film deposited with $BCl_3$. According to FIG. 8B, the film deposited with $BCl_3$ resulted in a blue surface, indicating minimum poly-SiGe growth on the nitride surface and thus selective growth for the $BCl_3$-formed film. FIG. 8A in contrast showed a ring of poly-SiGe deposits around the entire periphery of the nitride film, indicating that non-selective growth would occur for the $B_2H_6$-formed film on a mixed substrate.

Figure 9:
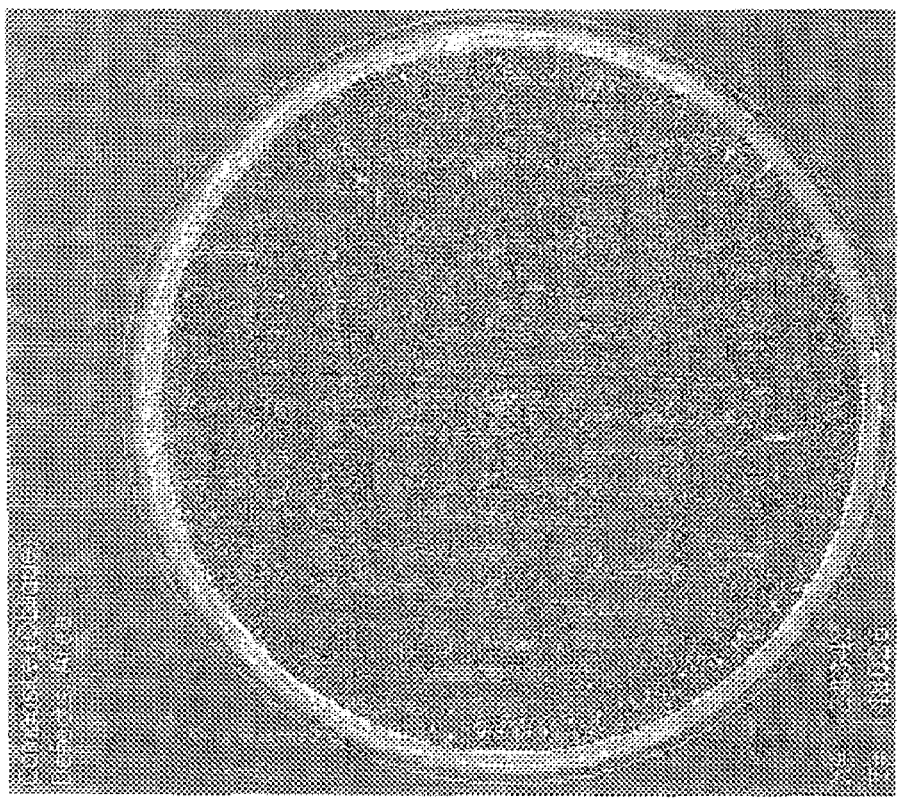
FIG. 9 shows the results of inspection of the nitride wafers of FIGS. 8A-8B with a KLA Tencor Surfscan 6200 Unpatterned Surface Inspection System.

FIG. 9 shows the results of inspection of the above nitride wafers of FIGS. 8A-8B using a KLA Tencor Surfscan 6200 Unpatterned Surface Inspection System commercially available from KLA Tencor of San Jose, Calif. The particles shown in FIG. 9 indicate the presence of poly-SiGe nuclei on the nitride surface for the $BCl_3$ process. In contrast, detector saturation occurred for the $B_2H_6$ process, indicating a considerably greater amount of poly-SiGe growth on the nitride surface. Thus, the optical and particle counting results show that under the same conditions the $BCl_3$ process would provide enhanced selectivity of the SiGe:B film relative to the $B_2H_6$ process on a mixed substrate.

Figure 10B:
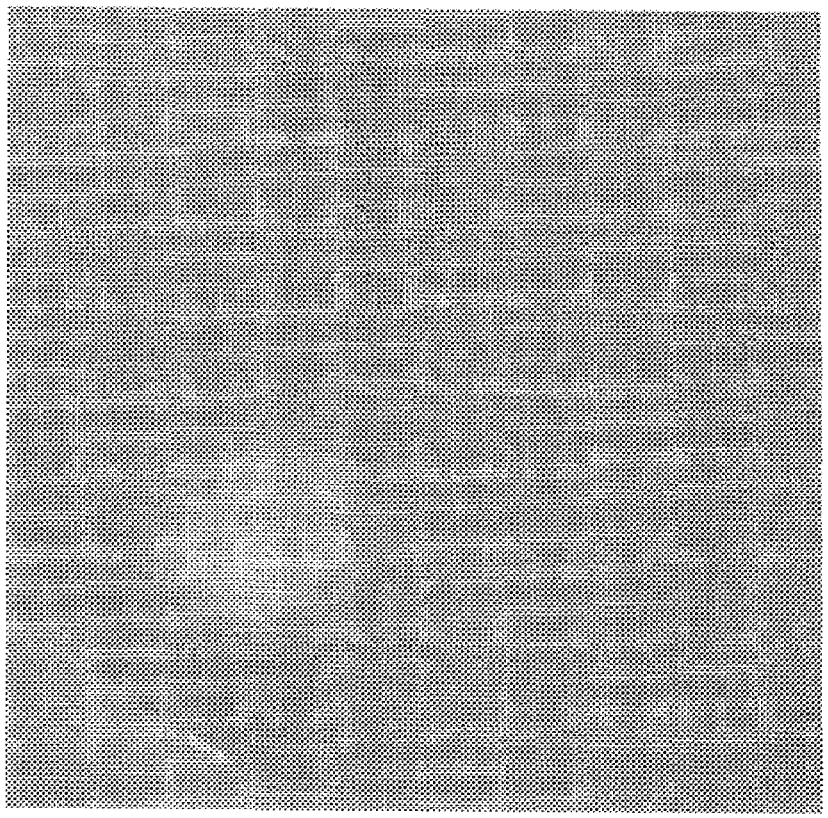
FIGS. 10A-10B are bright light optical results of blanket nitride films deposited with SiGe:B by $B_2H_6$ and $BCl_3$.
Figure 10A:
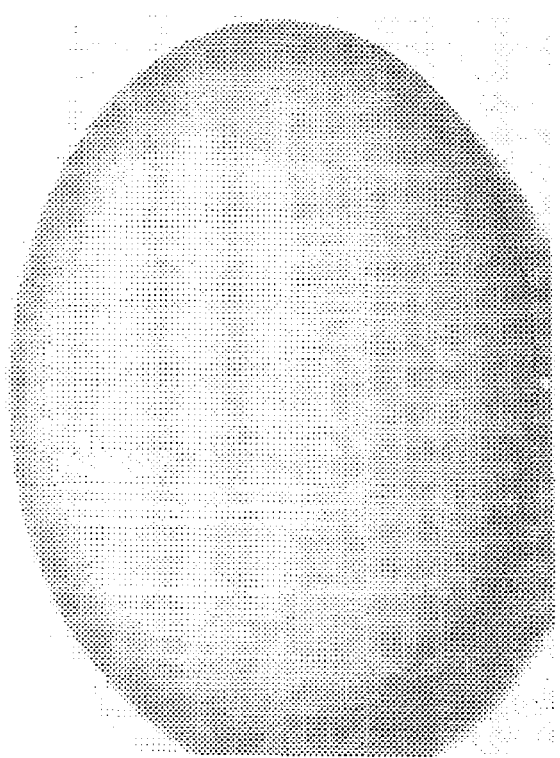
Figure 11A:
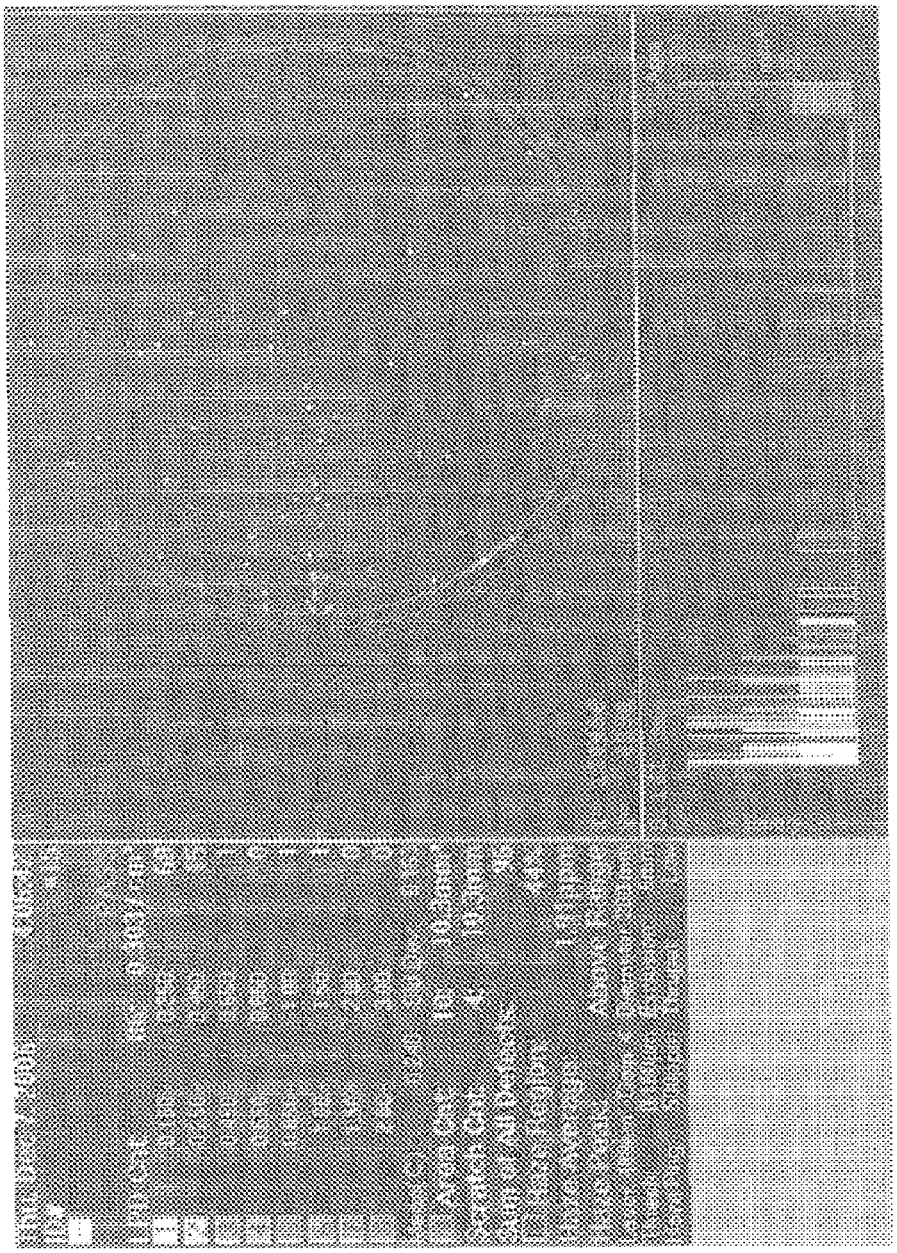
FIG. 11 shows the results of inspection of nitride wafers of FIGS. 10A-10B with a KLA Tencor Surfscan 6200 Unpatterned Surface Inspection System.

FIGS. 10A and 10B are optical results comparing SiGe:B films on blanket nitrides deposited with $B_2H_6$ and $BCl_3$, respectively, but with the boron concentration increased from about $10^{19}$ at/cm³ to $10^{20}$ at/cm³. As shown in the figures, the films have been observed with a bright light source. Deposits of poly-SiGe nuclei for the $B_2H_6$-deposited film as shown in FIG. 10A changed the wafer's color from blue to gold. In contrast, FIG. 10B shows a reflection of the bright light source, since the $BCl_3$ process simply formed a light haze around the edges of the otherwise blue wafer. FIG. 11 shows the results of the above wafers of FIGS. 10A-10B with a KLA Tencor Surfscan 6200 Unpatterned Surface Inspection System. FIG. 11 shows the poly-SiGe nuclei on the nitride surface for the $BCl_3$-formed film. In contrast, detector saturation was caused by the non-selective, blanket deposition of the $B_2H_6$-formed film on a bare silicon wafer. Thus, the optical and particle counting results show that the $BCl_3$ process would provide enhanced selectivity on a mixed substrate of the SiGe:B film relative to the $B_2H_6$ process even when boron flow rates and concentration are increased.

Figure 12B:
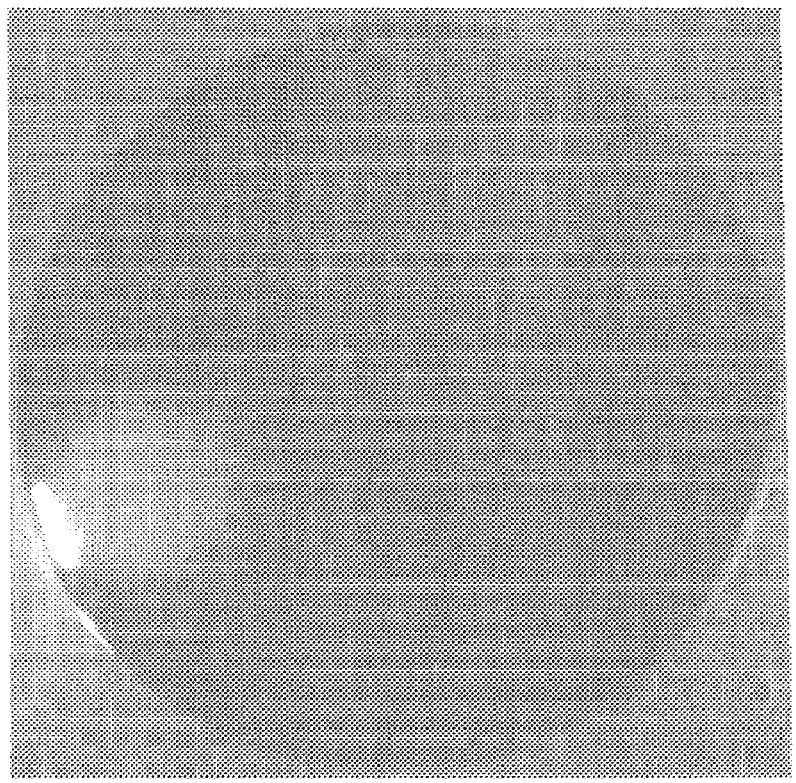
FIGS. 12A-12B are optical results of blanket nitride films wafers deposited with SiGe:B by $B_2H_6$ and $BCl_3$.
Figure 12A:
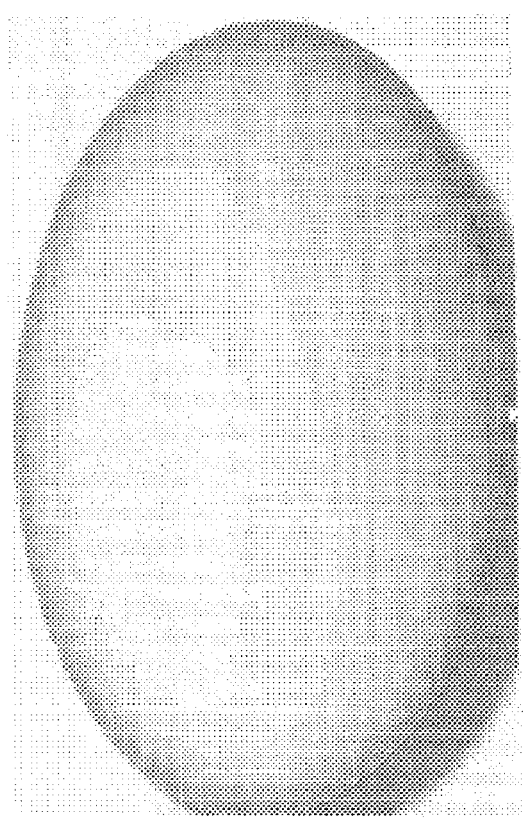
Figures 13A, 13B:
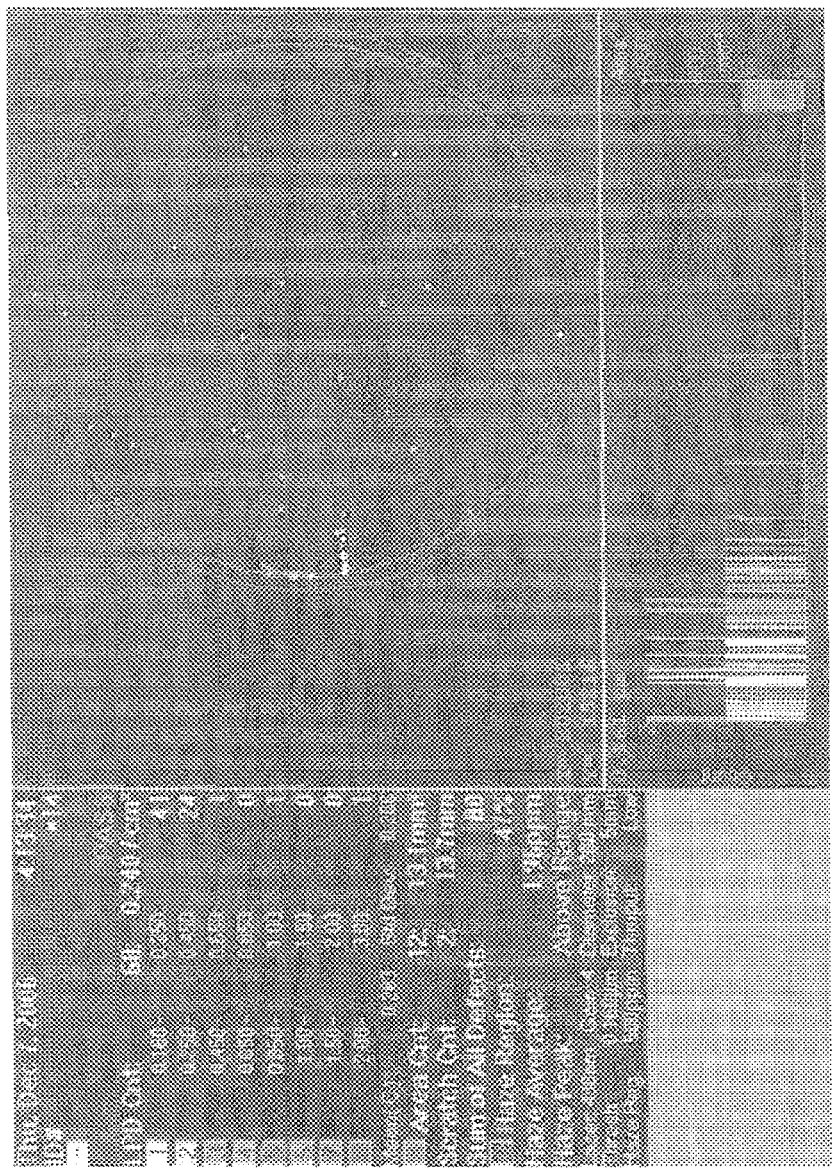
FIG. 13 shows the results of inspection of nitride wafers of FIG. 12B with a KLA Tencor Surfscan 6200 Unpatterned Surface Inspection System.

FIGS. 12A and 12B are optical results comparing SiGe:B films on blanket nitrides deposited with $B_2H_6$ and $BCl_3$, respectively, with the boron concentration at $10^{20}$ at/cm³, but with a decrease in the amount of HCl flow from 95 sccm to 75 sccm. Since results of FIG. 7 have shown that not as much HCl was needed for the $BCl_3$ process to clear the nitride surface of polycrystalline deposits, the amount of HCl was decreased to maximize growth rate. The optical results were similar to those of FIGS. 10A-10B for films deposited with an HCl flow rate of 95 sccm. For the result of FIG. 12A, a blanket layer of poly-SiGe deposits for the $B_2H_6$-deposited film changed the wafer's color from blue to gold. FIG. 12B shows a reflection of the bright light source and a similar light haze observed on the otherwise blue wafer. FIG. 13 shows the corresponding results for the above films of FIGS. 12A-12B with the KLA Tencor Surfscan 6200 System. FIG. 13 shows the amount of particles found on the surface of the $BCl_3$-deposited film. In contrast, detector saturation had occurred for the wafer with the $B_2H_6$-deposited film. Thus, FIGS. 12-13 show that selectivity of SiGe:B is enhanced for the $BCl_3$ process relative to the $B_2H_6$ process with a decreased amount of HCl.

Figure 14:
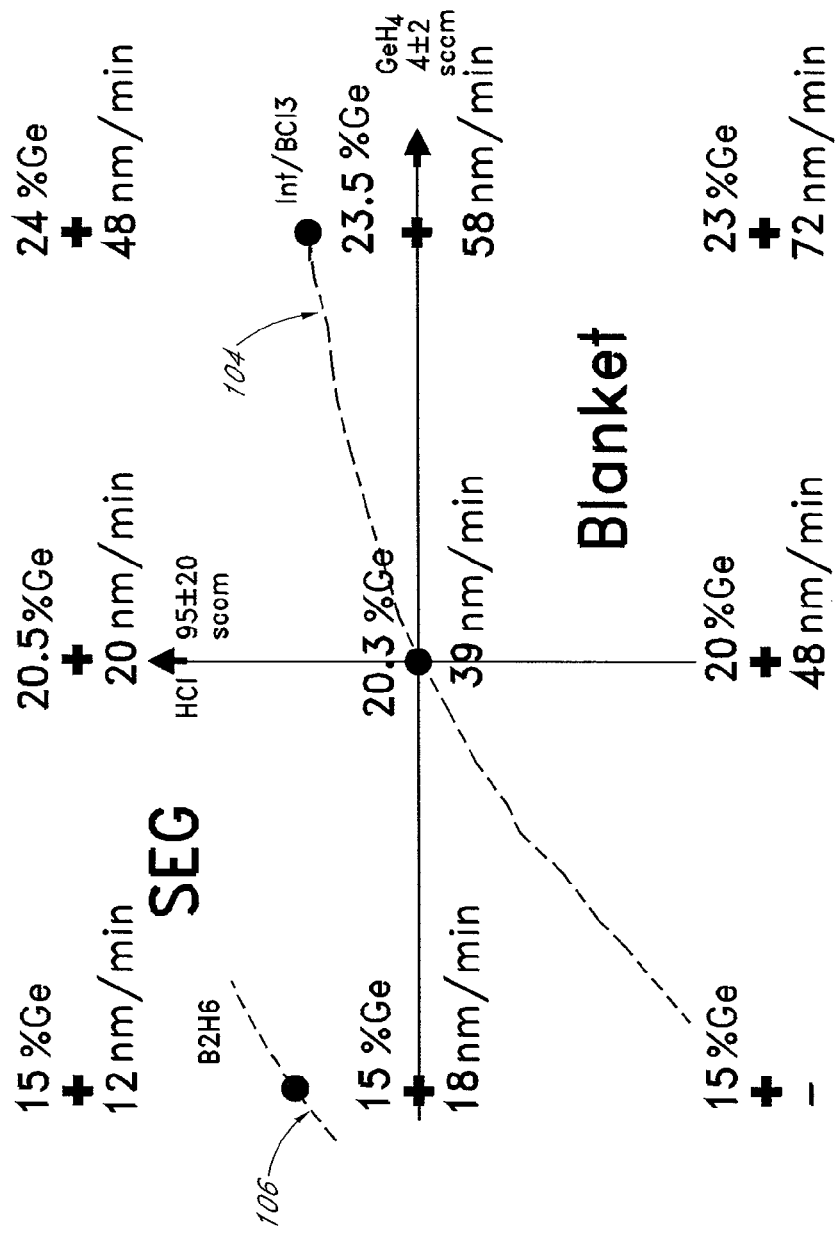
FIG. 14 is a plot of parameters for deposition conditions ($GeH_4$ and HCl flow rates) at which selective growth occurs for intrinsic SiGe films, SiGe:B films from $BCl_3$ and SiGe:B films having $7\times10^{19}$ atoms/cm$^3$ SiGe:B films from $B_2H_6$ of boron and formed with $BCl_3$, and having $6\times10^{19}$ atoms/cm$^3$ of boron and formed with $B_2H_6$.

FIG. 14 plots the parameters for deposition conditions (flow rates of $GeH_4$ and HCl) at which selective growth has been shown to occur for SiGe:B films with $7 \times 10^{19}$ atoms/cm³ of incorporated boron for the $BCl_3$-deposited film and with $6 \times 10^{19}$ atoms/cm³ of incorporated boron for the $B_2H_6$-deposited film. The target thickness for the boron-doped SiGe:B films was 110 nm, the industry standard for a device with an atomic % Ge of 20% in SiGe. Line 104 defines the observed limits of process conditions at which selective growth of SiGe:B deposited with $BCl_3$ occurs, and line 106 defines the corresponding observed limits for the selective growth of SiGe:B deposited with $B_2H_6$. In particular, the process conditions lying above line 104 are suitable for selective growth of SiGe:B deposited with $BCl_3$, and the process conditions lying below line 104 results in a non-selective, blanket deposition on the dielectric surface of SiGe:B deposited with $BCl_3$. The line 104 indicates that for an SiGe:B film deposited with an amount of $BCl_3$ to attain about $7 \times 10^{19}$ atoms/cm³ of incorporated boron and 4 sccm of $GeH_4$ (20.3% Ge), selective growth occurs when the flow rate of HCl is $\geq 95$ sccm, as indicated by the process conditions defining the center data point of FIG. 14. For an SiGe:B film (with about $7 \times 10^{19}$ atoms/cm³ of boron) deposited with $BCl_3$ and 6 sccm of $GeH_4$ (23.5% Ge), selective growth occurs when the flow rate of HCl is $\geq 100$ sccm, as illustrated in line 104 of FIG. 14. Note that the same line 104 represents approximate selectivity conditions for intrinsic or undoped SiGe, deposited without any dopant. Line 106 shows that for SiGe:B deposited with an amount of $B_2H_6$ to attain about $6 \times 10^{19}$ atoms/cm³ of incorporated boron and 2 sccm of $GeH_4$ (15% Ge), selective growth occurs when the amount of HCl is $\geq$ about 100 sccm. While the number of data points is limited, FIG. 14 suggests that if the slope of line 104 is similar to the slope of line 106, extrapolating line 106 to cross the y-axis would give a data point at a much higher value of HCl for the $B_2H_6$ process than for the $BCl_3$, with 4 sccm of $GeH_4$. Then, line 104 would be displaced lower on the y-axis, the HCl amount, than line 106, at any given point on the x-axis, % Ge. Thus, FIG. 14 suggests that for SiGe:B with about the same amount of boron incorporation and % Ge, a considerably lesser amount of HCl is needed for the selective growth of SiGe:B deposited with $BCl_3$ than for the selective growth of SiGe:B deposited with $B_2H_6$, and that $BCl_3$ accordingly enhances the selectivity of SiGe:B films relative to $B_2H_6$ by requiring less HCl for selective deposition.

FIGS. 15-26 compare the film properties of SiGe:B films deposited with $BCl_3$ and $B_2H_6$ on mixed substrates of silicon windows exposed in a field of silicon oxide. The mixed substrates used were 200 mm in diameter and included 106 dies. The overall amount of exposed silicon was 38.7%, while the amount of exposed polysilicon was 29.6%, indicating that only about 9% of the silicon windows were single crystal. A portion of the surface of the wafer also comprised mask material, as known in the art. The patterned wafers were deposited with films according to deposition conditions first determined by blanket films on bare Si(100) substrates.

Figure 15A:
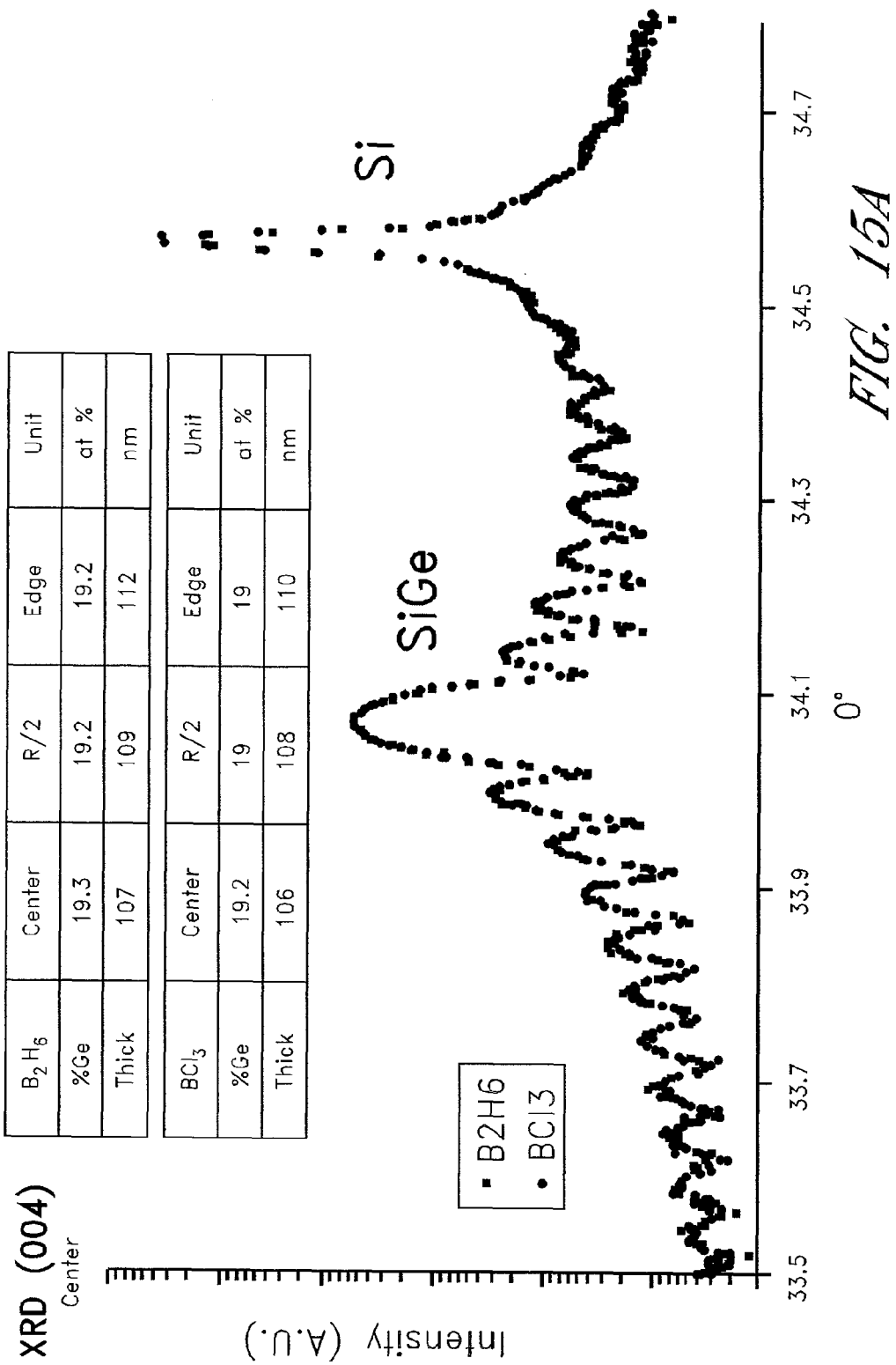
FIG. 15A is an XRD plot for SiGe:B formed with $B_2H_6$ and $BCl_3$ on bare silicon wafers.
Figure 15B:
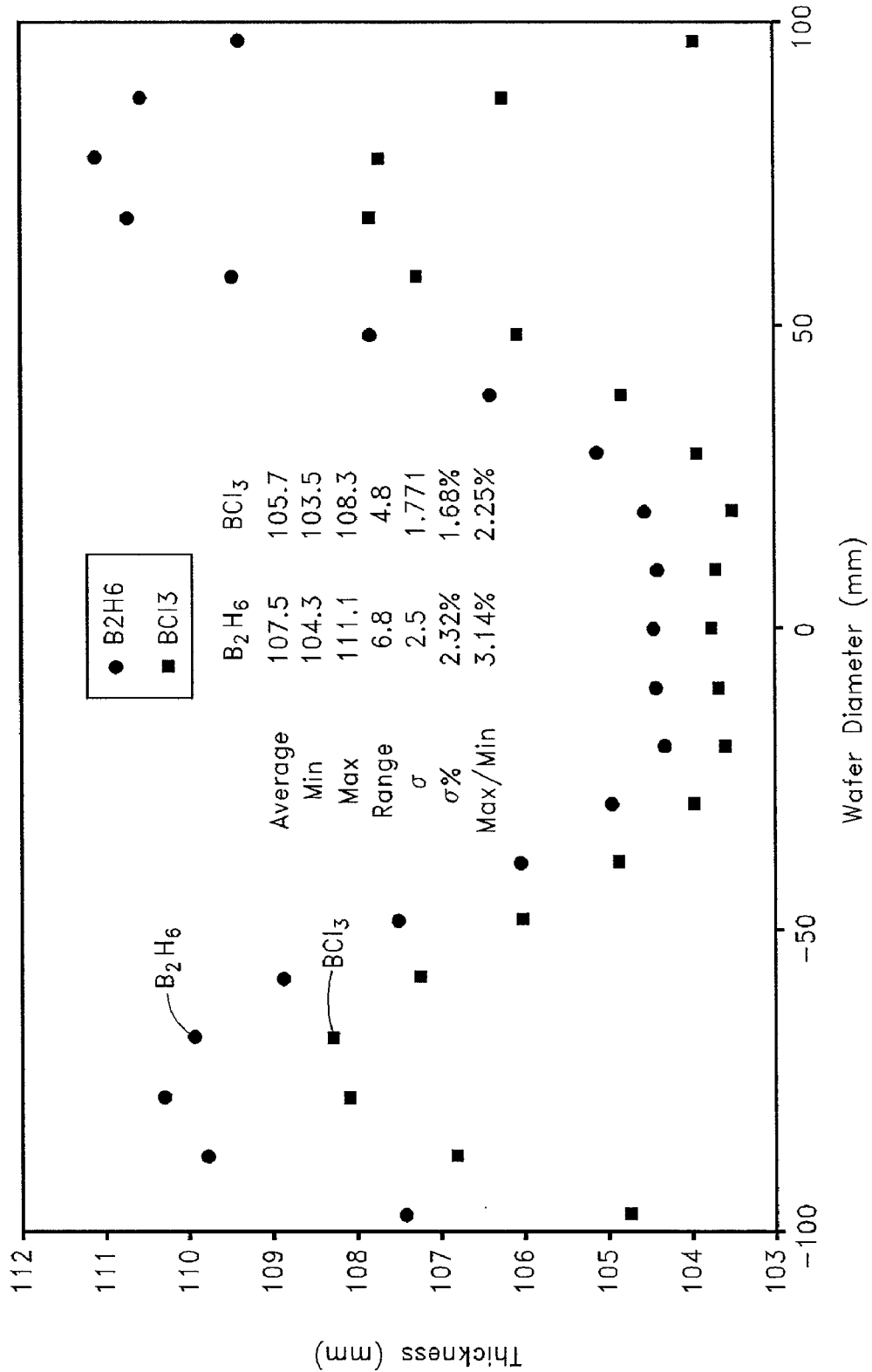
FIG. 15B is a plot of thickness as a function of wafer diameter for a blanket SiGe:B film formed with $B_2H_6$ and $BCl_3$.
Figure 15C:
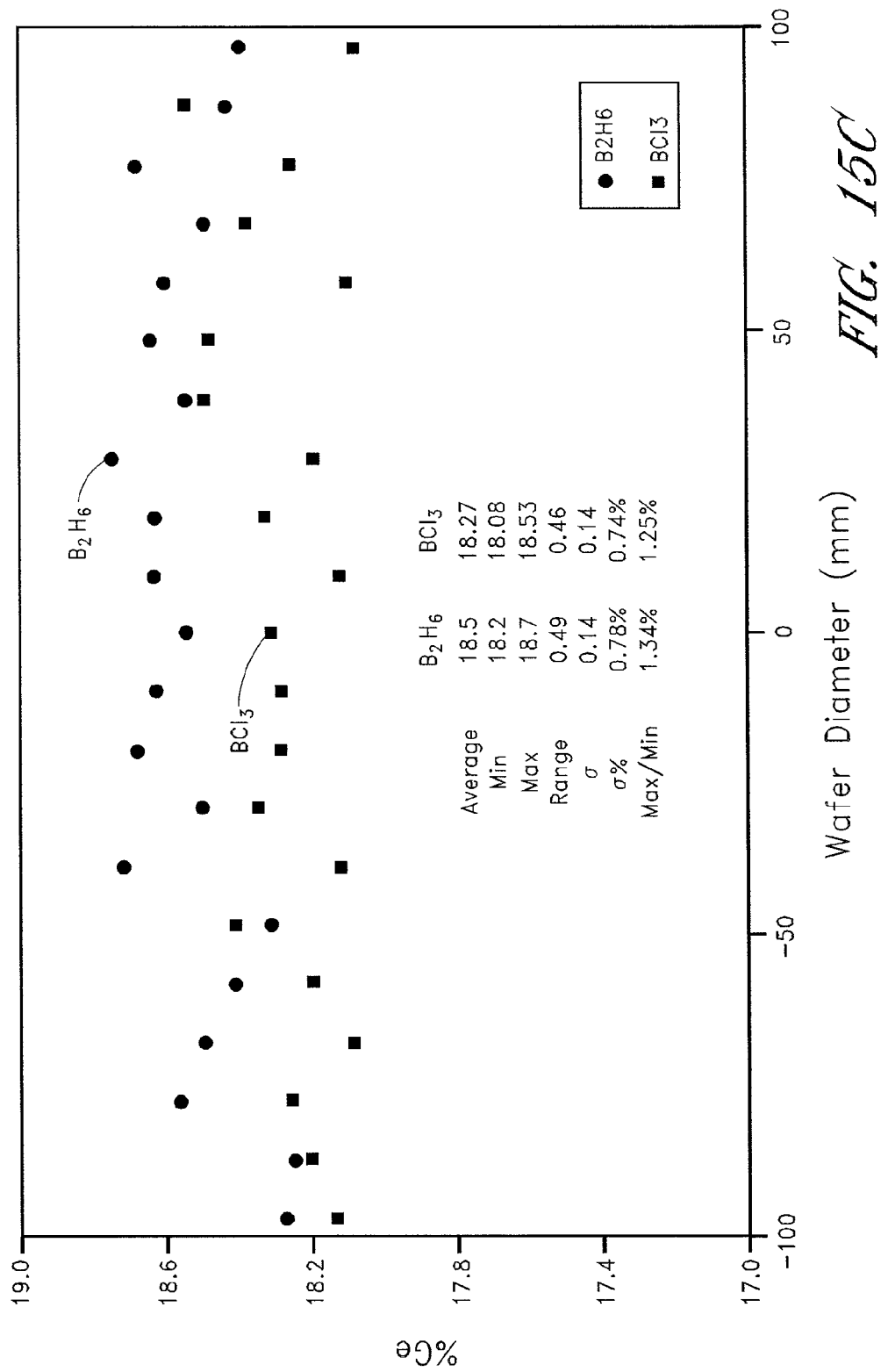
FIG. 15C is a plot of % Ge as a function of wafer diameter for a blanket SiGe:B film formed with $B_2H_6$ and $BCl_3$.
Figure 15D:
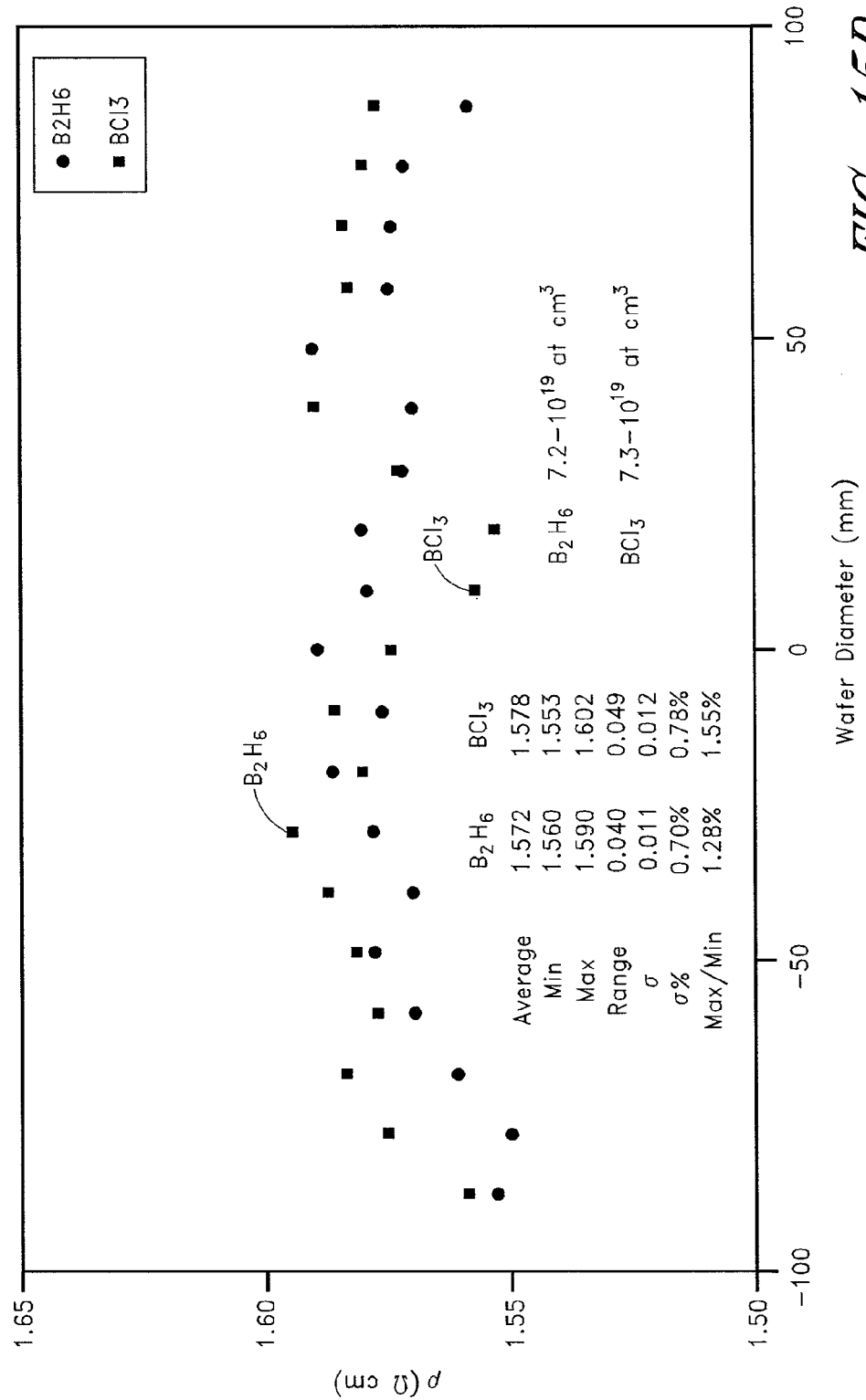
FIG. 15D is a plot of the resistivity as a function of wafer diameter for a blanket SiGe:B film formed with $B_2H_6$ and $BCl_3$.

FIGS. 15A-15D are plots of XRD, film thickness, atomic % Ge and resistivity results, respectively, of two SiGe:B blanket films on bare silicon wafers that were deposited with $B_2H_6$ and $BCl_3$, respectively, to determine the process conditions for depositing SiGe:B films on mixed substrates. Although FIG. 15A shows the average thickness of the SiGe:B film deposited with $BCl_3$ (105.7 nm) to be slightly less than that of the film deposited with $B_2H_6$ (107.5 nm), the plot is not an indication of thickness dependence on dopant precursor since the process conditions were different for $B_2H_6$ and $BCl_3$. For example, instead of injecting similar initial amounts of $B_2H_6$ and $BCl_3$, the amounts previously determined to give a boron concentration of about $10^{20}$ at/cm³ for both the $B_2H_6$ and $BCl_3$ processes were injected. In particular, for the $B_2H_6$ process, 0.2 sccm of pure $B_2H_6$ was injected with a dilution loop of 50 slm of $H_2$. For the $BCl_3$ process, 2.2 sccm of pure $BCl_3$ was injected with 1 slm of $H_2$. However, although not limited to theory, the lower thickness of the film deposited with $BCl_3$ film for about the same boron concentration for the $B_2H_6$ and $BCl_3$ processes can indicate the contribution of $BCl_3$ to etching, and can suggest that $BCl_3$ enhances selective growth of SiGe:B films. As shown in the figures, no other significant differences were shown in the XRD, resistivity or atomic % Ge results for the $B_2H_6$ and $BCl_3$ processes tuned to yield similar boron concentrations. As shown in FIG. 15C, the $B_2H_6$ and $BCl_3$ processes gave average atomic % Ge values of 18.5% for the $B_2H_6$-deposited film and 18.27% for the $BCl_3$-deposited film. As shown in FIG. 15D, the $B_2H_6$ and $BCl_3$ processes gave average resistivity values of 1.572 m$\Omega$·cm for the $B_2H_6$-deposited film and 1.578 m$\Omega$·cm for the $BCl_3$-deposited film.

Figure 16A:
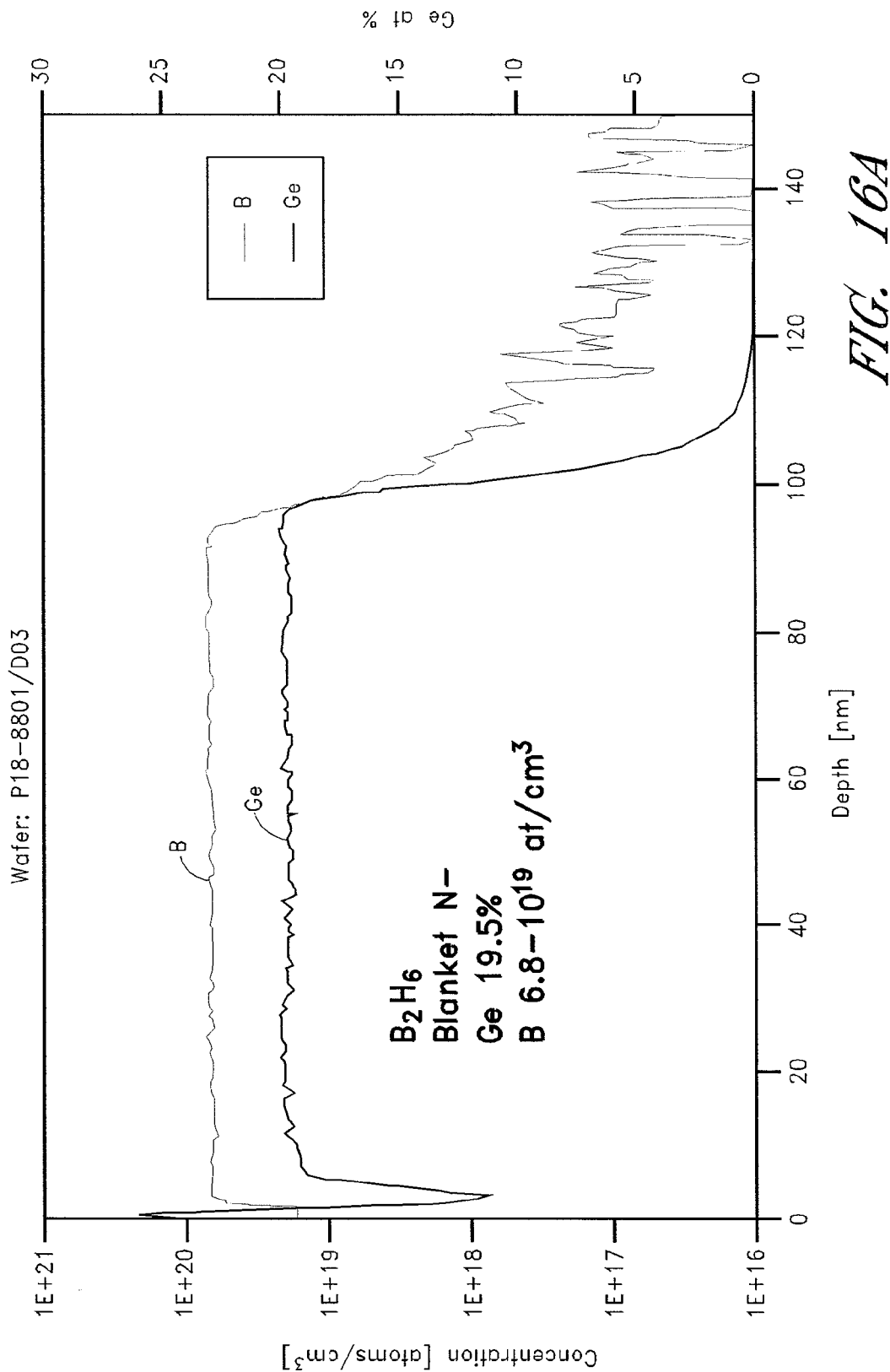
FIG. 16A is a SIMS plot of B and Ge concentrations for a blanket SiGe:B film on a bare silicon wafer formed with $B_2H_6$ as a function of depth.
Figure 16B:
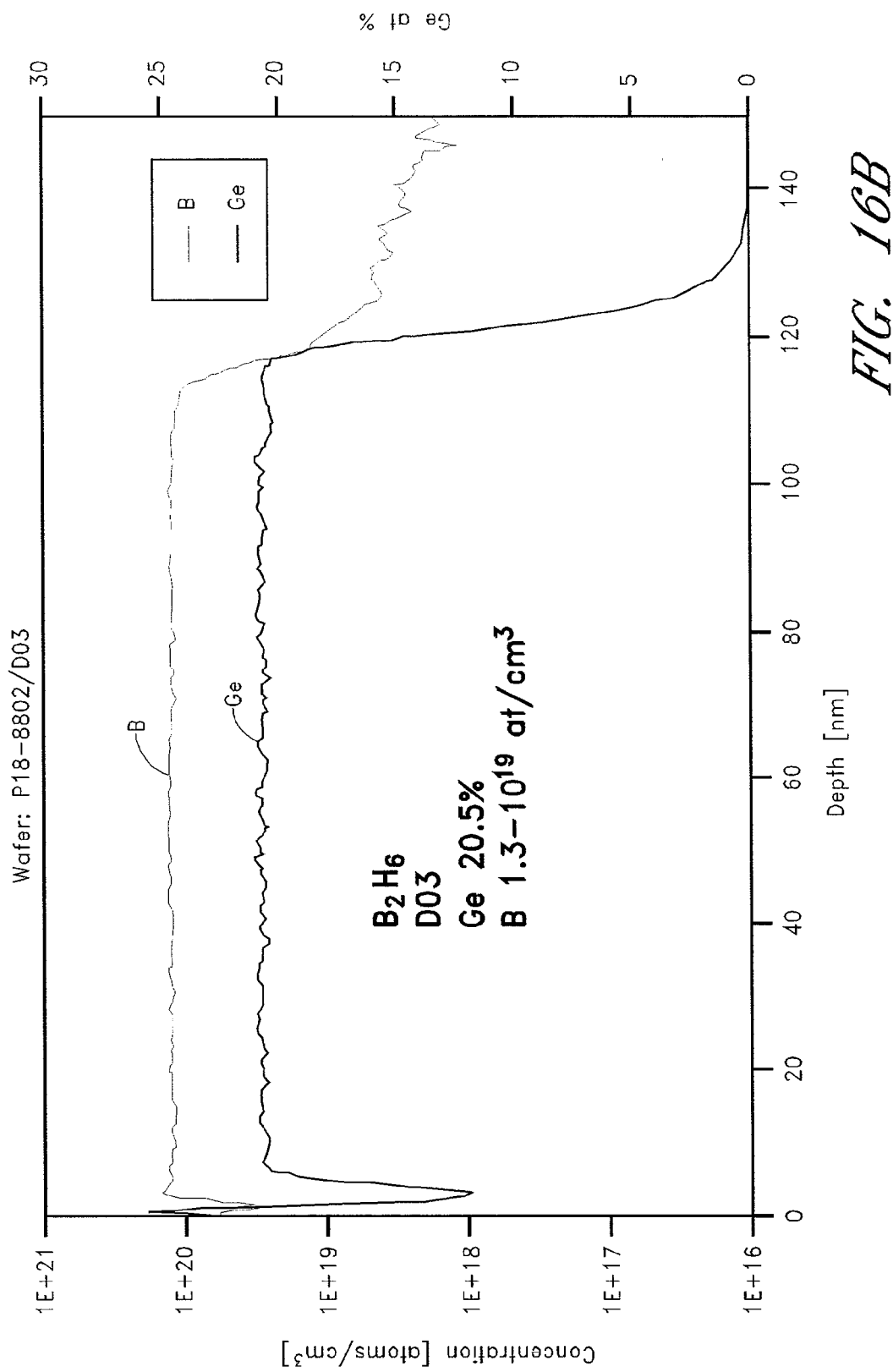
FIG. 16B is a SIMS plot of B and Ge concentrations for an SiGe:B film formed with $B_2H_6$ on a patterned wafer as a function of depth.
Figure 16C:
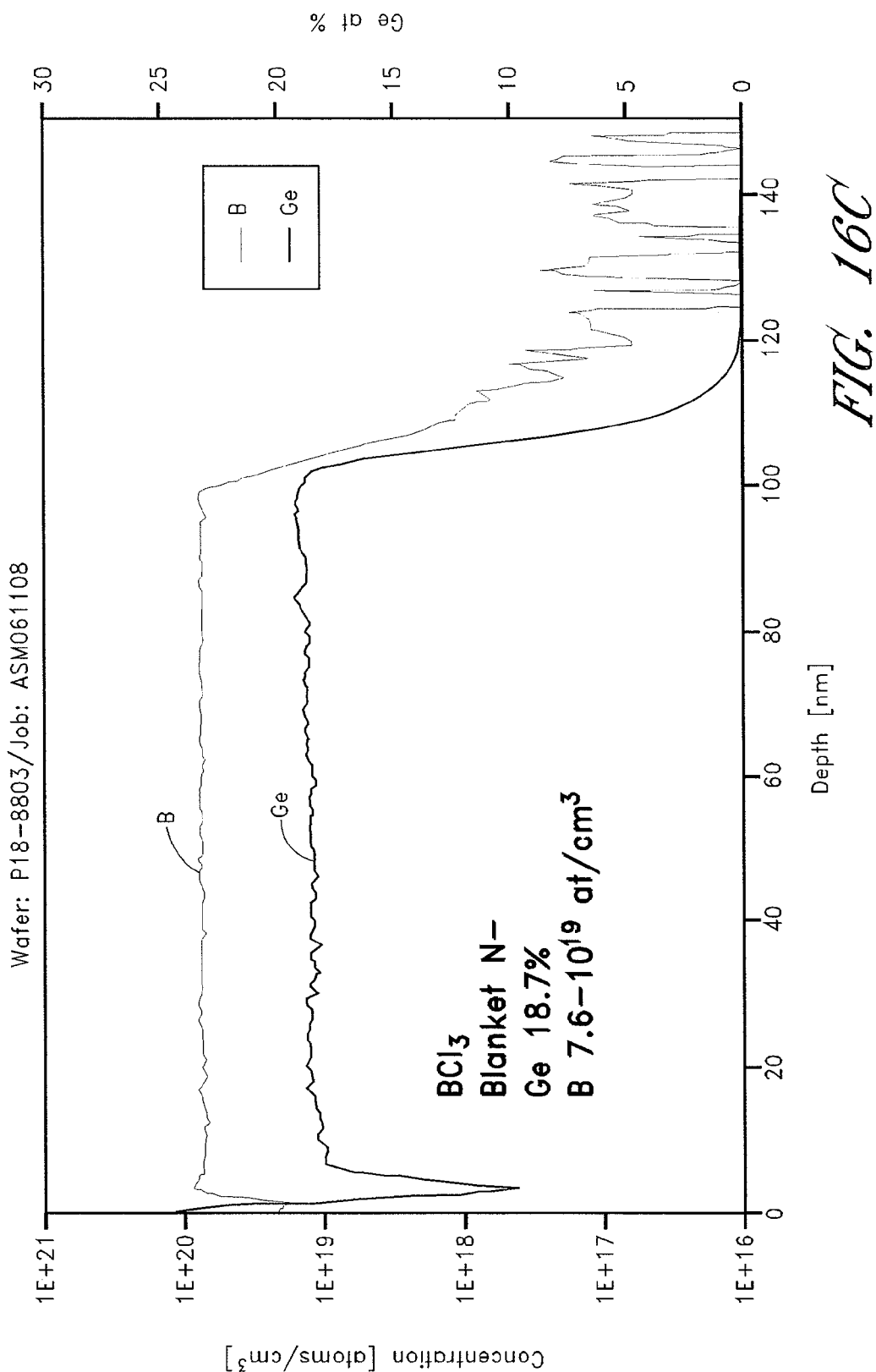
FIG. 16C is a SIMS plot of B and Ge concentrations for a blanket SiGe:B film on a bare silicon wafer formed with $BCl_3$ as a function of wafer depth.
Figure 16D:
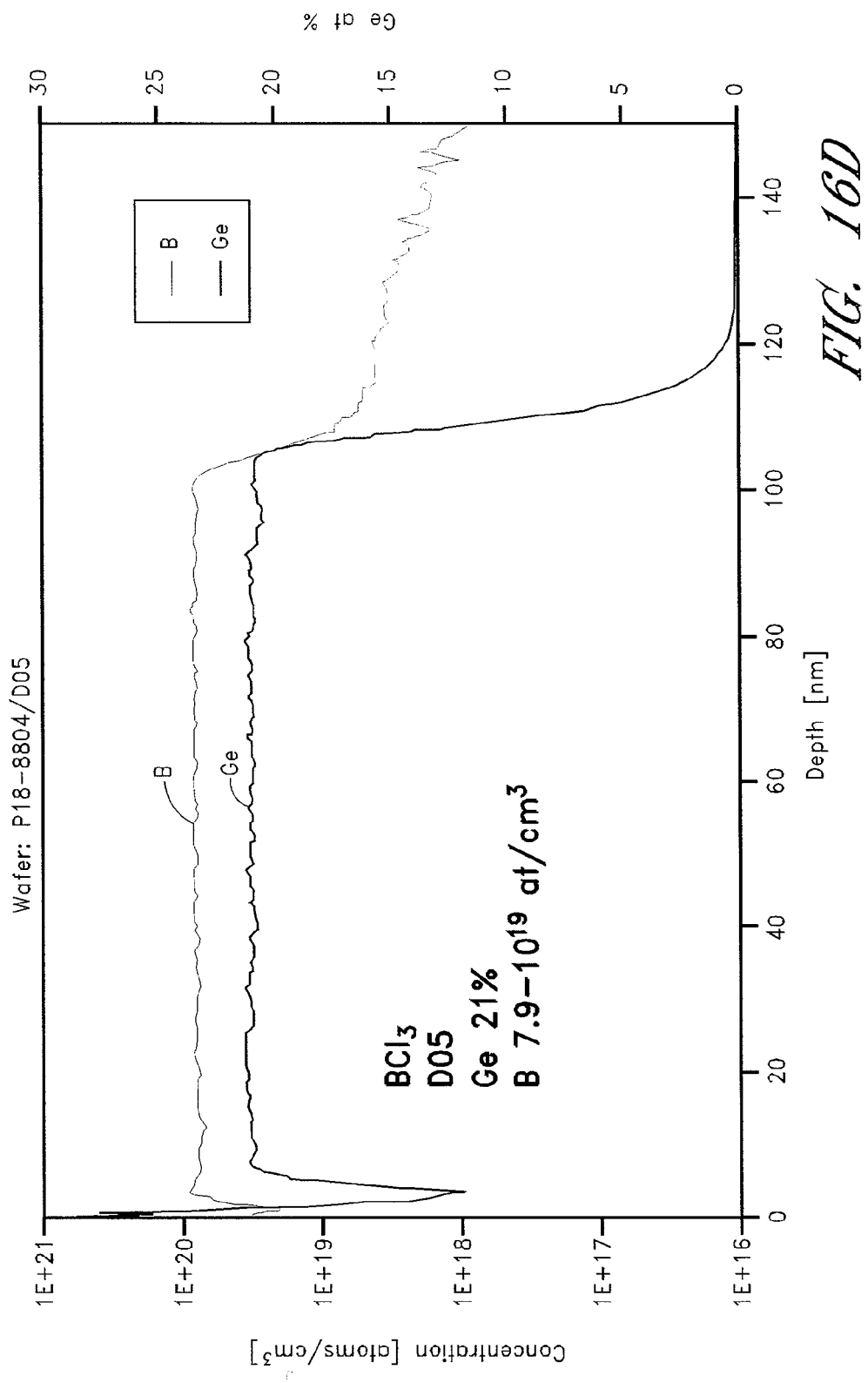
FIG. 16D is a SIMS plot of B and Ge concentrations for an SiGe:B film formed with $BCl_3$ on a patterned wafer as a function of depth.

FIGS. 16A-16D are plots of second ion mass spectrometry (SIMS) results comparing the boron concentration as a function of depth for SiGe:B blanket films on bare silicon substrates and films selectively deposited on mixed substrates with the same process conditions. Although the same process conditions from blanket film deposition on bare silicon substrates noted above with respect to FIGS. 15A-15D were used on the mixed substrates, the same boron concentrations were not expected in the mixed substrates. Due to "loading effects," a much higher boron concentration for the mixed substrates was expected for both $B_2H_6$ and $BCl_3$ processes, since the effective area of exposed silicon is much lower. FIG. 16A shows that an SiGe:B blanket film on a bare silicon substrate formed by the $B_2H_6$ process resulted in a boron concentration of $6.8 \times 10^{19}$ at/cm³. FIG. 16B shows that the same $B_2H_6$ recipe on a mixed substrate resulted in a boron concentration of $1.3 \times 10^{20}$ at/cm³. Thus, loading effects were demonstrated for the $B_2H_6$ process from the increase in boron concentration from the SiGe:B blanket film on a bare silicon substrate to the film deposited on the mixed substrate. FIG. 16C shows that an SiGe:B blanket film on a bare silicon substrate formed with the $BCl_3$ process resulted in a boron concentration of $7.6 \times 10^{19}$ at/cm³. However, FIG. 16D shows that the same $BCl_3$ recipe on a mixed substrate resulted in a boron content of only $7.9 \times 10^{19}$ at/cm³. Since the change in boron concentration from the bare wafer to mixed substrate was not significant, surprisingly, loading effects were not demonstrated for the $BCl_3$-deposited film under SIMS analysis, although expected.

Figure 17A:
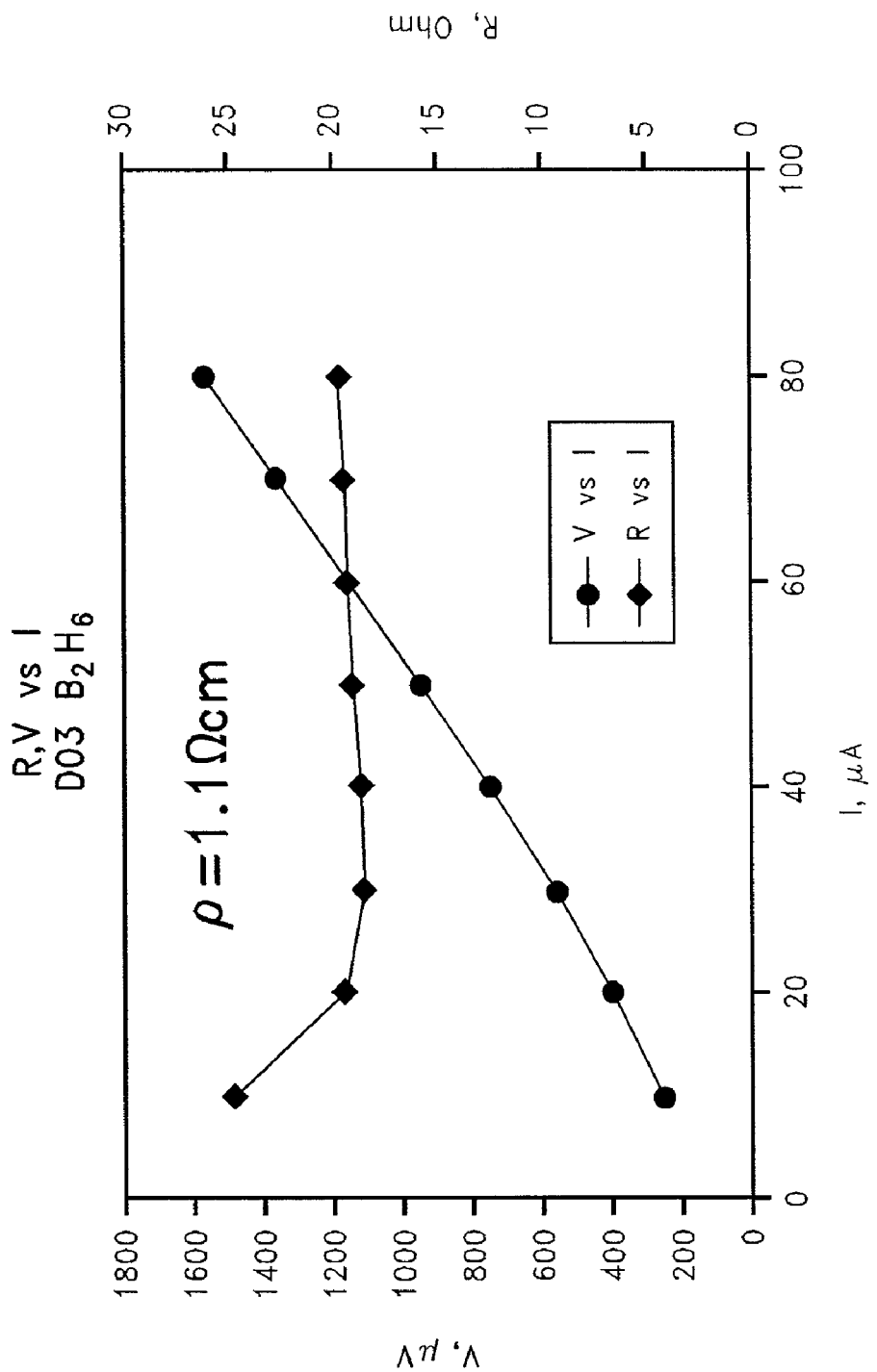
FIG. 17A is a plot of the resistivity and voltage against current for an SiGe:B film formed over a patterned substrate with $B_2H_6$.
Figure 17B:
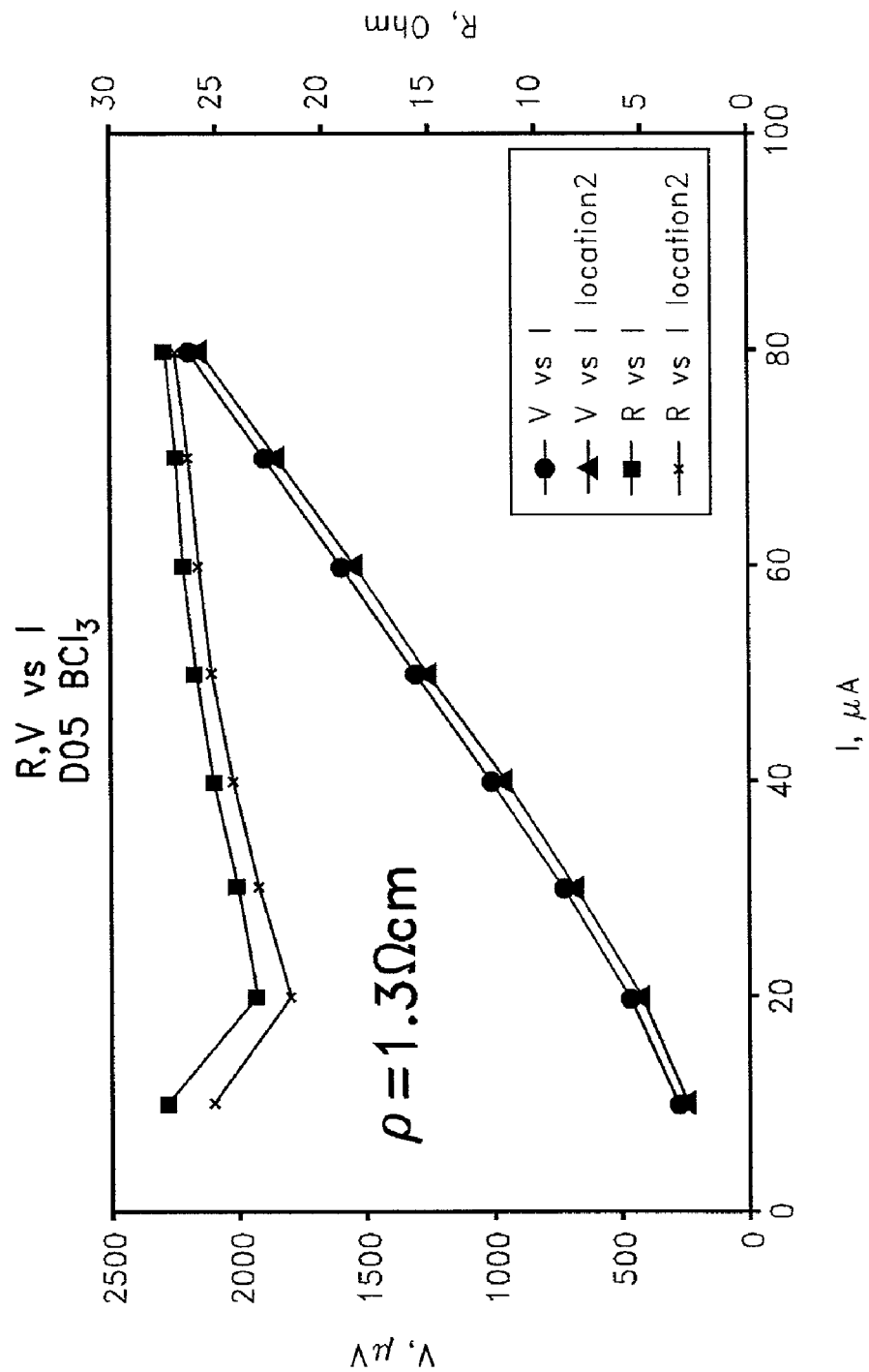
FIG. 17B is a plot of the resistivity and voltage against current for an SiGe:B film formed over a patterned substrate with $BCl_3$.

FIGS. 17A and 17B show the resistance, voltage and current results (R, V vs. I) of Van der Paw tests on the above mixed substrates, deposited with $BCl_3$ and $B_2H_6$, respectively. As shown in FIG. 17A, a resistivity of 1.1 $\Omega$cm was measured for the $B_2H_6$-deposited mixed substrate, which corresponds to a boron concentration of $1.1 \times 10^{20}$ at/cm³. This measured value of boron concentration is similar to the value obtained by the SIMS test on the $B_2H_6$-deposited mixed substrate, $1.3 \times 10^{20}$ at/cm³, as shown in FIG. 16B. FIG. 17B shows that a resistivity of 1.3 $\Omega$cm was measured for the $BCl_3$-deposited mixed substrate, which corresponds to a boron concentration of about $8.9 \times 10^{19}$ at/cm³. This value, in contrast, is larger than the value obtained by SIMS tests for the $BCl_3$-deposited mixed substrate, $7.9 \times 10^{19}$ at/cm³, as shown in FIG. 16D. This increase in measurement of boron concentration is a non-trivial change that suggests that the SIMS test, with its testing window size of 80 μm by 80 μm, is useful for illustrating macro-loading effects, and that the Van der Paw test, with its testing window size of 40 μm by 40 μm, in contrast can determine micro-loading effects. Although the invention is not limited to theory, the unexpected absence of loading effects for the $BCl_3$-deposited film from the SIMS results of FIG. 16D may be explained by the micro-loading effects suggested by the Van der Paw results of FIG. 17B.

Figure 18A:
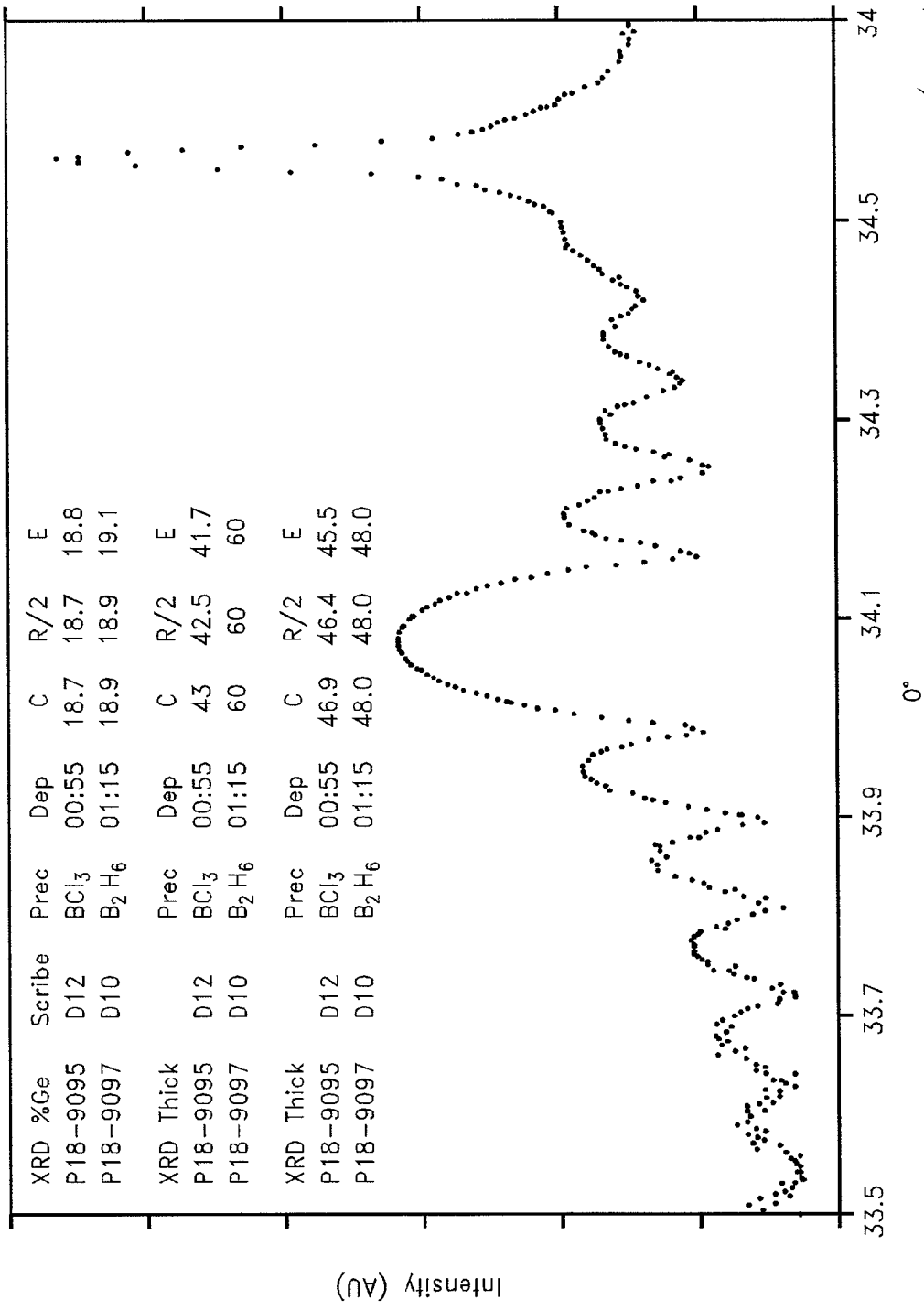
FIG. 18A is an XRD diffractogram for SiGe:B films (having 19 atomic % Ge and $5\times10^{19}$ cm$^{-3}$ of B) formed with $B_2H_6$ and $BCl_3$ on a bare silicon wafer.
Figure 18B:
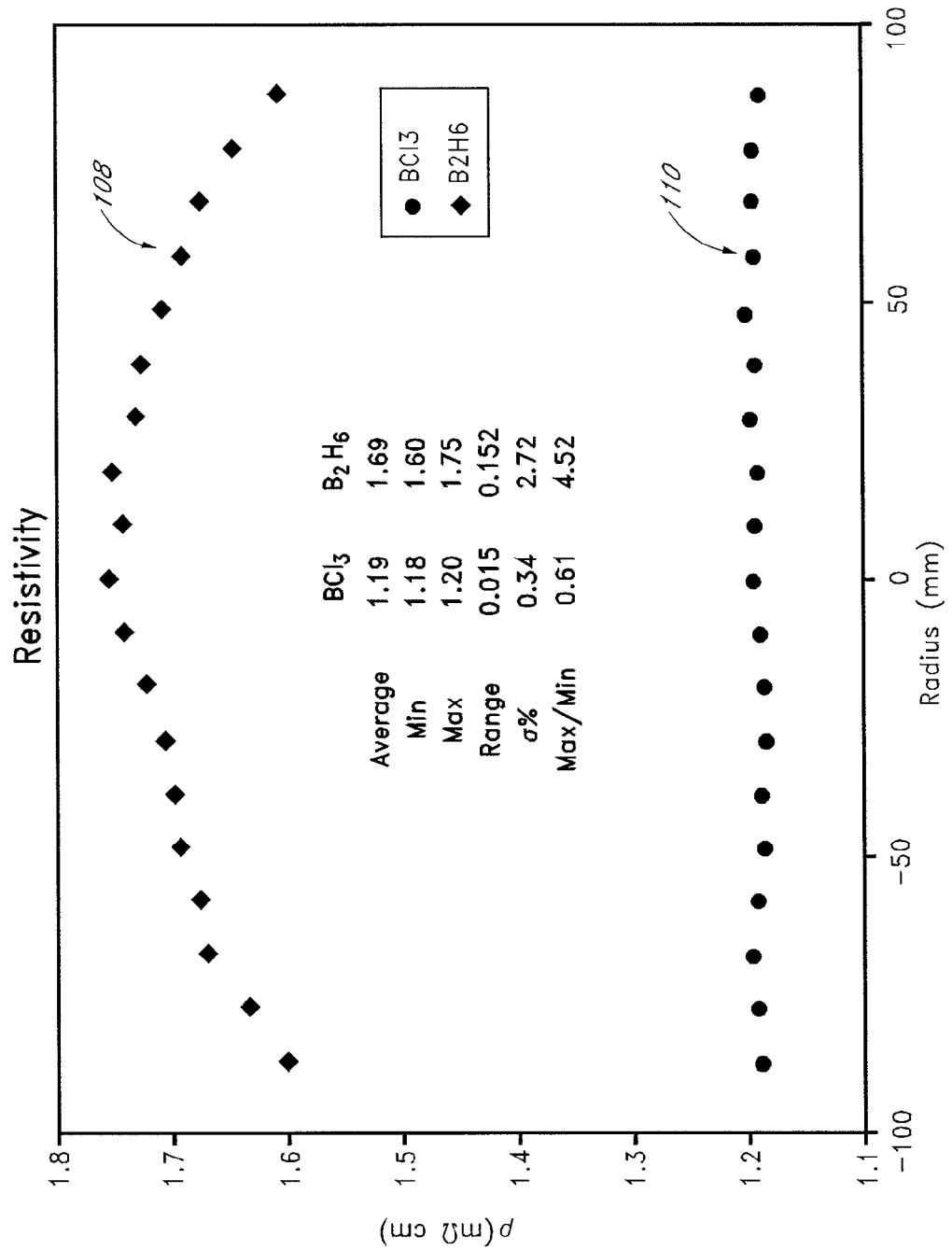
FIG. 18B is a plot of the resistivity as a function of wafer diameter for a blanket film of SiGe:B on a bare silicon wafer formed with $B_2H_6$ and $BCl_3$.

To further evaluate the apparent absence of macro-loading effects indicated by the low boron concentration observed from the SIMS test of the $BCl_3$-deposited mixed substrate, as shown in FIG. 16D, the dopant gas flow rate for the $BCl_3$ process was increased to increase the in situ boron incorporation in the SiGe:B film over the mixed substrate. FIGS. 18-19 compare SiGe:B films deposited on bare silicon substrates and mixed substrates with an increased amount of $BCl_3$ to increase the boron concentration from about $10^{19}$ at/cm$^3$ to $10^{20}$ at/cm$^3$. The $BCl_3$ flow rate was increased from 2.2 sccm to 2.9 sccm, with 1 slm of $H_2$, while the $B_2H_6$ flow rate was kept the same at 0.2 sccm of pure $B_2H_6$ with 50 slm of $H_2$. The same mixed substrates described above with respect to FIG. 15-17 were used. As for the wafers described above, blanket SiGe:B films deposited with $B_2H_6$ and $BCl_3$ were first formed on bare silicon substrates to determine the deposition conditions to achieve the desired boron concentration. FIGS. 18A and 18B show XRD and electrical resistivity plots for the blanket SiGe:B films on bare silicon wafers deposited with the $BCl_3$ and $B_2H_6$ processes, respectively. Since the $BCl_3$ flow rate was increased, but the $B_2H_6$ flow rate kept the same as for the process conditions of FIGS. 15-17, the resistivity of the film deposited with $BCl_3$ was considerably decreased with respect to the film deposited with $B_2H_6$. As shown in line 108 of FIG. 18B, the resistivity for the film deposited with $B_2H_6$ ranged from 1.6 to 1.75 mΩ·cm, and as shown in line 110 the resistivity for the film deposited with $BCl_3$ measured at about 1.2 mΩ·cm. The $BCl_3$ and $B_2H_6$ processes used to form the blanket SiGe:B films of FIGS. 18A-18B were then used to form selective SiGe:B films on mixed substrates.

Figure 19A:
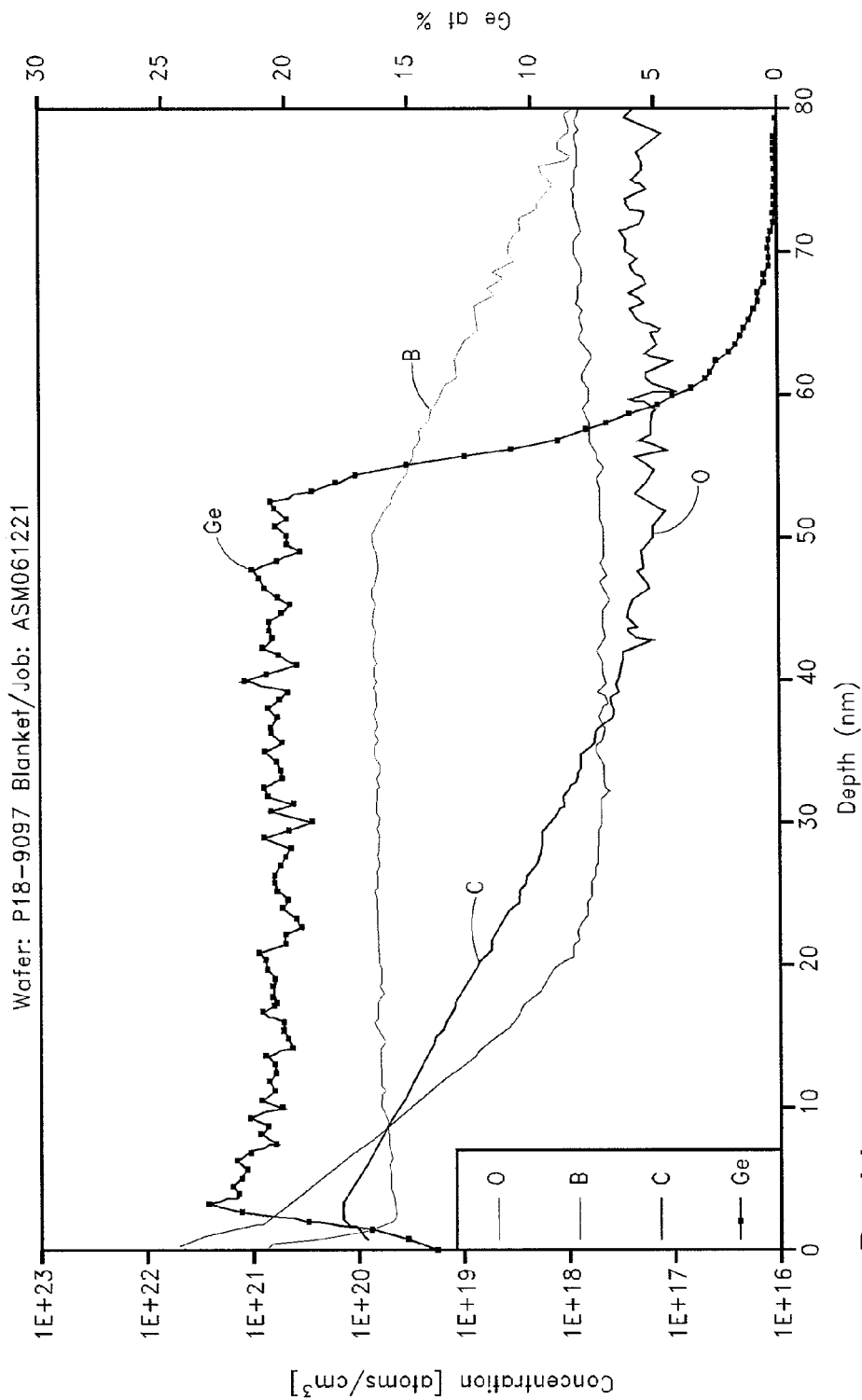
FIG. 19A is a SIMS plot of B and Ge concentrations for a blanket SiGe:B film on a bare silicon wafer formed with $B_2H_6$ as a function of depth.
Figure 19B:
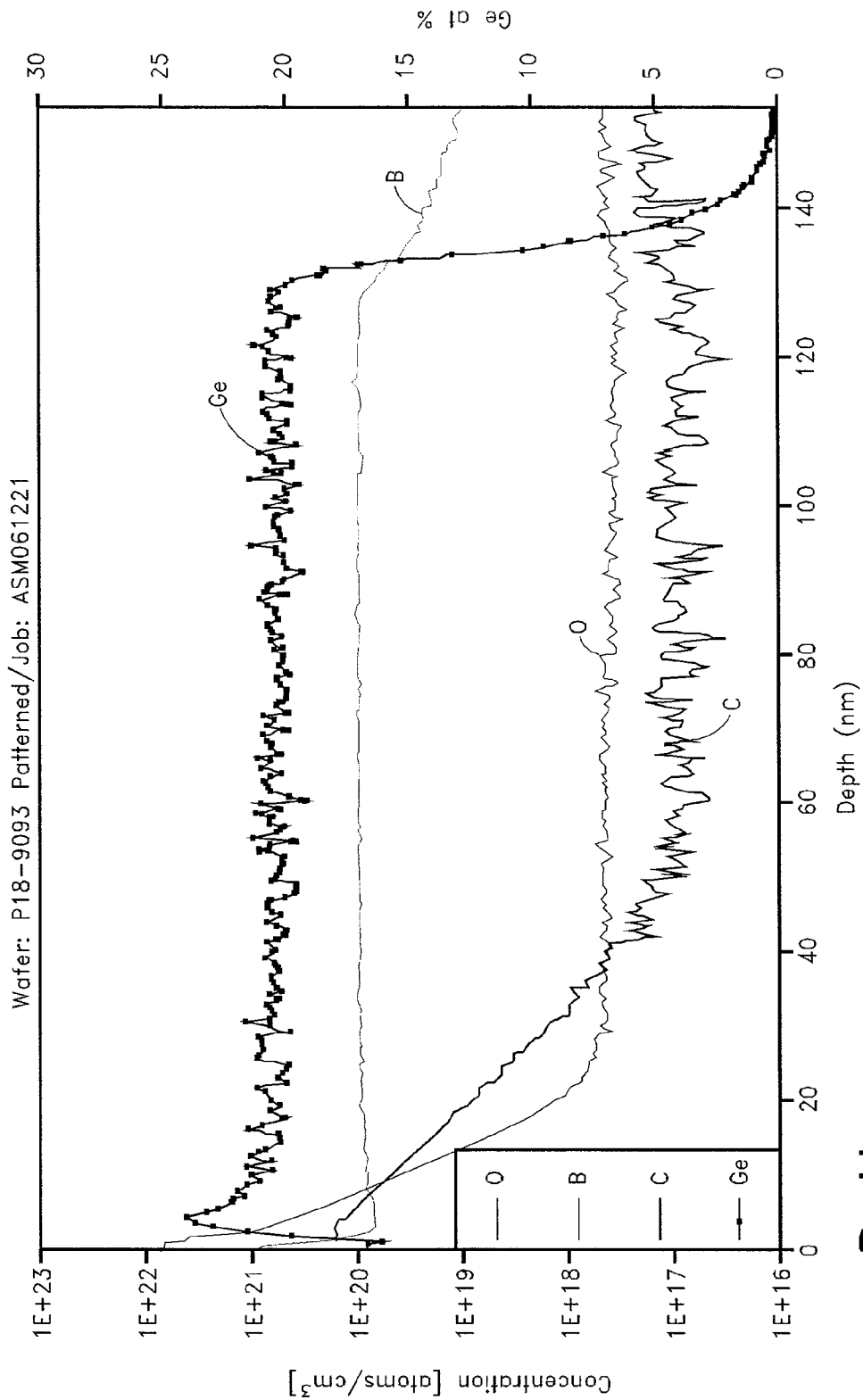
FIG. 19B is a SIMS plot of B and Ge concentrations for an SiGe:B film formed with $B_2H_6$ on a patterned wafer as a function of depth.
Figure 19C:
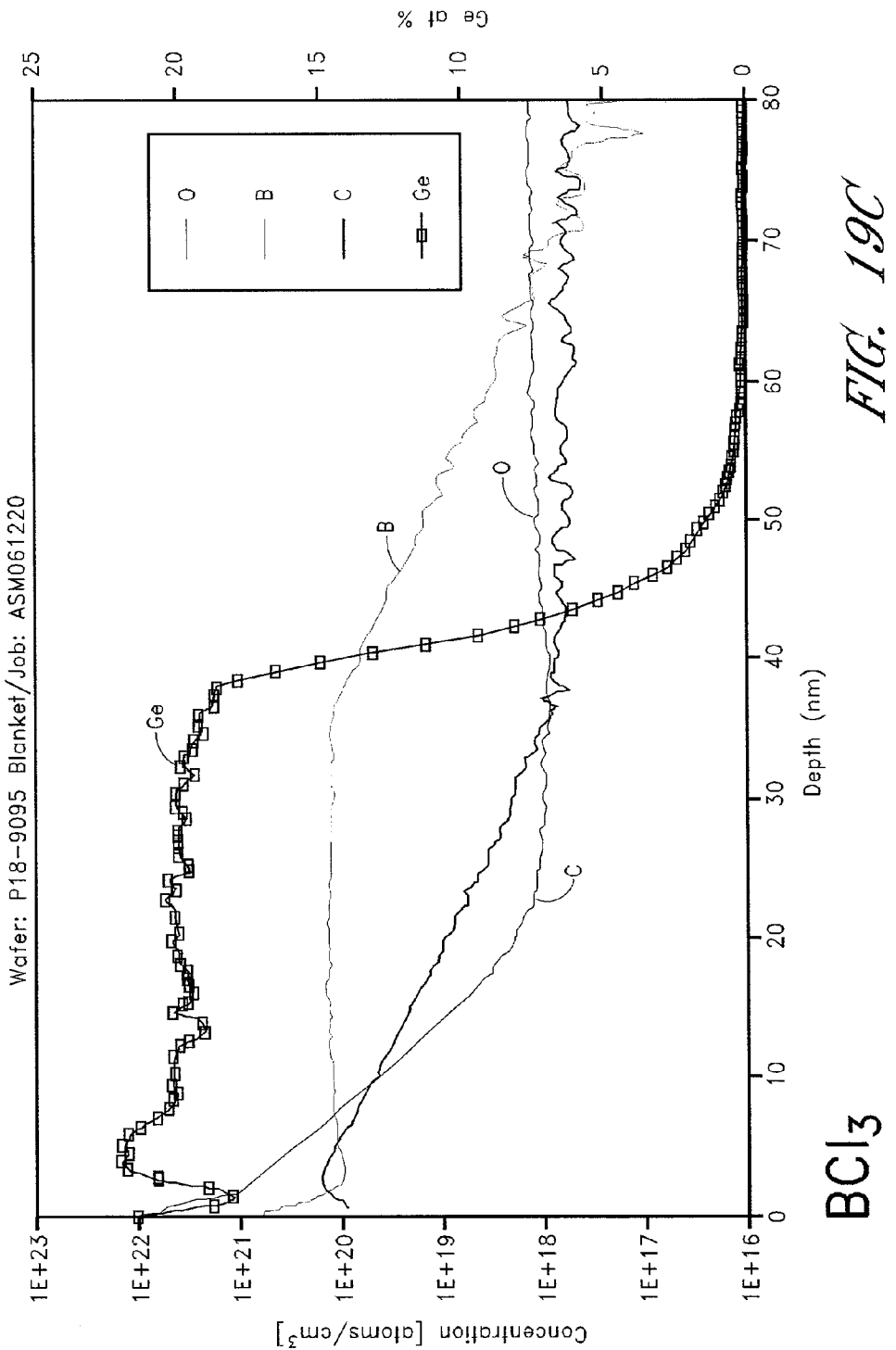
FIG. 19C is a SIMS plot of B and Ge concentrations for a blanket SiGe:B film on a bare silicon wafer formed with $BCl_3$ as a function of wafer depth.
Figure 19D:
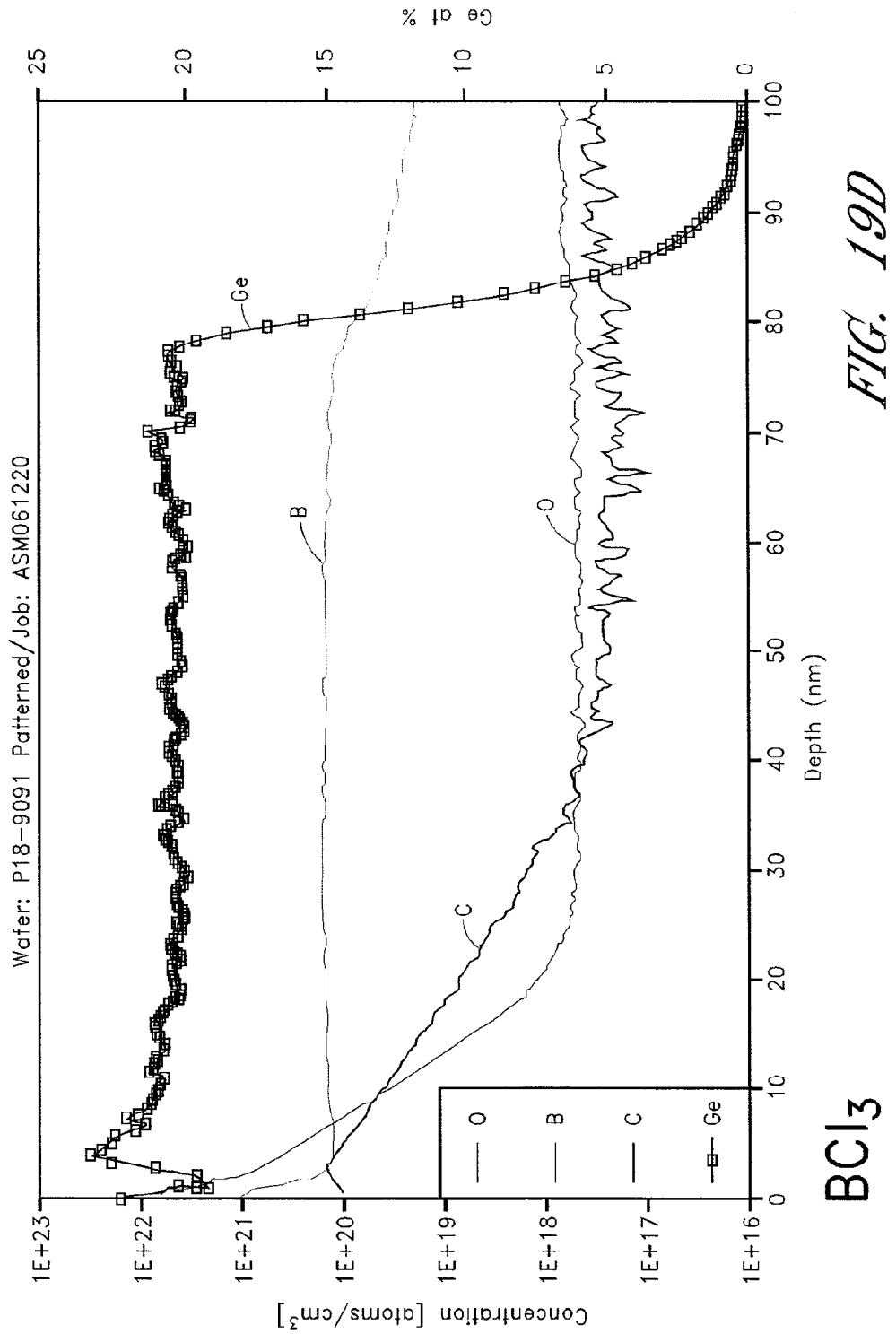
FIG. 19D is a SIMS plot of B and Ge concentrations for an SiGe:B film formed with $BCl_3$ on a patterned wafer as a function of depth.

FIGS. 19A-19B are SIMS plots comparing the boron concentration as a function of depth for the SiGe:B films deposited with $B_2H_6$ on the bare silicon wafer and on the mixed substrate, respectively. FIGS. 19C-19D are SIMS plots that compare corresponding results for the films deposited with the increased flow rate of $BCl_3$ on the bare silicon wafer and on the mixed substrate. FIG. 19A shows that the $B_2H_6$ process resulted in a boron concentration of $6\times10^{19}$ at/cm$^3$ for the blanket SiGe:B film. FIG. 19B shows that the same $B_2H_6$ process on the mixed substrate resulted in an increased boron concentration of $9.5\times10^{19}$ at/cm$^3$. Thus, loading effects were observed again for the $B_2H_6$-deposited film on the mixed substrate. FIG. 19C shows that the above $BCl_3$ process resulted in a boron concentration of $1.2\times10^{20}$ at/cm$^3$ for the blanket SiGe:B film. FIG. 19D shows that same $BCl_3$ process on a patterned wafer resulted in a boron concentration of $1.7\times10^{20}$ at/cm$^3$. Thus, macro-loading effects were also observed for the $BCl_3$-deposited film on the mixed substrate. Accordingly, while macro-loading effects were not observed for the $BCl_3$ process yielding an in situ boron concentration of $10^{19}$ at/cm$^3$, they were observed after the boron concentration was increased to $10^{20}$ at/cm$^3$. However, as indicated by the results, the percent increase in loading effects was minimized for the $BCl_3$ process compared to the $B_2H_6$ process.

Figure 20:
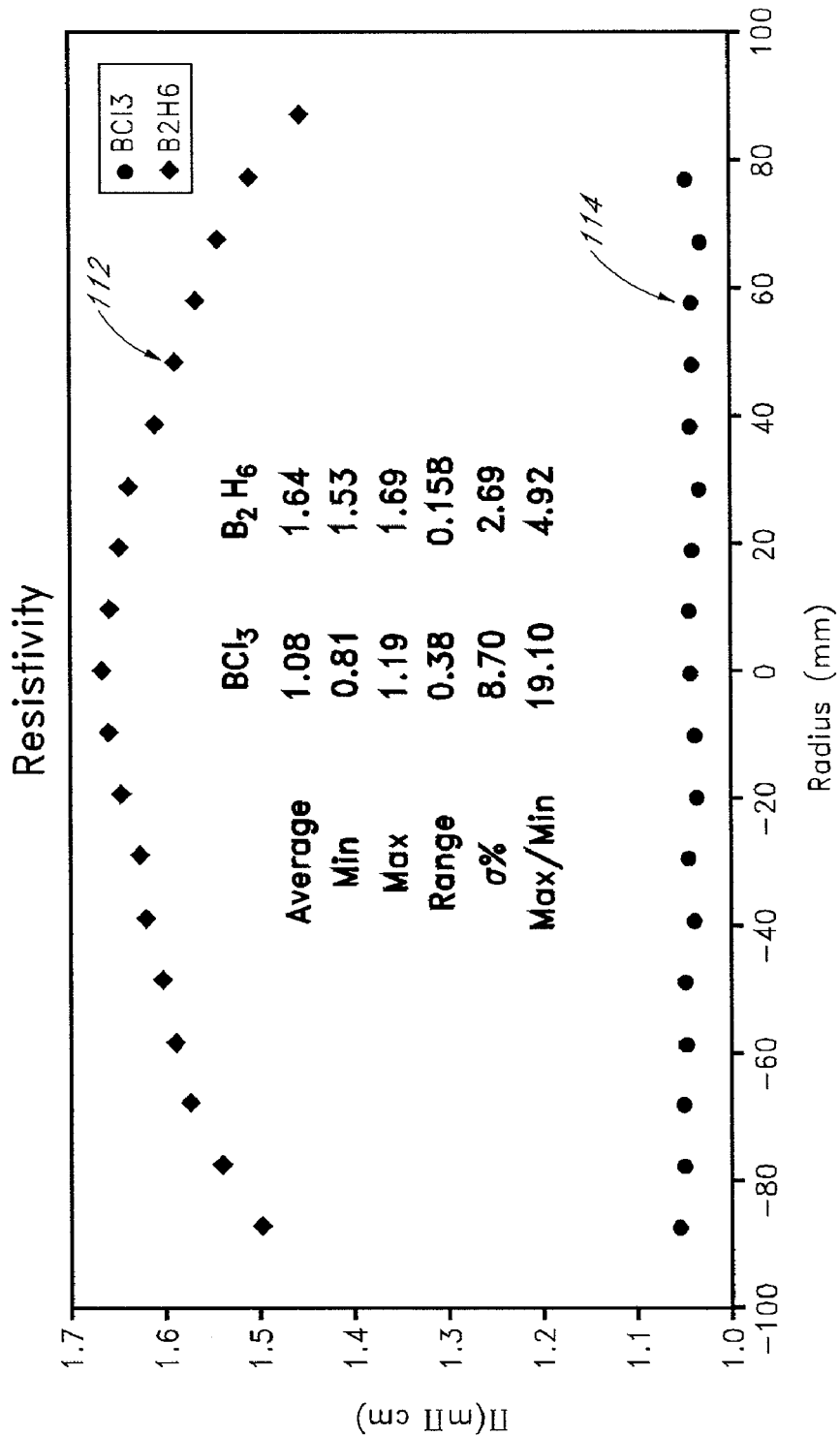
FIG. 20 is a plot of the resistivity as a function of wafer diameter a blanket SiGe:B films on bare silicon wafers formed with $B_2H_6$ and $BCl_3$, for the same process conditions as for FIG. 18A except with a decreased HCl flow rate.

Since $BCl_3$ was shown to enhance selectivity, by requiring less HCl to clear a dielectric surface of deposits, the HCl flow rate was decreased. In particular, SiGe:B films were deposited on bare silicon and mixed substrates with the higher flow rate of $BCl_3$ and a lower flow rate of HCl. The $B_2H_6$ flow rate was kept the same at 0.2 sccm of pure $B_2H_6$ with 50 slm of $H_2$, and the $BCl_3$ flow rate was kept the same as for the conditions of FIGS. 18-19, at 2.9 sccm with 1 slm of $H_2$. FIG. 20 is a plot of the resistivity as a function of radius for the resulting blanket films on bare silicon substrates deposited with both $B_2H_6$ and $BCl_3$ processes. As shown in line 112, the resistivity for the film deposited with $B_2H_6$ ranged between 1.4 to 1.6 mΩ·cm, which corresponds to an activated boron concentration of about $1.1\times10^{20}$ at/cm$^3$. As shown in line 114 the resistivity for the film deposited with $BCl_3$ ranged between 1 and 1.1 mΩ·cm, which corresponds to an activated boron concentration of about $8.6\times10^{19}$ at/cm$^3$. These deposition conditions were used to deposit SiGe:B films on patterned wafers with the decreased HCl amount of 75 sccm.

Figure 21A:
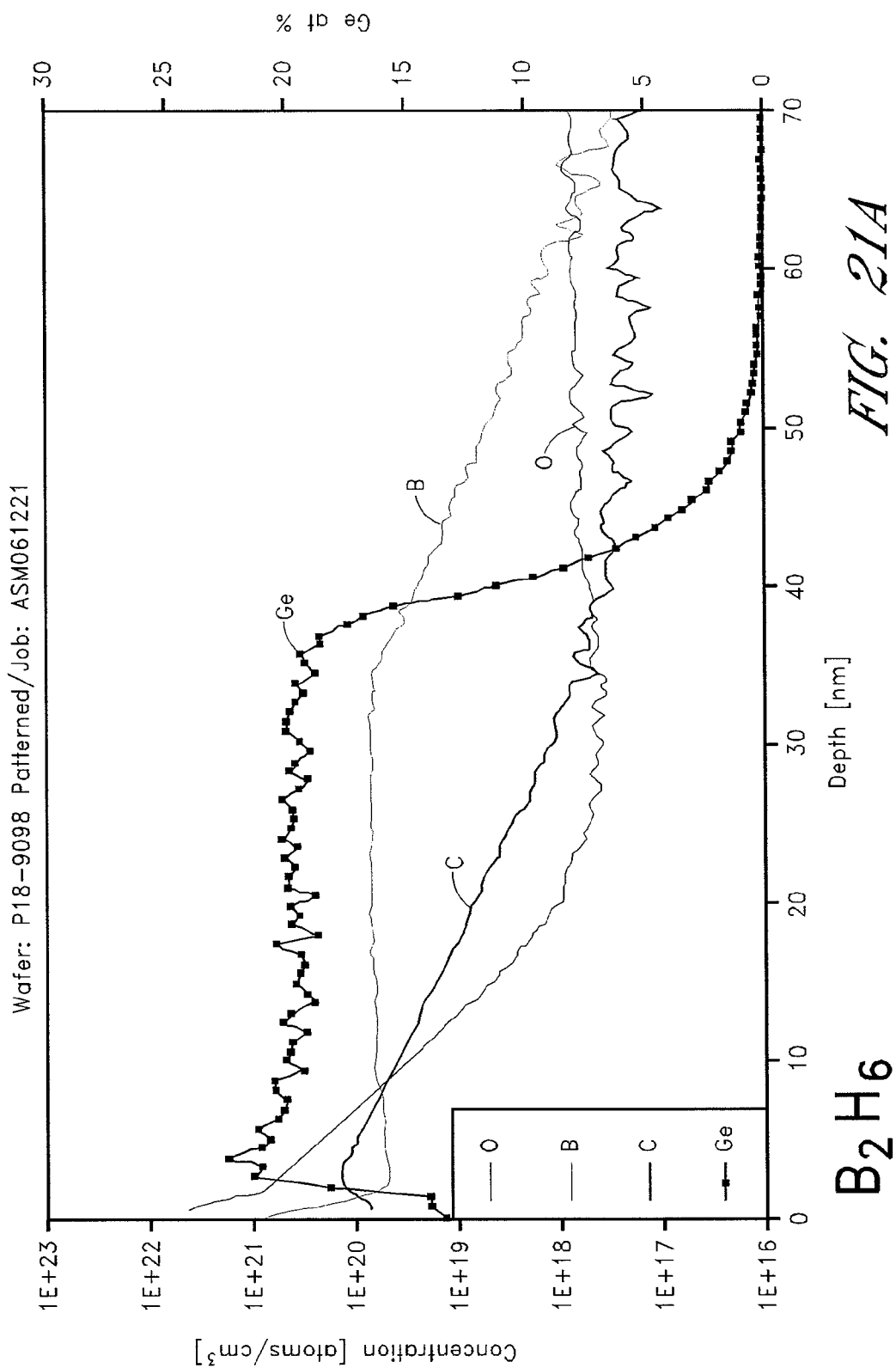
FIG. 21A is a SIMS plot of B and Ge concentrations for a blanket SiGe:B film on a bare silicon wafer formed with $B_2H_6$ as a function of depth.
Figure 21B:
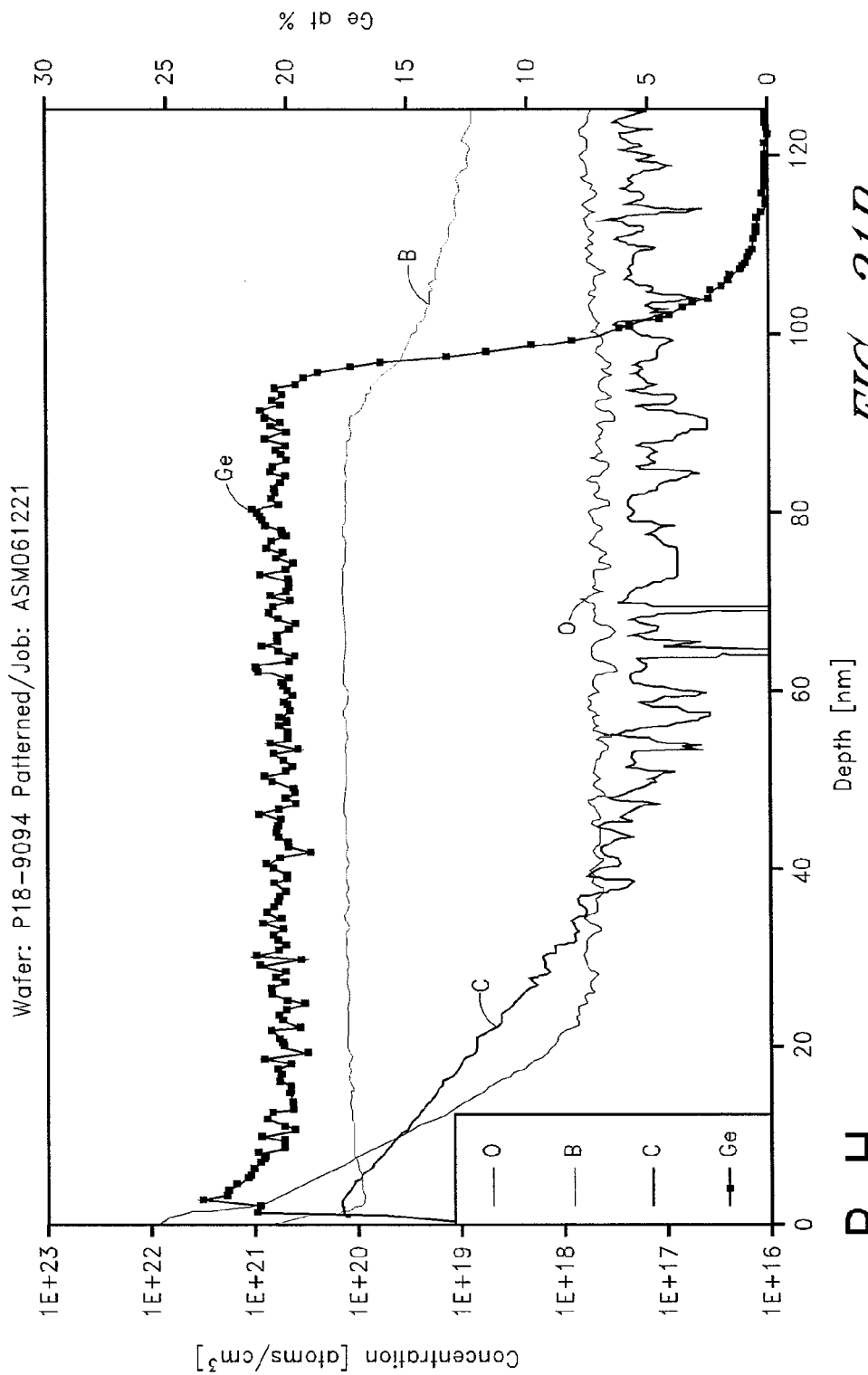
FIG. 21B is a SIMS plot of B and Ge concentrations for an SiGe:B film formed with $B_2H_6$ on a patterned wafer as a function of depth.
Figure 21C:
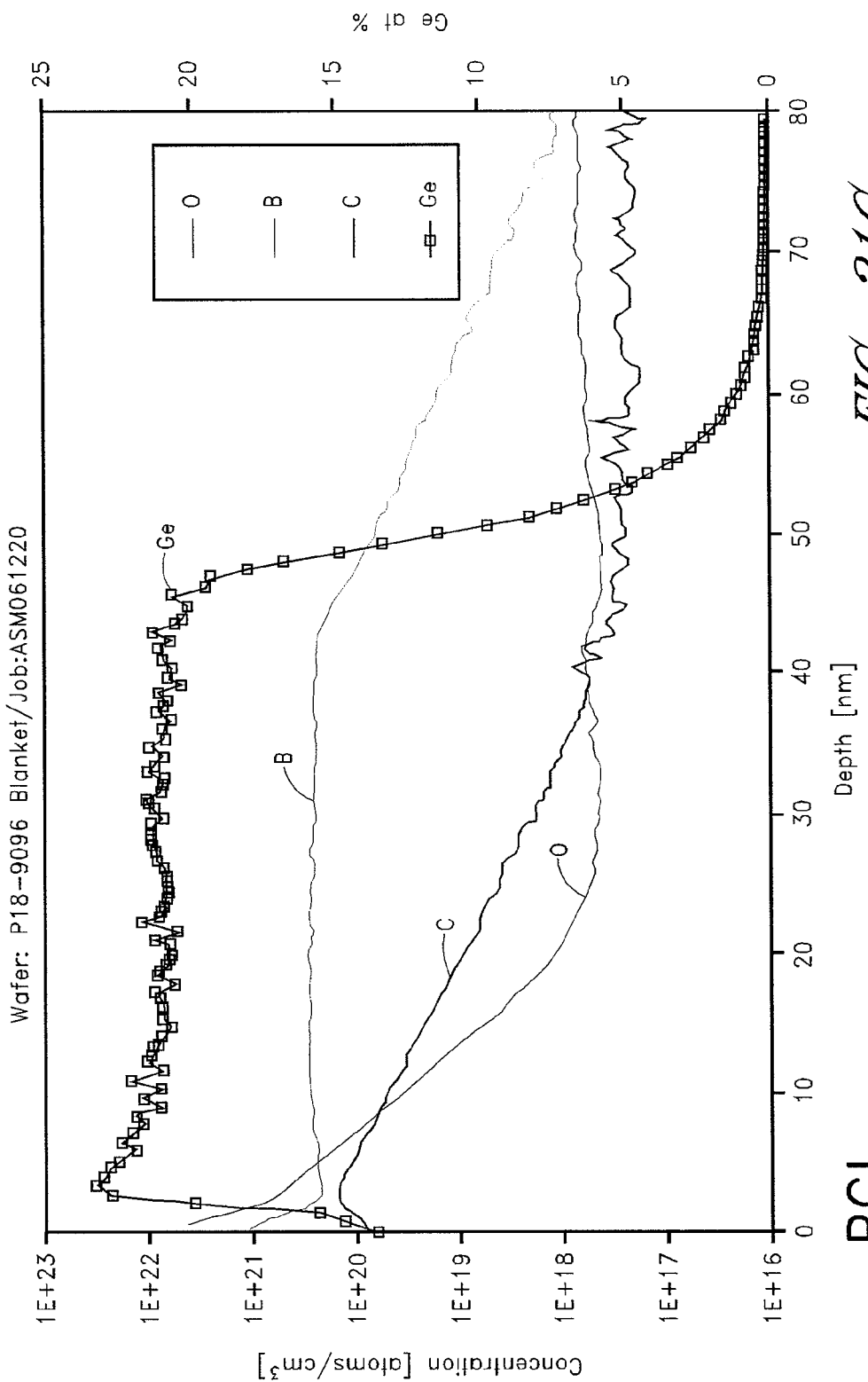
FIG. 21C is a SIMS plot of B and Ge concentrations for a blanket SiGe:B film on a bare silicon wafer formed with $BCl_3$ as a function of wafer depth.
Figure 21D:
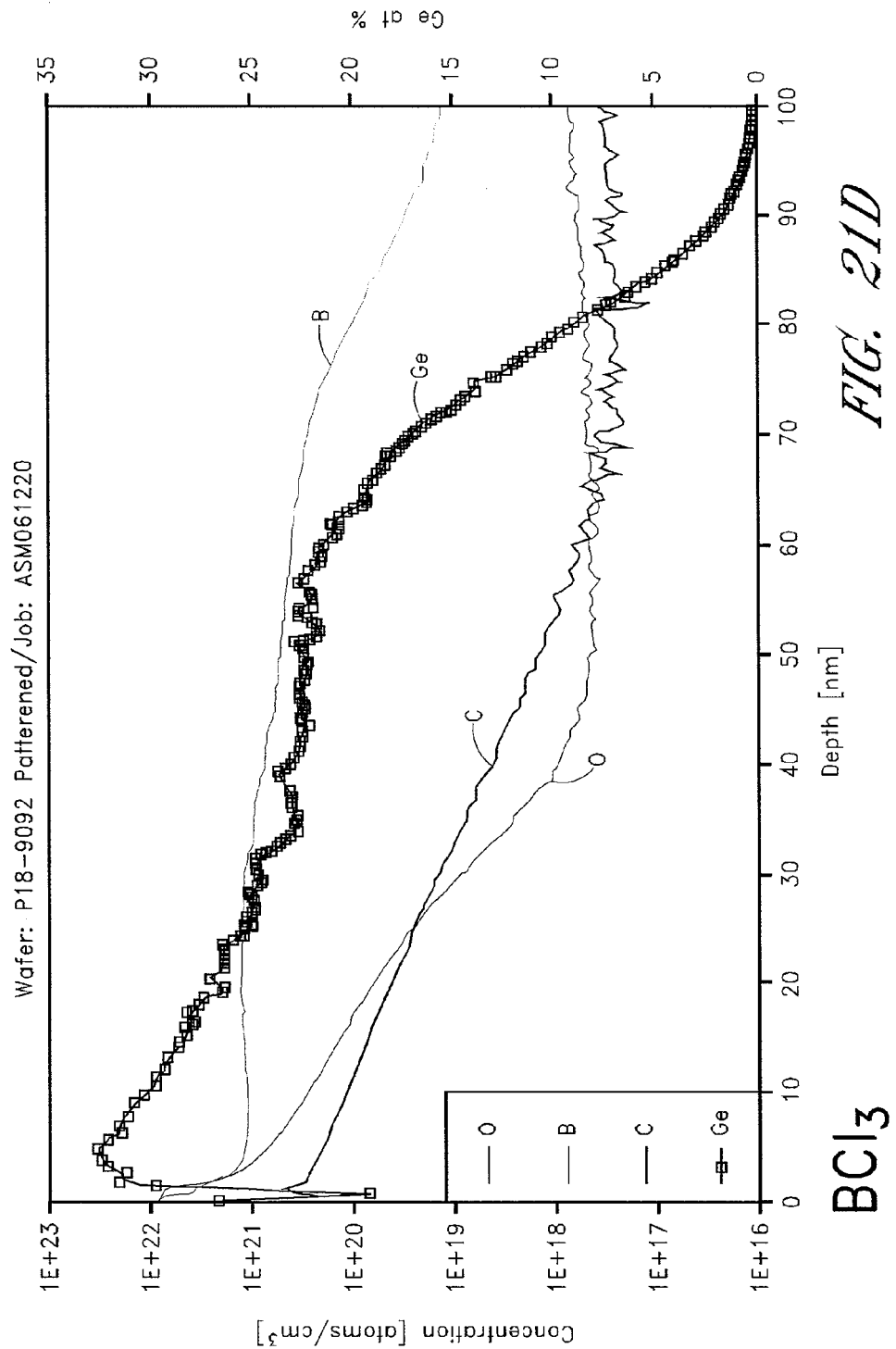
FIG. 21D is a SIMS plot of B and Ge concentrations for an SiGe:B film formed with $BCl_3$ on a patterned wafer as a function of depth.
Figure 22A:
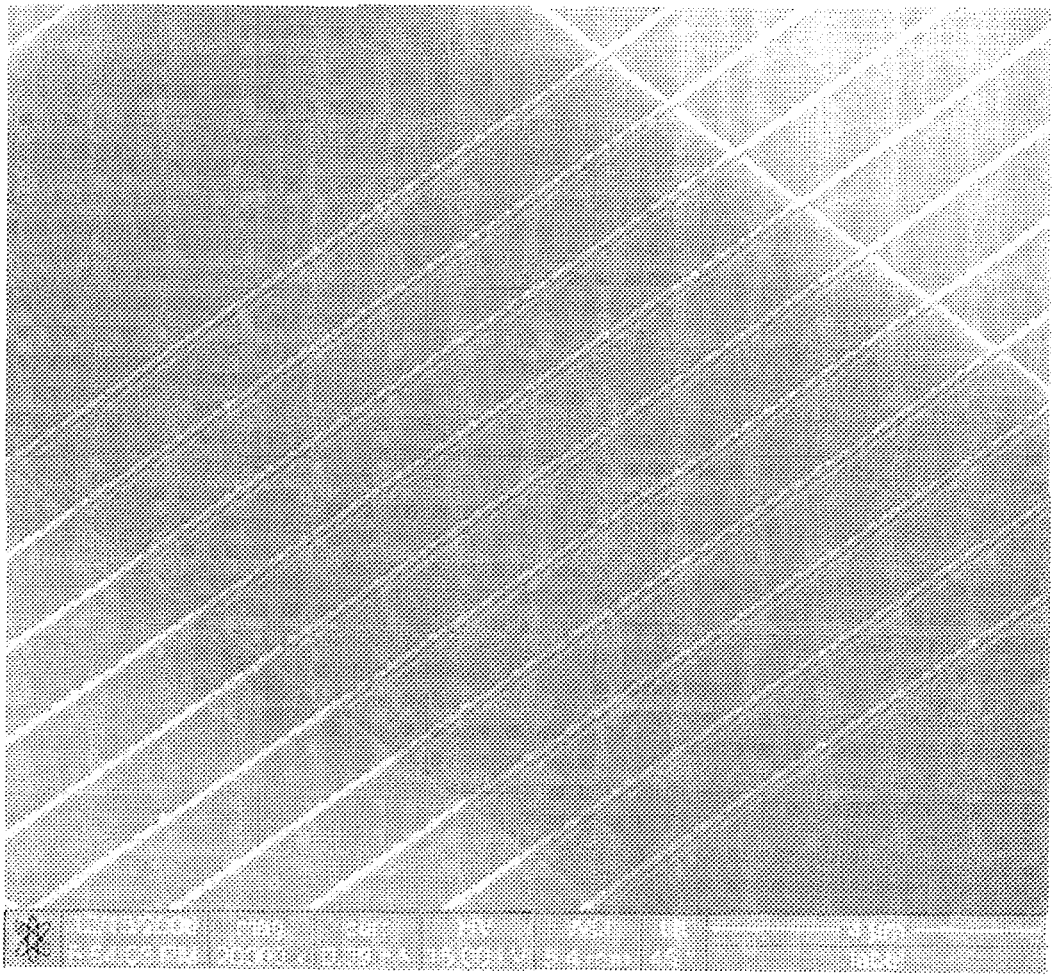
FIGS. 22A-22D are SEM micrographs of the SiGe:B films on the patterned wafers formed by the $B_2H_6$ process with a boron concentration of about $10^{20}$ at/cm$^3$ and HCl flow of 95 sccm.
Figure 22B:
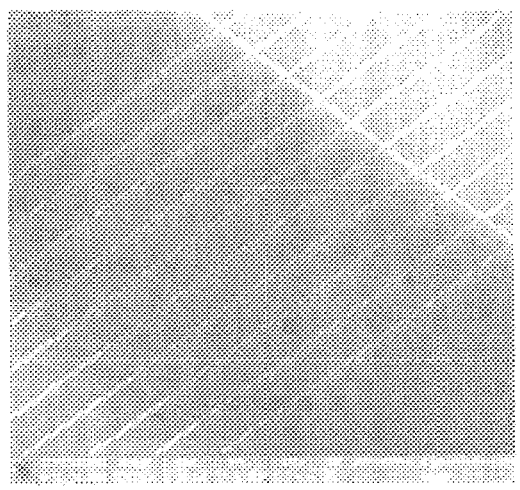
Figure 22C:
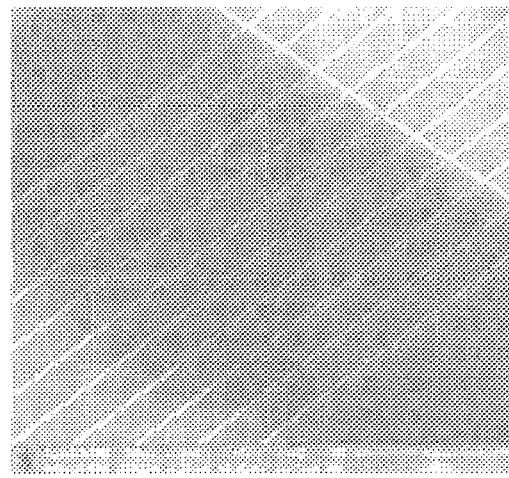
Figure 22D:
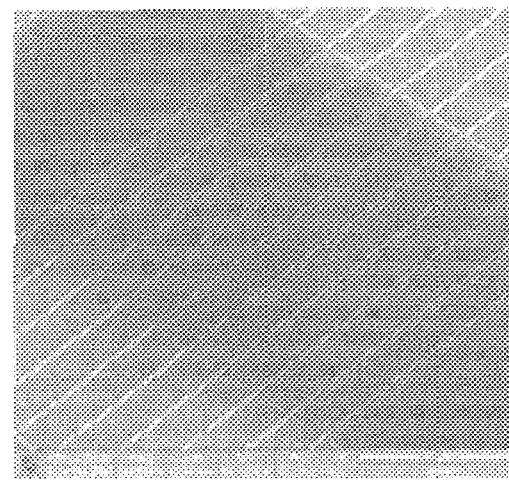

FIGS. 21A-21B are plots of boron concentration as a function of depth (by SIMS) comparing the $B_2H_6$-deposited film on the bare silicon substrate and on the mixed substrate. FIGS. 21C-21D are corresponding results for the $BCl_3$-deposited film on the bare silicon wafer and on the mixed substrate. FIG. 21A shows that the above $B_2H_6$ process resulted in a boron concentration of $8\times10^{19}$ at/cm$^3$ for the blanket SiGe:B film. FIG. 21B shows that the same $B_2H_6$ process on a mixed substrate resulted in a boron concentration of $1.3\times10^{20}$ at/cm$^3$. Thus, some loading effects were observed for the $B_2H_6$-deposited film. FIG. 21C shows that the above $BCl_3$ process resulted in a boron concentration of $2.8\times10^{20}$ at/cm$^3$ for the SiGe:B blanket film on the bare silicon substrate. FIG. 21D shows that the same $BCl_3$ process on a substrate resulted in a boron concentration of $5.12\times10^{20}$ at/cm$^3$, which indicates considerable loading effects. These results suggest that decreasing the HCl content increases the loading effects on mixed substrates, for both $B_2H_6$ and $BCl_3$ and the processes. Possible reasons for the considerable increase in boron concentration for the $BCl_3$ process are discussed below with respect to SEM observations.

FIGS. 22-24 are SEM micrographs showing the surface of the above SiGe:B films on the mixed substrates. FIGS. 22A-22C and 23A-23C are SEM micrographs of the center of three different dies, and FIGS. 22D and 23D show the edge of a fourth die. FIGS. 22A-22D are SEM micrographs of the SiGe:B film deposited with 2.2 sccm of $B_2H_6$ and the lower HCl flow rate of 75 sccm, corresponding with the results of FIGS. 21A-21B. FIG. 23A-23D are SEM micrographs for the SiGe:B film deposited with 2.9 sccm of $BCl_3$ with the lower HCl flow rate of 75 sccm, which resulted in the significantly high boron concentration of $5.12\times10^{20}$ at/cm$^3$ as indicated by FIG. 21D. In comparing FIGS. 22A-22D to FIGS. 23A-23D, the decrease in HCl flow rate appears to have caused significant effects in surface roughness for the $BCl_3$ process. While not limited by theory, the lower HCl amount appeared to have enhanced the loading effects for the $BCl_3$ process on patterned wafers and increased the boron concentration. This increased boron concentration may have led to surface poisoning, and the roughness is shown in FIGS. 23A-23D. Additional SEM observations (not shown) made for SiGe:B films on patterned wafers with the same $BCl_3$ flow rate of 2.9 sccm, but a higher HCl flow rate of 95 sccm, have shown that the surface was not rough with increased HCl flow. Accordingly, the results suggest that the loading effects of boron for the $BCl_3$ process and possible surface poisoning effects caused by excess incorporated boron may be tuned by adjusting the HCl amount.

Figure 24B:
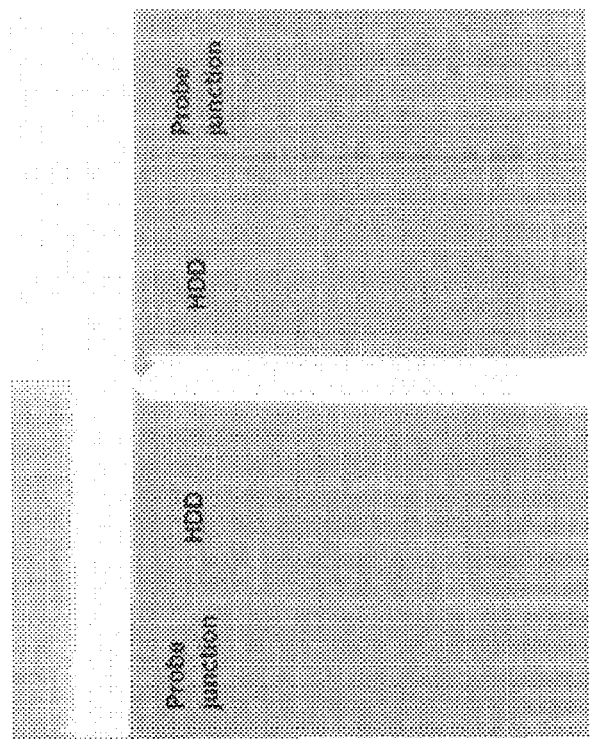
FIGS. 24A-24B show a top optical microscope view of the patterned wafer including the probe junction area for SiGe:B formed with $B_2H_6$.
Figure 24A:
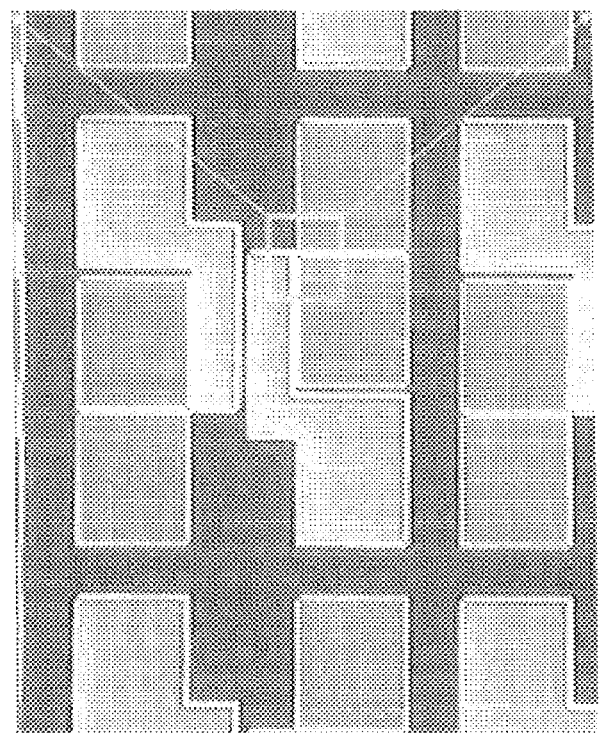
Figure 24D:
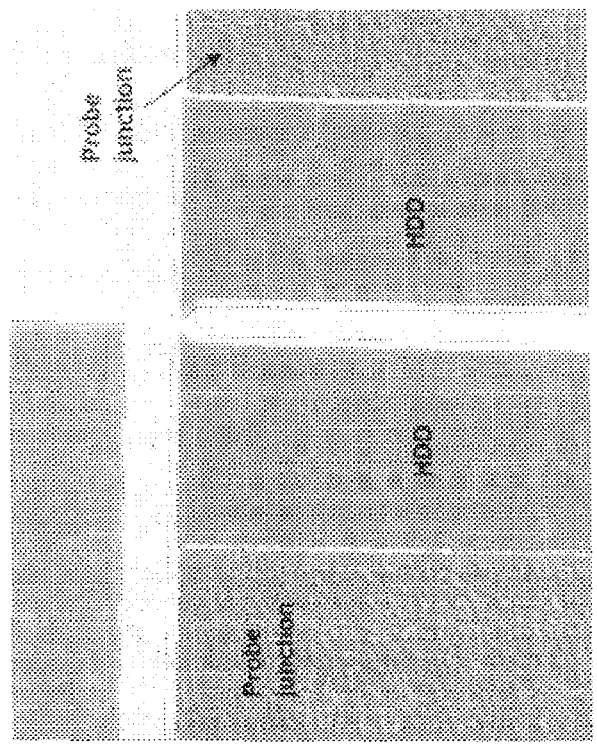
FIG. 24C-24D show a top optical microscope view of the patterned wafer including the probe junction area for SiGe:B formed with $BCl_3$.
Figure 24C:
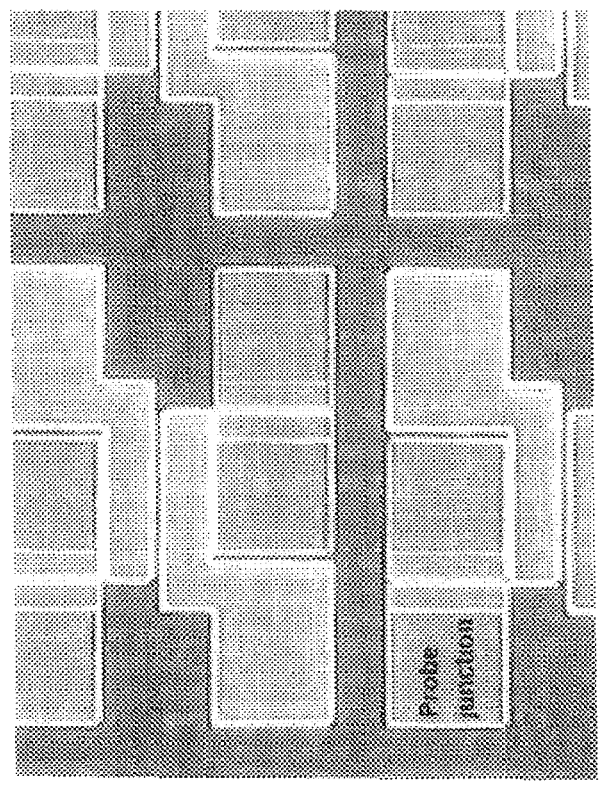
Figure 25A:
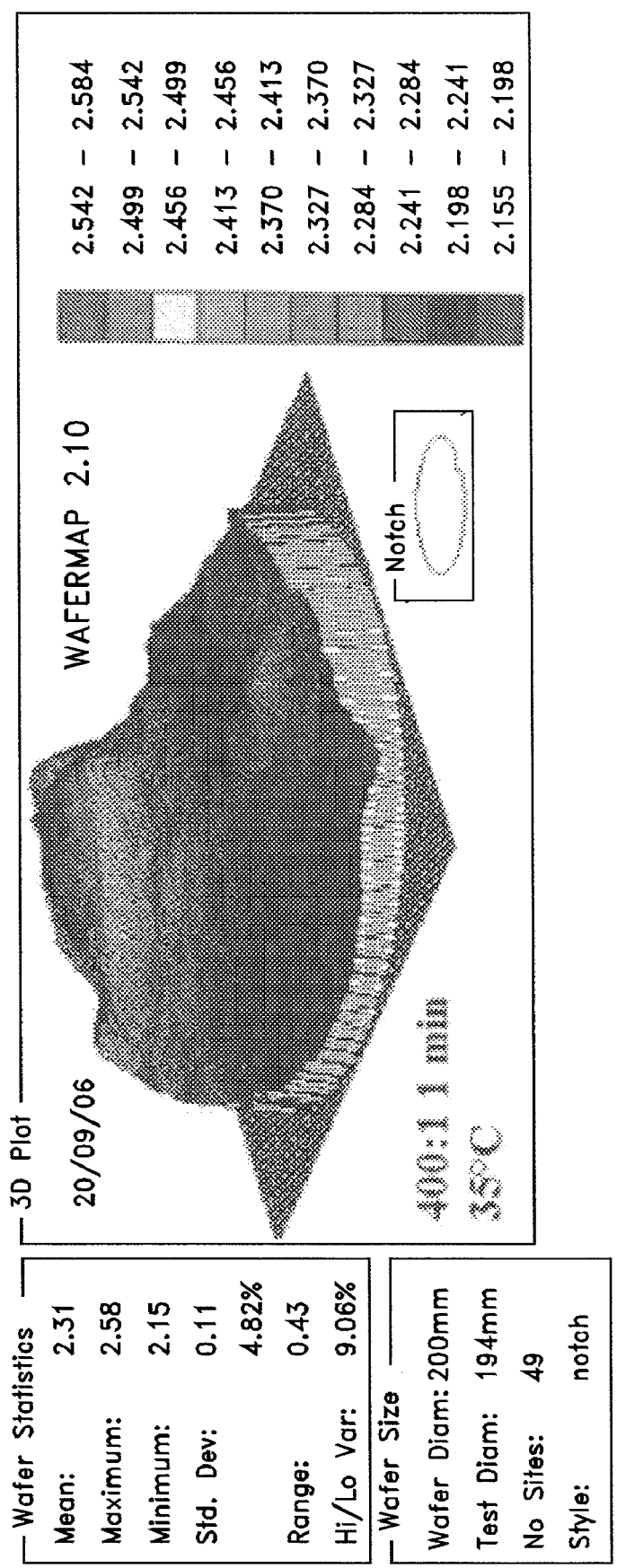
FIG. 25A is a 3D plot of the initial topography of the patterned wafer after a HCl pre-clean step.
Figure 25B:
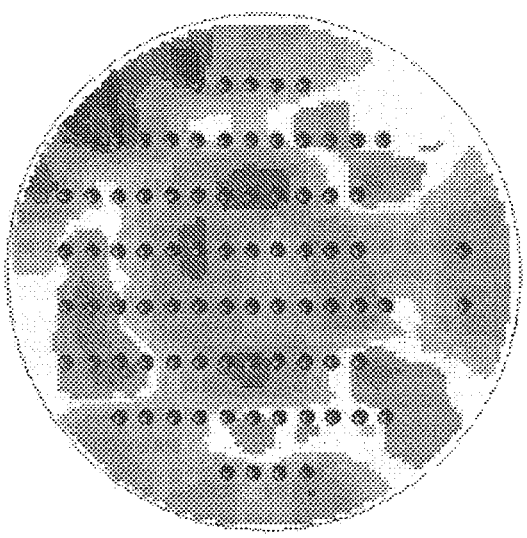
FIGS. 25B and 25C are 3D plots of the topography of the wafer with a target of 80 nm film of SiGe:B and $10^{20}$ at/cm$^3$ of boron formed with $B_2H_6$ and 2.2 sccm of $BCl_3$, respectively.
Figure 25B:
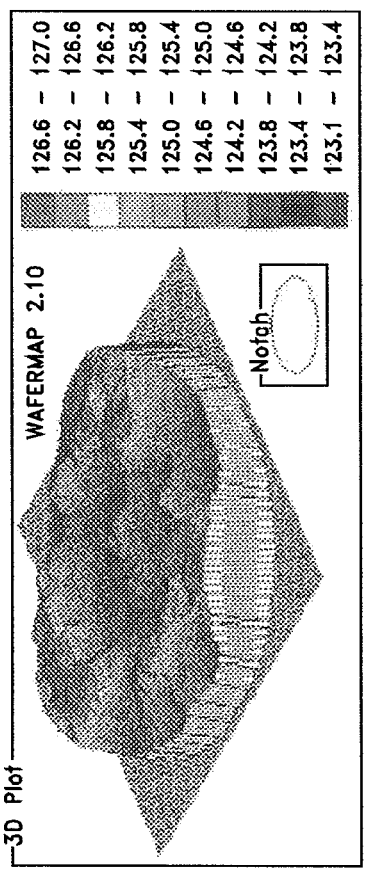
Figure 25C:
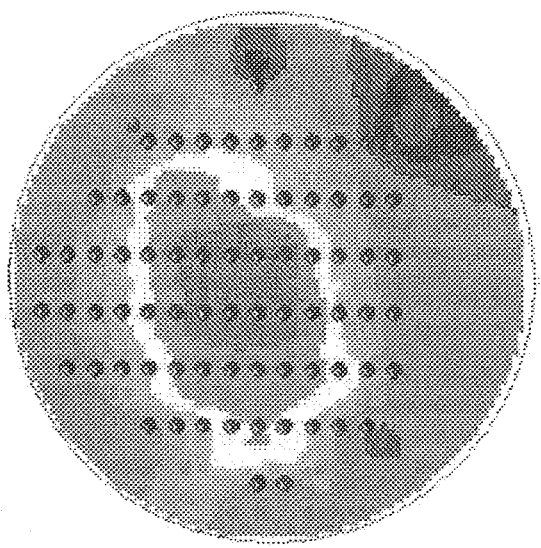
Figure 25C:
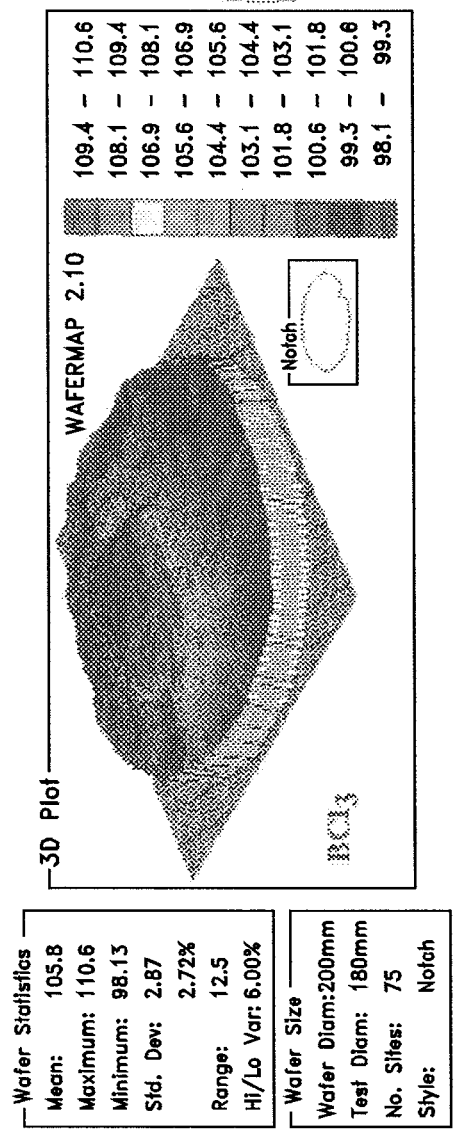

FIGS. 24A-24B are optical microscope images of the SiGe:B film deposited with a $B_2H_6$ flow rate of 0.2 sccm of pure $B_2H_6$ and 50 slm of $H_2$ and an HCl flow rate of 95 sccm, and FIGS. 24C-24D are optical microscope images of the SiGe:B film deposited with a $BCl_3$ flow rate of 2.2 sccm and 1 slm of $H_2$, and an HCl flow rate of 95 sccm. The optical microscope images of FIGS. 24A-24D correspond with the results of FIGS. 15-17. FIGS. 24B and 24D show closer views of the square highlighted in FIG. 24A. In particular, the "probe junction" areas for both films received a high dose of a boron implant, which relaxed the SiGe layer. As shown in FIG. 24B, the probe junction area for the film deposited with $B_2H_6$ is smooth. However, FIG. 24D shows that the probe junction area for the film deposited with $BCl_3$ is rough on the surface. It appears that the SiGe:B roughness for the $BCl_3$- deposited film shows a sensitivity to underlying substrate implant conditions. Although the invention is not limited to theory, one possible explanation for this result is that $B_2H_6$ may have a surfactant effect that smoothes the layers. Another possible explanation is that HCl, which contributes additional etchant for the $BCl_3$ process, has etched off the defective probe junction area during the epilayer seed nucleation step.

The thickness of an electrically doped single crystalline silicon film comprising a strain-modifying substitutional dopant such as germanium as described herein is preferably less than the critical film thickness. Those skilled in the art understand that the critical film thickness is the thickness at which a strained film relaxes under a particular set of conditions. As the concentration of substitutional dopant increases, the critical thickness generally decreases. Films having a thickness that is less than a critical thickness for that film will tend to remain strained unless or until sufficiently perturbed, such as by being exposed to sufficient heat to cause relaxation. A relaxed Si-containing film comprising a strain-modifying substitutional dopant such as carbon or germanium may be used to exert strain on an adjacent layer, e.g., a heteroepitaxial film deposited thereover.

Preferred Si-containing films also have a thickness that is highly uniform across the surface of the film. When deposition is conducted using a silicon source with $BCl_3$ as described herein, the percent thickness non-uniformity for the resulting Si-containing films is preferably about 2% or less. Depending on the mean thickness of the film, additional values for percent thickness non-uniformity may be preferred as shown in Table 1 below. Each value for % thickness non-uniformity shown in Table 1 is to be understood as if preceded by the word "about."

TABLE 1

| Mean Film Thickness | Range of % Thickness Non-Uniformity According to An Embodiment | Range of % Thickness Non-Uniformity According to Another Embodiment | Range of % Thickness Non-Uniformity According to Another Embodiment |
| --- | --- | --- | --- |
| >150 Å | <10 | <6 | <2 |
| 100-150 Å | <10 | <7 | <3 |
| 50-99 Å | <15 | <8 | <4 |
| <50 Å | <20 | <10 | <5 |

In general, measurements of film thickness uniformity for a film deposited under a particular set of process conditions can be made by depositing the film on a uniform or mixed substrate having a diameter in the range of about 200 mm to about 300 mm. Film thickness uniformity is determined by making multiple-point thickness measurements along a randomly selected diameter (with no measurements being taken within a 3 mm exclusion zone at the wafer periphery), determining the mean thickness by averaging the various thickness measurements, and determining the root mean square (rms) variability. A preferred instrument for measuring film thickness utilizes an OPTIPROBE™ commercially available from Thermawave, Fremont, Calif., and a preferred measurement method involves using such an instrument to measure the film thickness at 49 points along a randomly selected wafer diameter. In practice, thickness variability is typically obtained directly from the instrument following such a measurement, and thus need not be calculated manually. To enable comparisons, the results can be expressed as percent non-uniformity, calculated by dividing the rms thickness variability by the mean thickness and multiplying by 100 to express the result as a percentage. When measuring thickness uniformity of a film having a surface that is not accessible to such a measurement, e.g., a film onto which one or more additional layers have been applied, or a film contained within an integrated circuit, the film is cross sectioned and examined by electron microscopy. The film thickness is measured at the thinnest part of the cross sectioned film and at the thickest part, and the range in thickness measurements (e.g., 6 Å) between these two points is then divided by the sum of the two measurements. This non-uniformity is expressed as a percentage herein.

FIGS. 25-26 show the uniformity and thickness of SiGe:B films deposited with $B_2H_6$ and $BCl_3$ on patterned wafers. FIG. 25A shows the initial topography of a mixed substrate after the HCl pre-clean step, which removes the native oxide from the silicon surface. FIGS. 25B-25C show the topography of the mixed substrate after the deposition of a SiGe:B (20% Ge) film with a target thickness of 80 nm film, 95 sccm of HCl and 10 at/cm³ of boron. The SiGe:B film of FIG. 25B was deposited with 0.2 sccm of pure $B_2H_6$ and 50 slm of $H_2$, and the SiGe:B film of FIG. 25C was deposited with 2.2 sccm of $BCl_3$ and 1 slm of $H_2$. As shown, FIG. 25B shows an average thickness of 125.3 nm for the SiGe:B deposited with $B_2H_6$. FIG. 25C shows an average thickness of 105.8 nm for the SiGe:B deposited with $BCl_3$. A measure of non-uniformity is given by the Hi/Lo variation given at the legend to the left of FIGS. 25B-25C, which was measured 1.56% for the $B_2H_6$ process as, and 6% for the $BCl_3$ process. Although the $B_2H_6$-deposited film had lower measurements of non-uniformity, the $BCl_3$-deposited film had a sufficiently low non-uniformity measurement to fall within the preferred range as shown in the first column of Table 1. The figures also illustrate the qualitative differences in film uniformity for the $B_2H_6$ and $BCl_3$ processes. As shown in FIG. 25B, the SiGe:B film deposited with $B_2H_6$ appears to have grown thicker at the edges of the wafer. In contrast, the SiGe:B film deposited with $BCl_3$ appears to have grown thicker at the center as shown in FIG. 25C.

Figure 26A:
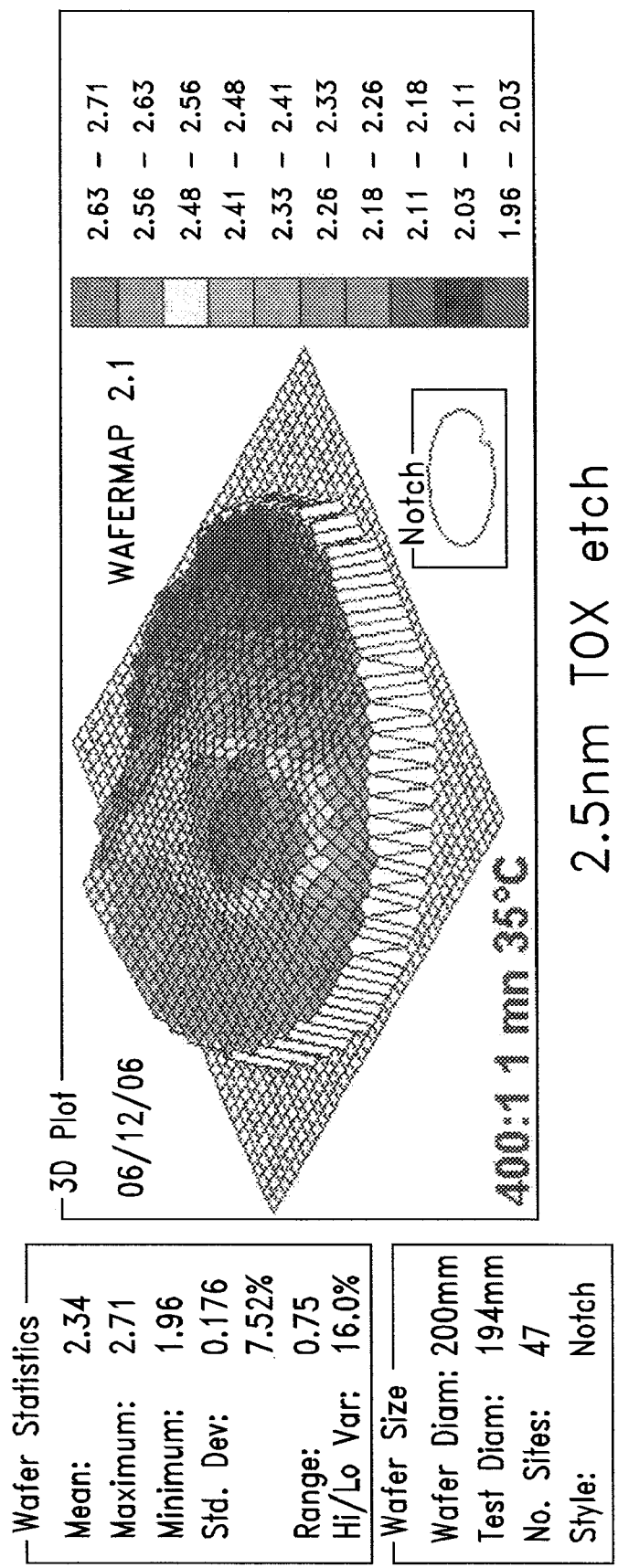
FIG. 26A is a 3D plot of the initial topography of the patterned wafer after a HCl pre-clean step.
Figure 26B:
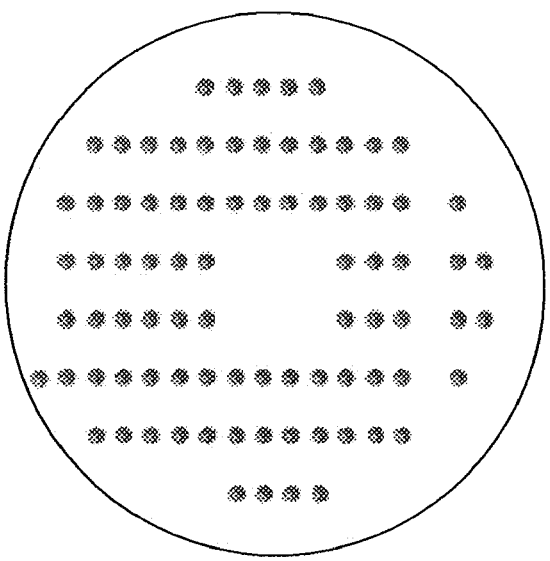
FIGS. 26B-26C are 3D plots of the topography of the wafer with a film of SiGe:B formed with $B_2H_6$ and 2.9 sccm of $BCl_3$, respectively.
Figure 26B:
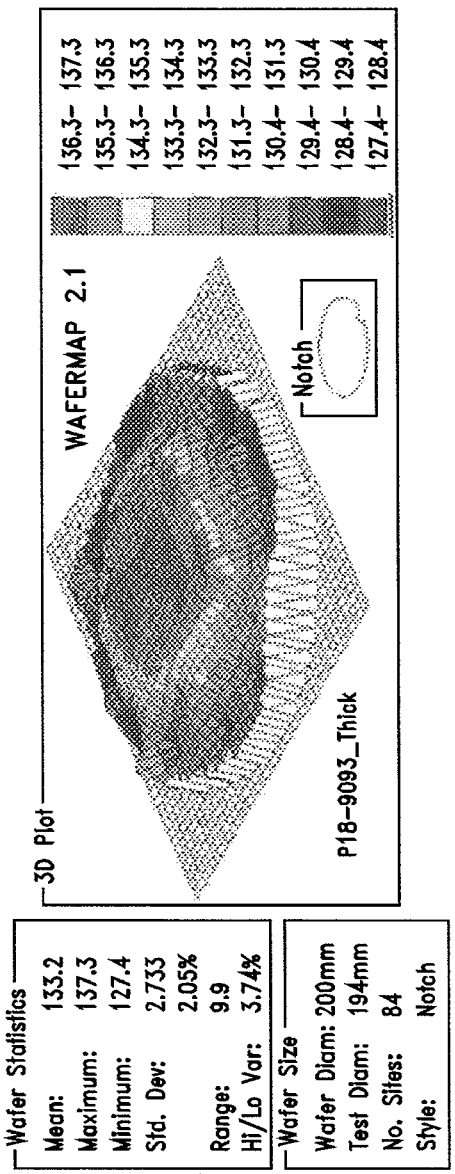
Figure 26C:
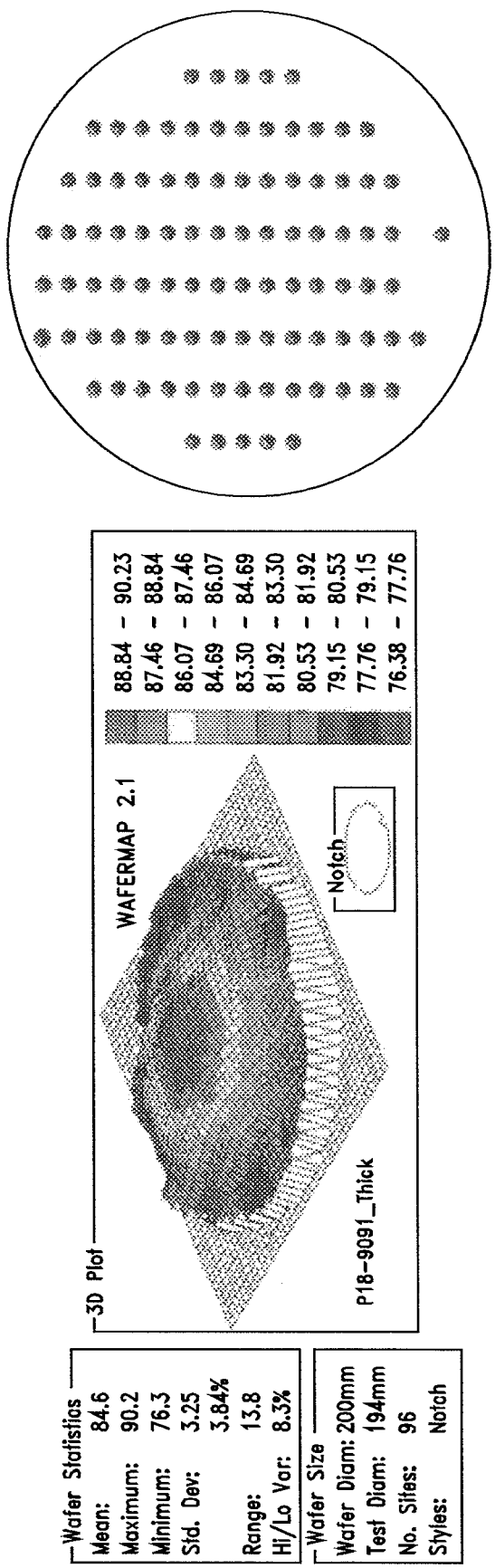

FIGS. 26A-26C show an exaggerated 3D topography of the patterned wafers formed by the above $B_2H_6$ and $BCl_3$ processes. FIG. 26A shows the initial topography of a patterned wafer after the HCl pre-clean step. FIGS. 26B and 26C show the topography of the wafer with an SiGe:B film formed by $B_2H_6$ and $BCl_3$, respectively. The SiGe:B film of FIG. 26B was deposited with 0.2 sccm of pure $B_2H_6$ and 50 slm of $H_2$, and the SiGe:B film of FIG. 26C was deposited with the increased flow rate of 2.9 sccm of $BCl_3$ and 1 slm of $H_2$. As shown, FIG. 26B shows an average thickness of 133.2 nm for the SiGe:B deposited with $B_2H_6$. FIG. 26C shows an average thickness of 84.6 nm for the SiGe:B deposited with $BCl_3$. The non-uniformity was measured 3.74% for the $B_2H_6$ process as, and 8.3% for the $BCl_3$ process. The value for the $BCl_3$-deposited film also falls within the preferred range of non-uniformity as indicated in the left column of Table 1, and further indicates that $BCl_3$ is a suitable alternative to $B_2H_6$ as a dopant precursor.

The above results show that $BCl_3$ is a suitable CVD precursor for achieving highly doped SiGe:B layers, with comparable SiGe:B deposition rates, substitutional incorporation of dopants, film resistivity and uniformity. It is apparent from the above tests on patterned wafers that $BCl_3$ as a precursor results in at least the same selective growth of SiGe:B as the conventional $B_2H_6$ precursor does. But additionally, $BCl_3$ generates significantly less nuclei on dielectric surfaces, requiring less HCl, which tends to add impurities and reduce crystal quality, and is thus a more effective precursor than $B_2H_6$ for the selective growth of SiGe:B films. Additionally, the results indicate that the loading effects of boron concentration in the patterned wafers that may occur and result in excess boron incorporation or surface poisoning may be tuned by increasing the HCl amount. Nevertheless, the results suggest that the $BCl_3$ process can employ less overall additional etchant than the $B_2H_6$ process for equivalent results, thus providing superior selective deposition. In particular, the results show that for a boron concentration of $10^{19}$ to $10^{20}$ at/cm$^3$ and with 95 sccm of HCl, selectivity is enhanced and loading effects are minimized for the $BCl_3$ process compared to the $B_2H_6$ process. Accordingly, the processes described herein are useful for depositing Si-containing films on a variety of substrates, but are particularly useful for depositing Si-containing films over mixed substrates having mixed surface morphologies.

Figure 27:
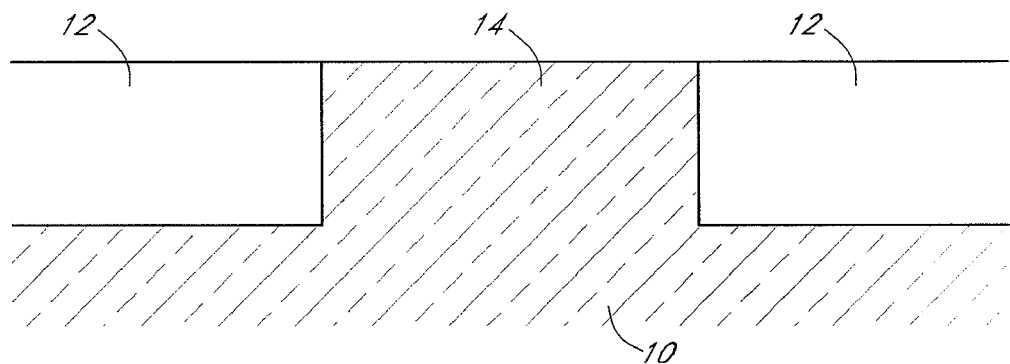
FIG. 27 is a schematic cross section of a semiconductor substrate after field oxide definition, leaving insulator and semiconductor surfaces exposed.

FIG. 27 shows a mixed or patterned substrate 10 comprising a silicon wafer in the illustrated embodiment. As noted above, the mixed substrate 10 can include an epitaxial layer formed over a wafer or an SOI substrate. Field isolation regions 12 have been formed by conventional shallow trench isolation (STI) techniques, defining single crystal active areas 14 in windows among the STI elements. Alternatively, any suitable method can be used to define field insulating material, including local oxidation of silicon (LOCOS) and a number of variations on LOCOS or STI. It will be understood that several active areas are typically defined simultaneously by STI across the substrate 10, and that the STI often forms a web separating transistor active areas 14 from one another. The substrate is preferably background doped at a level suitable for channel formation.

Figure 28:
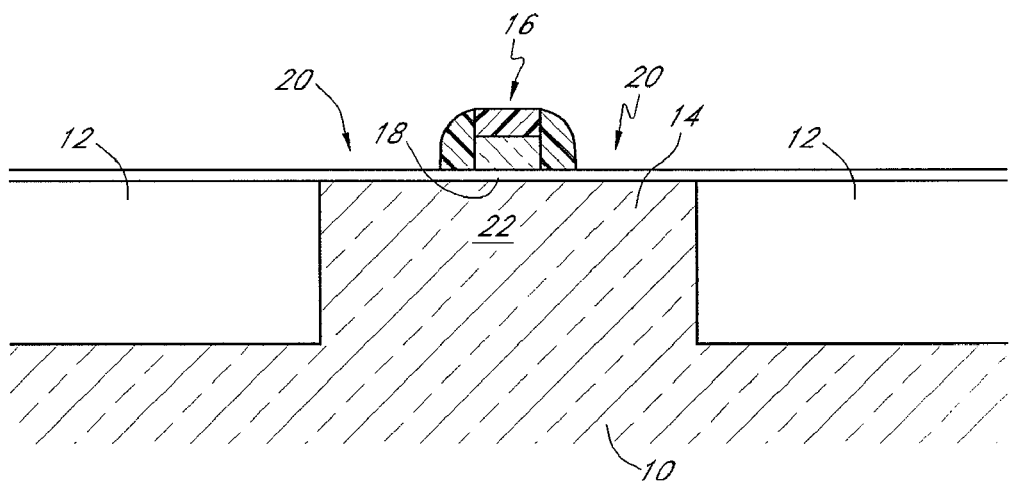
FIG. 28 shows the structure of FIG. 27 after formation of a transistor gate electrode within an active area window.

FIG. 28 illustrates the mixed or patterned substrate 10 after formation of a gate electrode 16 over the active area 14. While illustrated as a traditional silicon electrode, surrounded by insulating spacers and cap layers, and separated from the underlying substrate 10 by a gate dielectric layer 18, it will be understood that the transistor gate stack can have any of a variety of configurations. In some process flows, for example, the spacers can be omitted. In the illustrated embodiment, the placement of the gate electrode 16 defines source and drain regions 20 on either side of the transistor gate electrode 16 within the active area 14. The gate electrode 16 also defines a channel region 22 under the gate electrode 16 and between the source and drain regions 20.

Figure 29:
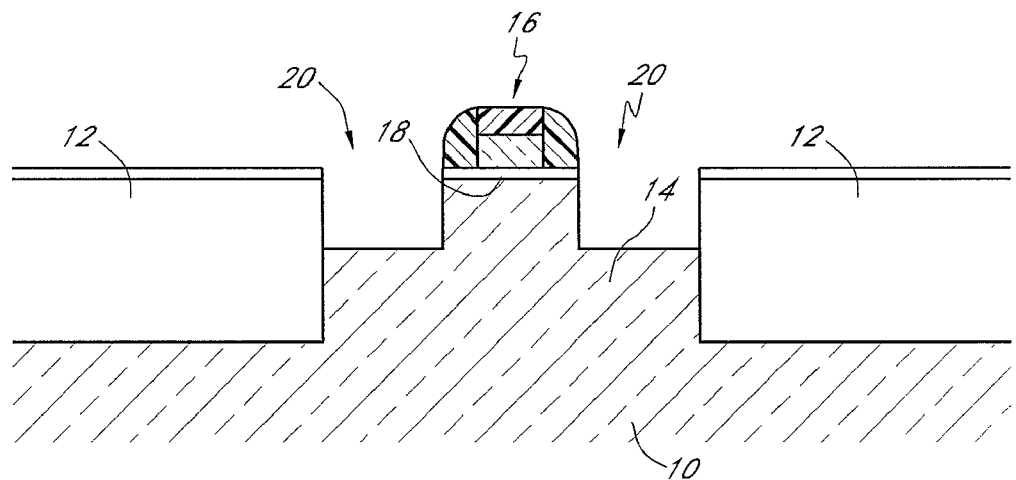
FIG. 29 shows the structure of FIG. 28 after recessing source and drain regions on either side of the gate electrode.

FIG. 29 illustrates the result of an etch step that selectively removes exposed silicon from the source and drain regions 20. A reactive ion etch (RIE) can be employed to ensure vertical sidewall definition and minimal damage to exposed oxide and nitride materials, although other recess shapes are applicable. Preferably the depth of the recesses is less than the critical thickness of the layer to be deposited in the recess although strain on the channel can also be obtained by deposition greater than the critical thickness. As the exposed silicon is essentially the source and drain (S/D) regions 20 of the active area 14, the etch is referred to as a source/drain recess. It will be understood that, in some arrangements, a first step of clearing the thin dielectric over the source/drain regions may be employed.

Figure 30:
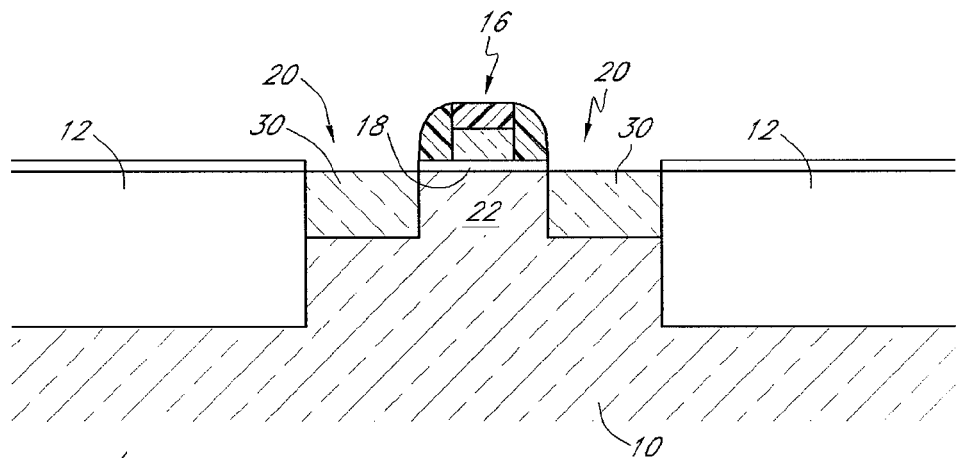
FIG. 30 shows the structure of FIG. 29 after selective deposition of a semiconductor film within the recessed regions, in accordance with a preferred embodiment of the invention.

FIG. 30 shows the result of refilling the recessed S/D regions 20 with a selective deposition process. In particular, the exposed semiconductor surfaces are cleaned, such as with an HF vapor or HF last dip, leaving a pristine surface for epitaxy thereover. In the illustrated embodiment, the selective deposition process comprises introducing a feed gas to the surface of the mixed substrate 10 under chemical vapor deposition conditions. A silicon precursor, such as dichlorosilane (DCS), and $BCl_3$ are intermixed to form the feed gas. For the embodiments of FIGS. 27-31, germanium sources are also included in the feed gas in order to deposit a Ge-doped Si-containing film to create strain on the channel region 20. In the illustrated embodiment, $BCl_3$ also serves as a dopant precursor and HCl serves as an additional source of etch species to aid selectivity. A Si-containing epitaxial layer 30 grows selectively in the S/D regions 20. The layer 30 is a doped heteroepitaxial film that fills the S/D regions 20 and exerts strain on the channel region 22. In the illustrated embodiment, the heteroepitaxial film 30 is approximately flush with the surface of the channel region 22. As illustrated, the selective deposition minimizes or avoids deposition over the amorphous regions, e.g., over the insulators including field isolation regions 12, which are generally a form of silicon oxide, and the spacers and/or a cap layer on the gate electrode 16, which is typically silicon oxide or silicon nitride.

Figure 31:
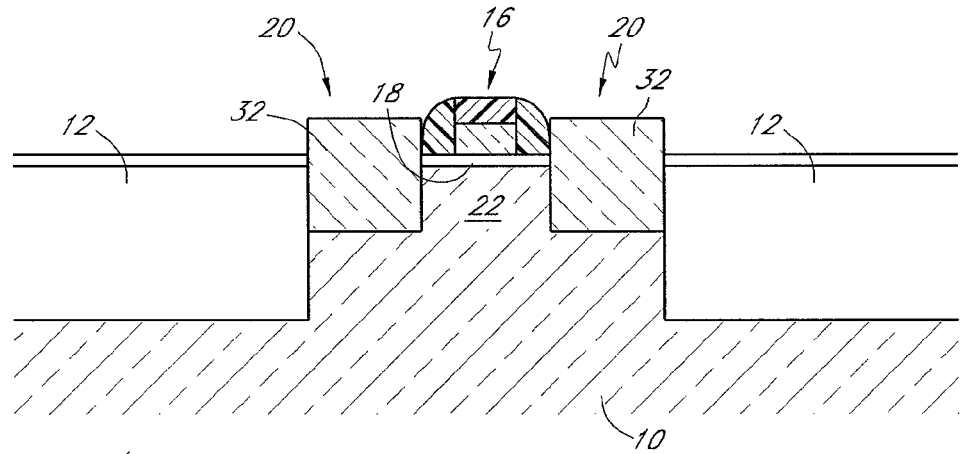
FIG. 31 shows the structure of FIG. 30 after optional continued selective deposition, forming elevated source/drain structures.

FIG. 31 illustrates an optional extension of the selective deposition to form elevated S/D regions 20 with the extended heteroepitaxial film 32. As the portion of the extended film 32 below the surface of the channel region 22 exerts lateral stress on the channel region 22, the portion above the surface of the substrate need not include as much or any lattice deviation from the natural silicon lattice constant. Accordingly, any germanium source gases can be tapered or halted for the portion of the selective deposition above the surface of the channel region 22, and the $BCl_3$, DCS and HCl flows continued. $BCl_3$ can optionally also be discontinued.

The elevated S/D structure 32 of FIG. 31 provides additional silicon material above the surface of the substrate 10. As is known in the art, through subsequent processing, insulating layers are deposited and contacts are made through the insulating film to the source and drain regions 20. The additional silicon material facilitates formation of silicide contacts, which reduce contact resistance by forming ohmic contacts. Accordingly, nickel, cobalt or other metal is deposited into the contact hole and allowed to consume the excess silicon without disturbing electrical properties of shallow junctions for the underlying source/drain regions.

Figure 32:
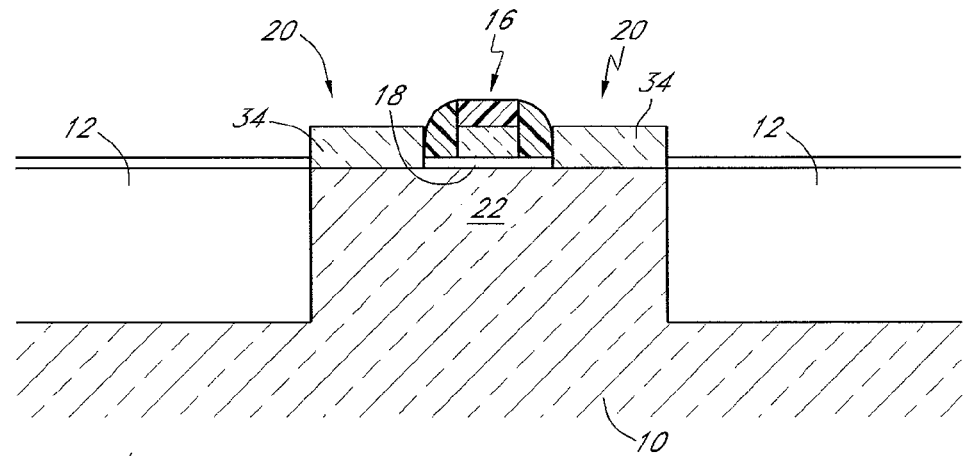
FIG. 32 shows the structure of FIG. 28 after exposing the semiconductor window and conducting a selective deposition to form elevated source/drain structures, in accordance with another preferred embodiment.

FIG. 32 shows another embodiment, in which the structure of FIG. 28 is subjected to the selective deposition using $BCl_3$ and a silicon source with HCl as an additional etchant, but without the intervening S/D recess step. In this case, the selective deposition serves only to raise the source and drain regions, providing excess boron-doped silicon 34 to permit consumption by contact silicidation without destroying shallow junctions. The deposition can optionally include other impurity precursors to deposit silicon alloys, e.g., SiGe. Such impurities are unnecessary, however, if the entire excess silicon structure 34 is to be consumed by contact silicidation.

The selective nature of the $BCl_3$/silicon source process obviates subsequent pattern and etch steps to remove excess deposition from over field regions. Even imperfect selectivity can advantageously permit use of a timed wet etch to remove unwanted deposition over insulating surfaces, rather than requiring an expensive mask step. Furthermore, superior film quality is obtained at relatively high deposition rates, improving throughput. For example, certain process embodiments may be used to selectively deposit boron-doped SiGe:C using a silicon source such as trisilane, methylsilane, $BCl_3$, and optionally chlorine to form, e.g., a base structure of a heterobipolar transistor (HBT). The examples of FIGS. 27-31 involve recessed source/drain regions and strained epitaxial layers for improving channel electrical carrier mobility. However, the skilled artisan will appreciate many other applications in which selective, epitaxial, Si-containing deposition is desirable.

Figure 33A:
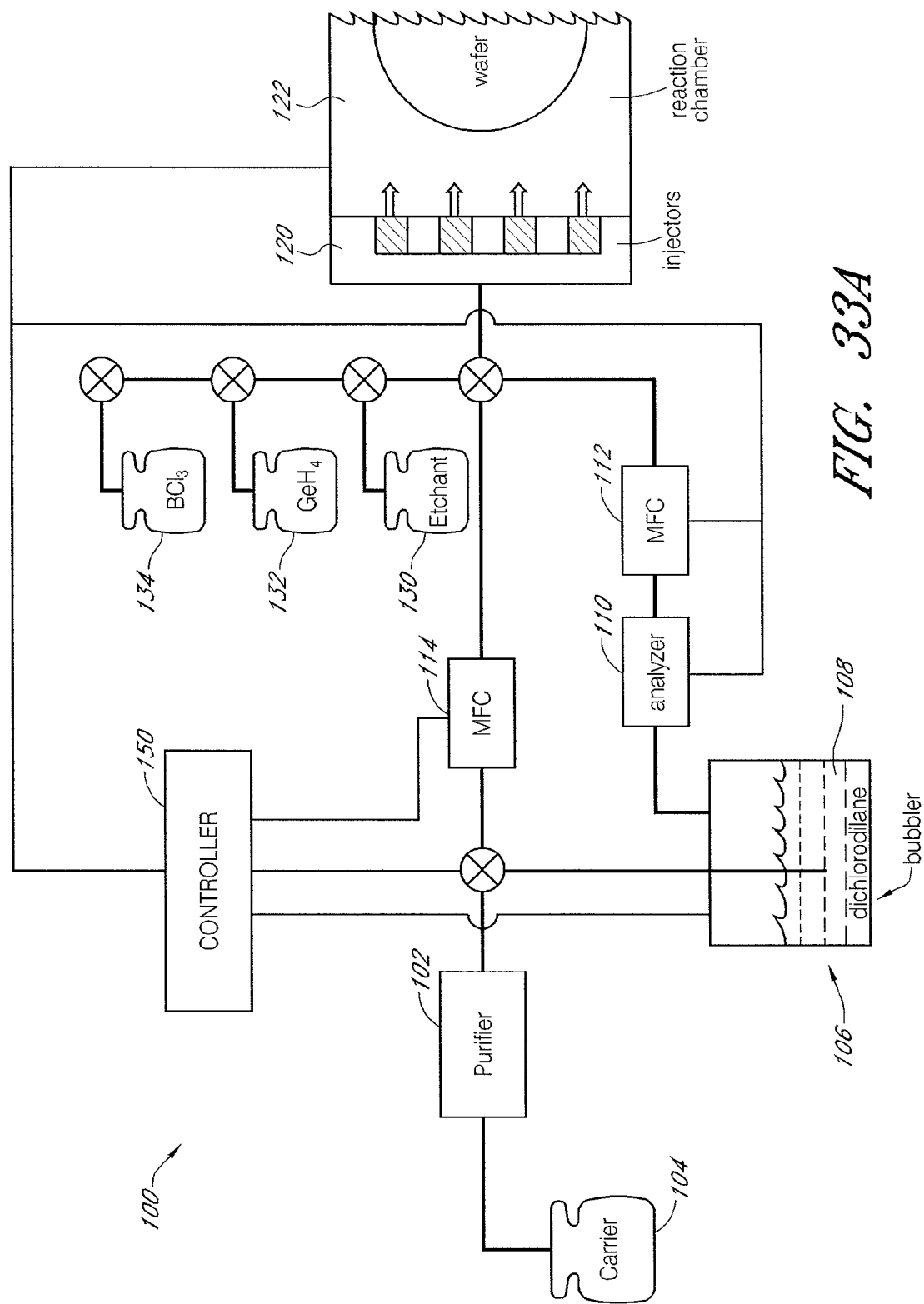
FIG. 33A is a simplified schematic view of a reactor set up for a system employing $BCl_3$, a silicon source, a germanium source, an etchant such as HCl, and a carrier gas for selectively depositing silicon-containing films in accordance with a preferred embodiment.

FIG. 33A illustrates a preferred reactor system 100 employing a source of carrier gas, a source of $BCl_3$, an optional germanium source, a silicon source (in this case, dichlorosilane) and an additional etchant source. As shown, a purifier 102 is positioned downstream of the carrier source 104. Some of the carrier gas flow is shunted to a bubbler 106, from which the carrier gas carries vaporized dichlorosilane 108. Alternatively, the dichlorosilane can be simply heated to increase the vapor pressure of dichlorosilane in the space above the liquid, and the carrier gas picks up dichlorosilane as it passes through that space. In the illustrated arrangement, downstream of the liquid reactant source container 106 is an analyzer 110 that determines, by measuring the speed of sound through the vapor, the reactant concentration of the flowing gas. Based upon that measurement, the setpoint for the software-controlled downstream mass flow controller "MFC" 112 is altered by the analyzer 110. Such analyzers are commercially available.

The flow through this MFC 112 merges with the main carrier gas through the main carrier gas MFC 114 and other reactants at the gas panel, upstream of the injection manifold 120 for the deposition chamber 122. A source of etchant gas 130, such as HCl or $Cl_2$, is also provided. A germanium source 132 and a $BCl_3$ source 134 are also provided. According to an embodiment, the $BCl_3$ source 134 is provided in a vaporizer, which can heat the liquid $BCl_3$ to form $BCl_3$ vapor, or disturb the liquid $BCl_3$ by stirring or bubbling to increase the vapor pressure of the $BCl_3$ in the space above the liquid.

As illustrated, the reactor system 100 also includes a central controller 150, electrically connected to the various controllable components of the system 100. The controller is programmed to provide gas flows, temperatures, pressures, etc., to practice the deposition processes as described herein upon a substrate housed within the reaction chamber 122. As will be appreciated by the skilled artisan, the controller 150 typically includes a memory and a microprocessor, and may be programmed by software, hardwired or a combination of the two, and the functionality of the controller may be distributed among processors located in different physical locations. Accordingly, the controller 150 can also represent a plurality of controllers distributed through the system 100.

Figure 33B:
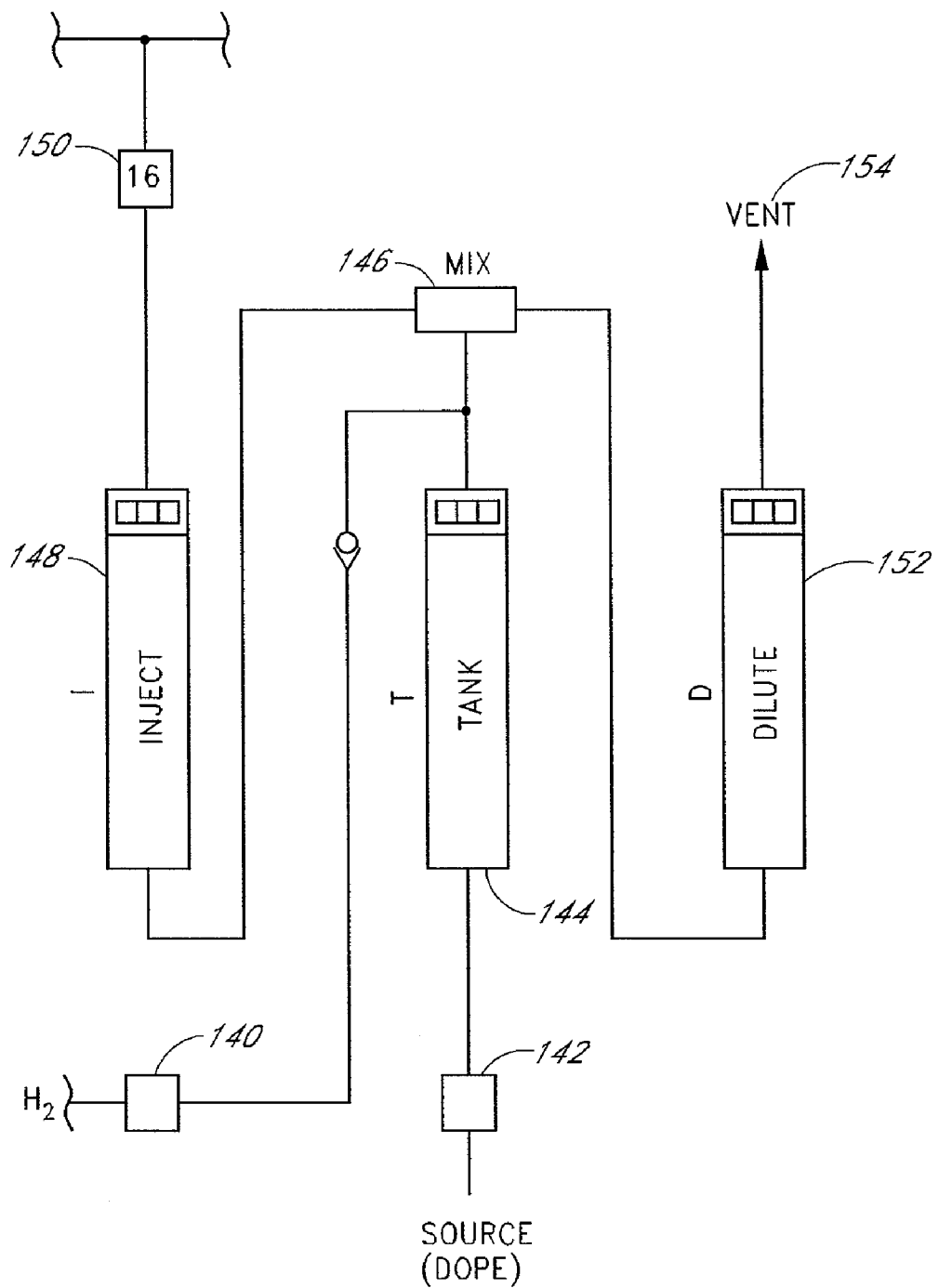
FIG. 33B is a schematic view of dopant dilution control system.

FIG. 33B shows a dopant dilution system according to an embodiment, which may be provided for dopant sources, such as germane source 132 or $BCl_3$ source 134. In the illustrated embodiment, the dopant source in pure, undiluted form passes through a controlled pressure source 142 and then to the "Tank" mass flow controller 144. An $H_2$ flow is added to the dopant flow from a controlled pressure source 140 to the "Tank" mass flow controller 144. The combined gas streams then pass through a gas mixer 146 which mixes the two gas streams and dilute the pure, undiluted dopant. The combined gas streams may then pass through the "Inject" mass flow controller 148, which is directed to the reactor mainstream through valve 150 or to vent 154. Or, the combined gas streams may pass through the "Dilute" mass flow controller 152, which goes directly to vent 154.

Accordingly, the combination of $BCl_3$ and silicon sources result in enhanced selective deposition of silicon-containing materials, particularly epitaxial layers. A germanium source 132 is also optionally provided as shown, and can allow in situ doping of SiGe films. In the illustrated embodiment, high substitutional boron content can be achieved, as disclosed hereinabove.

Preferred embodiments of the method and systems are illustrated in the following Examples, which are exemplary only, and not meant to limit the disclosure.

Example 1

An eight-inch unpatterned, bare Si<100> wafer substrate was loaded into an Epsilon E2500™ reactor system. The substrate was introduced into the reaction chamber and heated to 795° C. and 10 Torr for 2 minutes, with a hydrogen flow rate of 30 slm, and the substrate was allowed to stabilize for 20 minutes. The hydrogen flow was then reduced to 20 slm as the temperature of the substrate was reduced to 750° C. The substrate was then allowed to stabilize for 1 minute, after which time a flow of 130 sccm of dichlorosilane and 2.9 sccm of $GeH_4$ (10% in $H_2$) was introduced. A flow of 2.2 sccm $BCl_3$ (with 1 slm of $H_2$) was provided and the deposition was conducted at a deposition pressure of about 10 Torr. A continuous, uniform boron-doped SiGe film having a thickness of about 106 nm (XRD) was deposited over the single crystal substrate for 2 minutes and 30 seconds. The substrate was then removed from the reactor and returned to the loadlock. The boron-doped SiGe film deposited on the silicon wafer had good epitaxial quality, a resistivity of 1.58 Ω·cm (average) and contained about 18 atomic % Ge.

Example 2

A boron-doped SiGe film was deposited in the manner described in Example 1 except that a patterned substrate having single crystal regions and insulator (oxide) regions was used. The boron-doped SiGe film selectively formed over the single crystal regions without measurable deposition on the insulator regions. The deposited SiGe also had a thickness of about 106 nm.

The embodiments illustrated and described above are provided only as examples of certain preferred embodiments. Various changes and modifications can be made to the embodiments presented herein by those skilled in the art without departure from the spirit and scope of the disclosure, which is limited only by the appended claims.

What is claimed is:

1. A method for selective depositing a single crystalline silicon film by chemical vapor deposition, the method comprising:
providing a substrate in a reaction chamber, the substrate comprising a first surface having a first surface morphology and a second surface having a second surface morphology different from the first surface morphology, wherein the first surface comprises a single crystalline region of a partially fabricated transistor and the second surface comprises an adjacent field isolation region;
intermixing a silicon precursor with $BCl_3$ to thereby form a feed gas;
exposing the substrate to the feed gas in the reaction chamber; and
selectively depositing a Si-containing layer onto the first surface of the substrate without depositing on the second surface by said exposing.

2. The method of claim 1, wherein the silicon source is selected from the group consisting of silane, disilane, trisilane, tetrasilane, monochlorodisilane, dichlorodisilane, trichlorosilane, trichlorodisilane, neopentasilane, or a combination thereof.

3. The method of claim 1, further comprising intermixing the silicon precursor and $BCl_3$ with a halogen-containing etchant to form the feed gas.

4. The method of claim 1, further comprising intermixing the silicon precursor and BCl$_3$ with a germanium source to form the feed gas.

5. The method of claim 1, wherein intermixing the silicon precursor and BCl$_3$ comprises flowing about 10 sccm to about 100 sccm of pure BCl$_3$ for a single wafer CVD chamber.

6. The method of claim 1, wherein the Si-containing layer comprises an in situ doped silicon film.

7. The method of claim 1, wherein the Si-containing layer comprises at least about 7×10$^{19}$ atoms cm$^{-3}$ of boron as deposited.

8. The method of claim 1, wherein the Si-containing layer has a resistivity of about 1.6 mΩ·cm or less.

9. The method of claim 1, wherein the first surface comprises a source and drain region of the partially fabricated transistor.

10. The method of claim 1, wherein the Si-containing layer comprises a heteroepitaxial film.

11. The method of claim 1, further comprising intermixing a hydrogen carrier gas to form the feed gas.

12. The method of claim 1, further comprising intermixing a non-hydrogen inert carrier gas to form the feed gas.

13. The method of claim 3, wherein the halogen-containing etchant comprises HCl, and wherein intermixing the silicon precursor and BCl$_3$ with the etchant gas comprises flowing about 75 sccm to about 115 sccm of HCl for a single wafer CVD chamber.

14. The method of claim 4, wherein the germanium source is germane, and wherein intermixing the silicon precursor and BCl$_3$ with the germanium source comprises flowing about 2 sccm to about 6.6 sccm of germane diluted in 10% H$_2$ for a single wafer CVD chamber.

15. The method of claim 9, wherein the first surface is recessed relative to a channel surface of the partially fabricated transistor.

16. The method of claim 9, wherein the Si-containing layer defines an elevated source/drain structure.

17. The method of claim 16, wherein the Si-containing layer introduces compressive strain into the channel region.

18. A method of forming an integrated circuit, the method comprising:
    providing a substrate including exposed semiconductor surfaces of a partially fabricated transistor and adjacent insulating regions and
    exposing the substrate to a silicon precursor, BCl$_3$ and an etchant vapor, thereby selectively depositing a Si-containing epitaxial film on the exposed semiconductor surfaces.

19. The method of claim 18, further comprising providing a germanium source to the substrate, so that the Si-containing film comprises a Si$_{1-x}$Ge$_x$ film, wherein 0<x≦1.

20. The method of claim 18, wherein the Si-containing film comprises about 15% to about 25% Ge.

21. The method of claim 18, wherein exposing selectively deposits the Si-containing film over the semiconductor surfaces while avoiding deposition over the insulating regions in a ratio of greater than about 50:1.

22. The method of claim 18, wherein exposing selectively deposits the Si-containing film with 100% selectivity over the semiconductor surfaces while avoiding deposition over the insulating regions.

23. An apparatus configured for selective epitaxial deposition, the apparatus comprising:
    a reaction chamber configured to support a substrate;
    a source of semiconductor precursor in communication with the reaction chamber
    a source of etchant vapor in communication with the reaction chamber;
    a source of BCl$_3$ in communication with the reaction chamber; and
    a controller adapted to simultaneously deliver semiconductor precursor, etchant vapor and BCl$_3$ from the sources to the reaction chamber in accordance with a selective deposition recipe to selectively deposit an epitaxial semiconductor film on single-crystal areas of a partially fabricated transistor on a patterned wafer in the reaction chamber without depositing on adjacent insulating areas.

* * * * *